US012660301B2

(12) United States Patent
Li et al.

(10) Patent No.: US 12,660,301 B2
(45) Date of Patent: Jun. 16, 2026

(54) SILICON CARBIDE METAL OXIDE SEMICONDUCTOR FIELD EFFECT TRANSISTOR DEVICE

(71) Applicant: XIAMEN SAN'AN INTEGRATED CIRCUIT CO., LTD., Fujian (CN)

(72) Inventors: Lijun Li, Fujian (CN); Zhidong Lin, Fujian (CN); Zhigao Peng, Fujian (CN); Yonghong Tao, Fujian (CN); Yuanxu Guo, Fujian (CN); Min Wang, Fujian (CN)

(73) Assignee: XIAMEN SAN'AN INTEGRATED CIRCUIT CO., LTD., Xiamen Fujian (CN)

( * ) Notice: Subject to any disclaimer, the term of this patent is extended or adjusted under 35 U.S.C. 154(b) by 385 days.

(21) Appl. No.: 18/446,989

(22) Filed: Aug. 9, 2023

(65) Prior Publication Data

US 2023/0387290 A1     Nov. 30, 2023

Related U.S. Application Data

(63) Continuation-in-part of application No. PCT/CN2021/119953, filed on Sep. 23, 2021.

(30) Foreign Application Priority Data

Feb. 25, 2021    (CN) .......................... 202110215037.6

(51) Int. Cl.
| | |
|---|---|
| *H10D 84/00* | (2025.01) |
| *H10D 12/01* | (2025.01) |
| *H10D 62/832* | (2025.01) |

(52) U.S. Cl.
CPC ......... *H10D 84/146* (2025.01); *H10D 12/031* (2025.01); *H10D 62/8325* (2025.01)

(58) Field of Classification Search
CPC .............. H10D 84/146; H10D 12/031; H10D 62/8325; H10D 30/0291; H10D 30/66;
(Continued)

(56) References Cited

U.S. PATENT DOCUMENTS

| | | | | |
|---|---|---|---|---|
| 2016/0233210 A1* | 8/2016 | Matocha | ............ | H10D 62/8325 |
| 2017/0250275 A1* | 8/2017 | Yen | ...................... | H10D 62/127 |

(Continued)

FOREIGN PATENT DOCUMENTS

CN          107580725 A       1/2018

OTHER PUBLICATIONS

Search Report issued to PCT application No. PCT/CN2021/119953 on Dec. 22, 2021.

*Primary Examiner* — Syed I Gheyas

(74) *Attorney, Agent, or Firm* — Muncy, Geissler, Olds & Lowe, P.C.

(57) ABSTRACT

A silicon carbide metal oxide semiconductor field effect transistor device includes a substrate, an epitaxial layer, and a plurality of cell units each of which includes a first cell and a second cell that are disposed in the epitaxy layer and connected to each other in the epitaxy layer. The first cell includes a first Schottky region, a first junction field effect region, a first well region, a first well contact structure, a first source region, a first Schottky metal, a first ohmic contact metal, and a first gate structure. The second cell includes a second Schottky region, a second junction field effect region, a second well region, a second well contact structure, a second source region, a second Schottky metal, a second ohmic contact metal, and a second gate structure. In the epitaxial layer, the first junction field effect region is connected to the second Schottky region.

19 Claims, 27 Drawing Sheets

(58) Field of Classification Search
CPC ... H10D 62/393; H10D 62/106; H10D 62/127
See application file for complete search history.

(56)                    References Cited

U.S. PATENT DOCUMENTS

| | | | |
|---|---|---|---|
| 2019/0013312 A1* | 1/2019 | Saggio | H01L 21/046 |
| 2020/0091296 A1* | 3/2020 | Mizukami | H10D 30/0291 |

* cited by examiner

E 501
401
301
21
20
10

96

502
302
402

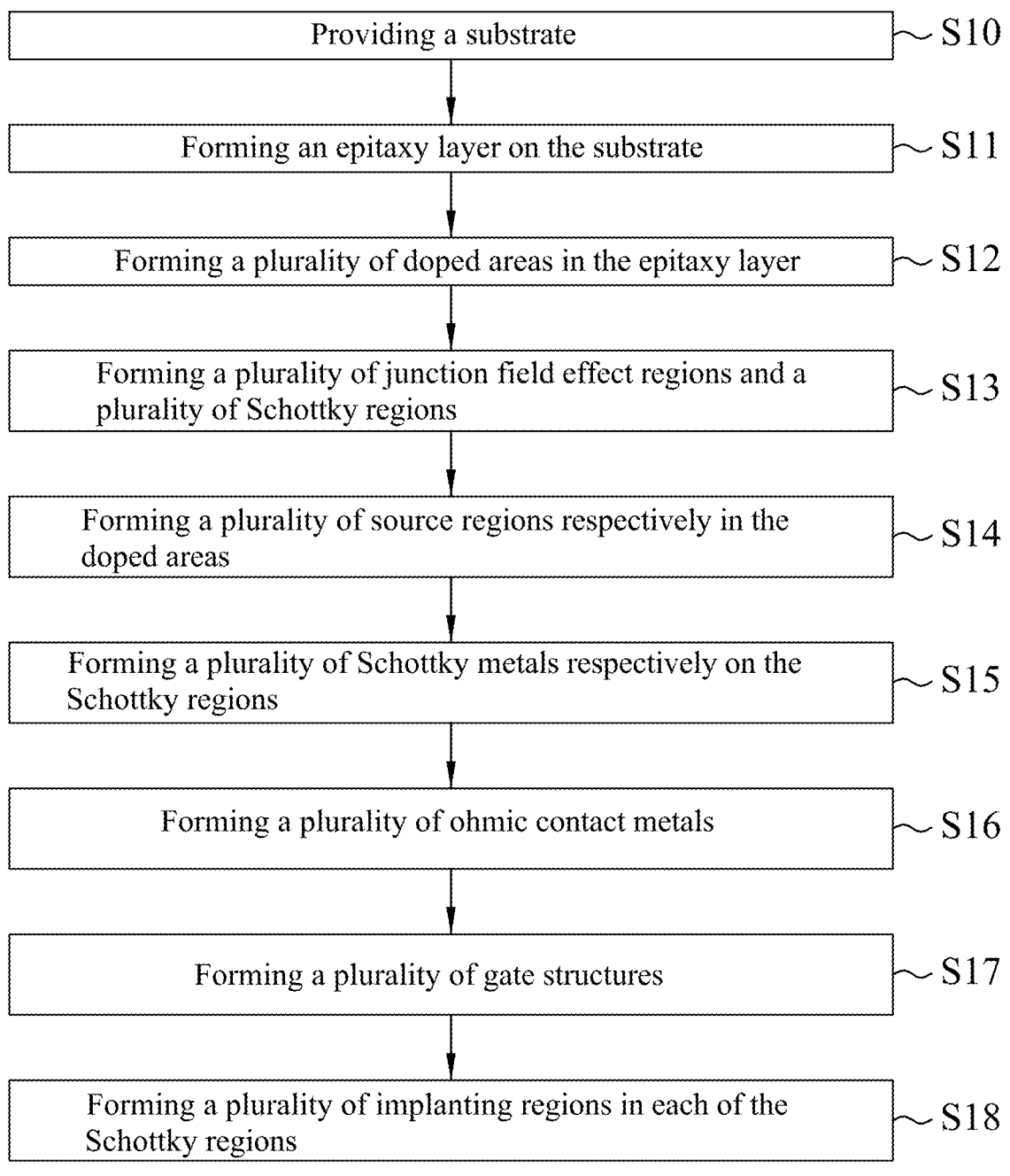

Providing a substrate ~ S10

Forming an epitaxy layer on the substrate ~ S11

Forming a plurality of doped areas in the epitaxy layer ~ S12

Forming a plurality of junction field effect regions and a plurality of Schottky regions ~ S13

Forming a plurality of source regions respectively in the doped areas ~ S14

Forming a plurality of Schottky metals respectively on the Schottky regions ~ S15

Forming a plurality of ohmic contact metals ~ S16

Forming a plurality of gate structures ~ S17

Forming a plurality of implanting regions in each of the Schottky regions ~ S18

FIG.17

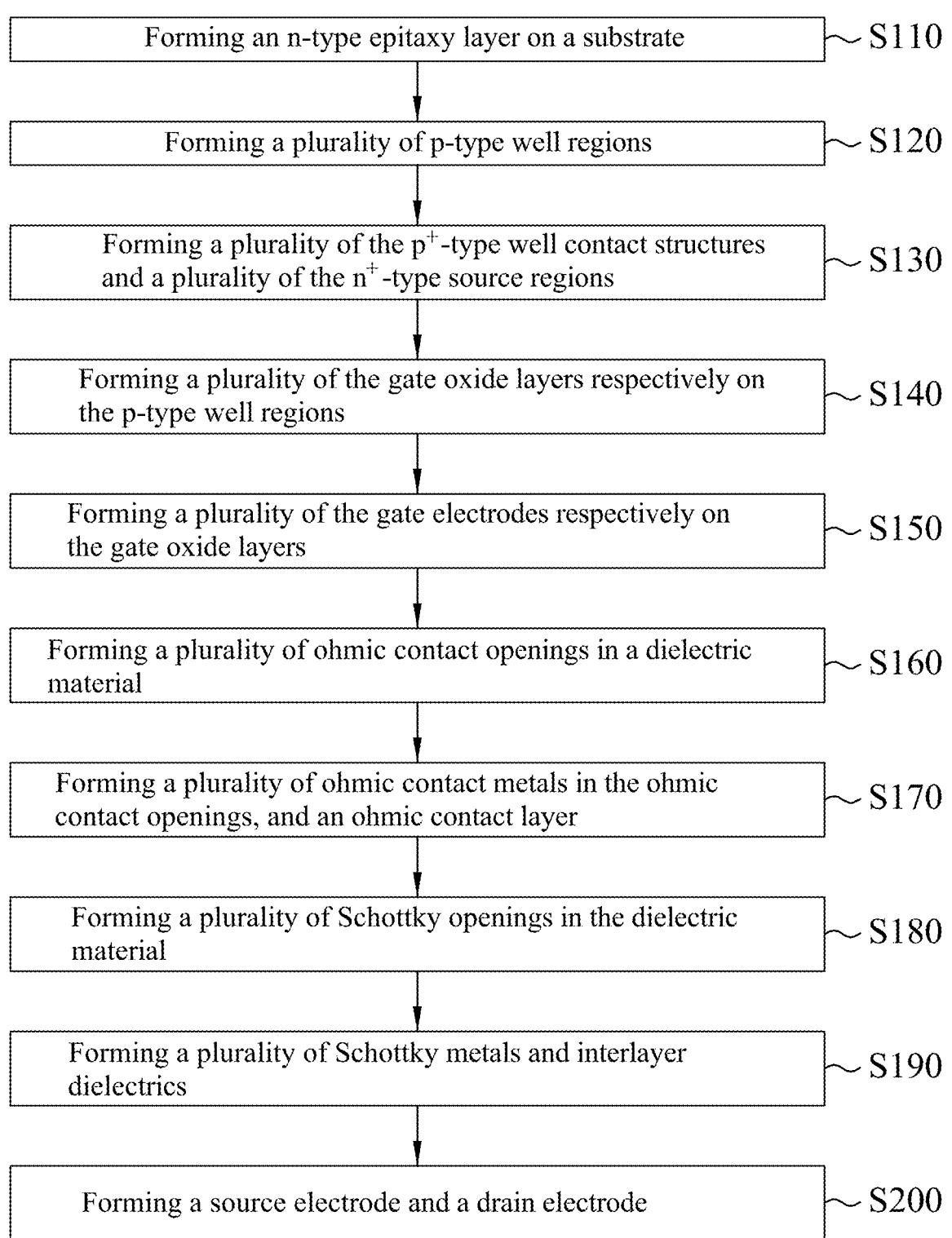

| Forming an n-type epitaxy layer on a substrate | ~ S110 |

| Forming a plurality of p-type well regions | ~ S120 |

| Forming a plurality of the p$^+$-type well contact structures and a plurality of the n$^+$-type source regions | ~ S130 |

| Forming a plurality of the gate oxide layers respectively on the p-type well regions | ~ S140 |

| Forming a plurality of the gate electrodes respectively on the gate oxide layers | ~ S150 |

| Forming a plurality of ohmic contact openings in a dielectric material | ~ S160 |

| Forming a plurality of ohmic contact metals in the ohmic contact openings, and an ohmic contact layer | ~ S170 |

| Forming a plurality of Schottky openings in the dielectric material | ~ S180 |

| Forming a plurality of Schottky metals and interlayer dielectrics | ~ S190 |

| Forming a source electrode and a drain electrode | ~ S200 |

FIG.18

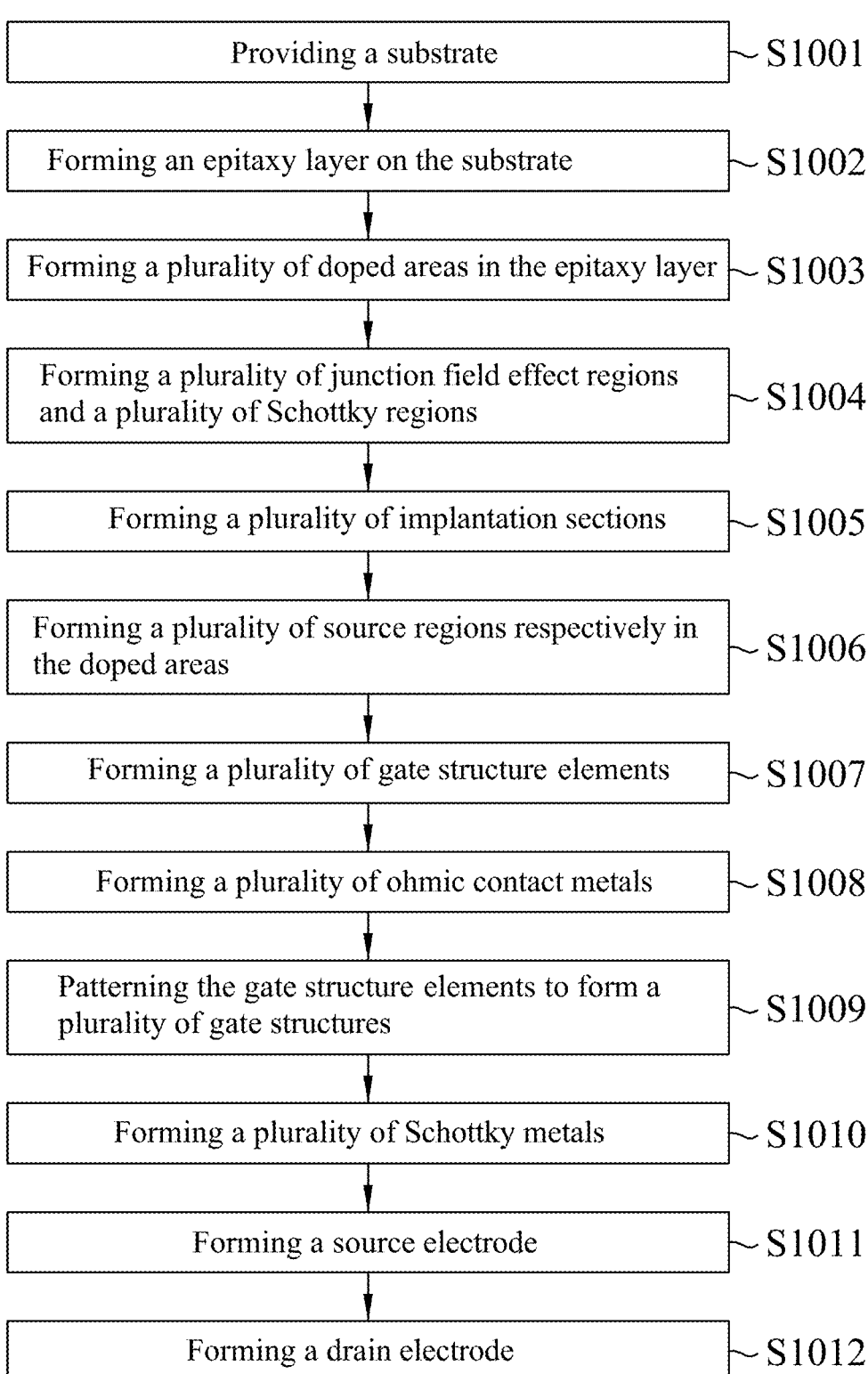

| | |
|---|---|
| Providing a substrate | ~ S1001 |
| Forming an epitaxy layer on the substrate | ~ S1002 |
| Forming a plurality of doped areas in the epitaxy layer | ~ S1003 |
| Forming a plurality of junction field effect regions and a plurality of Schottky regions | ~ S1004 |
| Forming a plurality of implantation sections | ~ S1005 |
| Forming a plurality of source regions respectively in the doped areas | ~ S1006 |
| Forming a plurality of gate structure elements | ~ S1007 |
| Forming a plurality of ohmic contact metals | ~ S1008 |
| Patterning the gate structure elements to form a plurality of gate structures | ~ S1009 |
| Forming a plurality of Schottky metals | ~ S1010 |
| Forming a source electrode | ~ S1011 |
| Forming a drain electrode | ~ S1012 |

FIG.21A

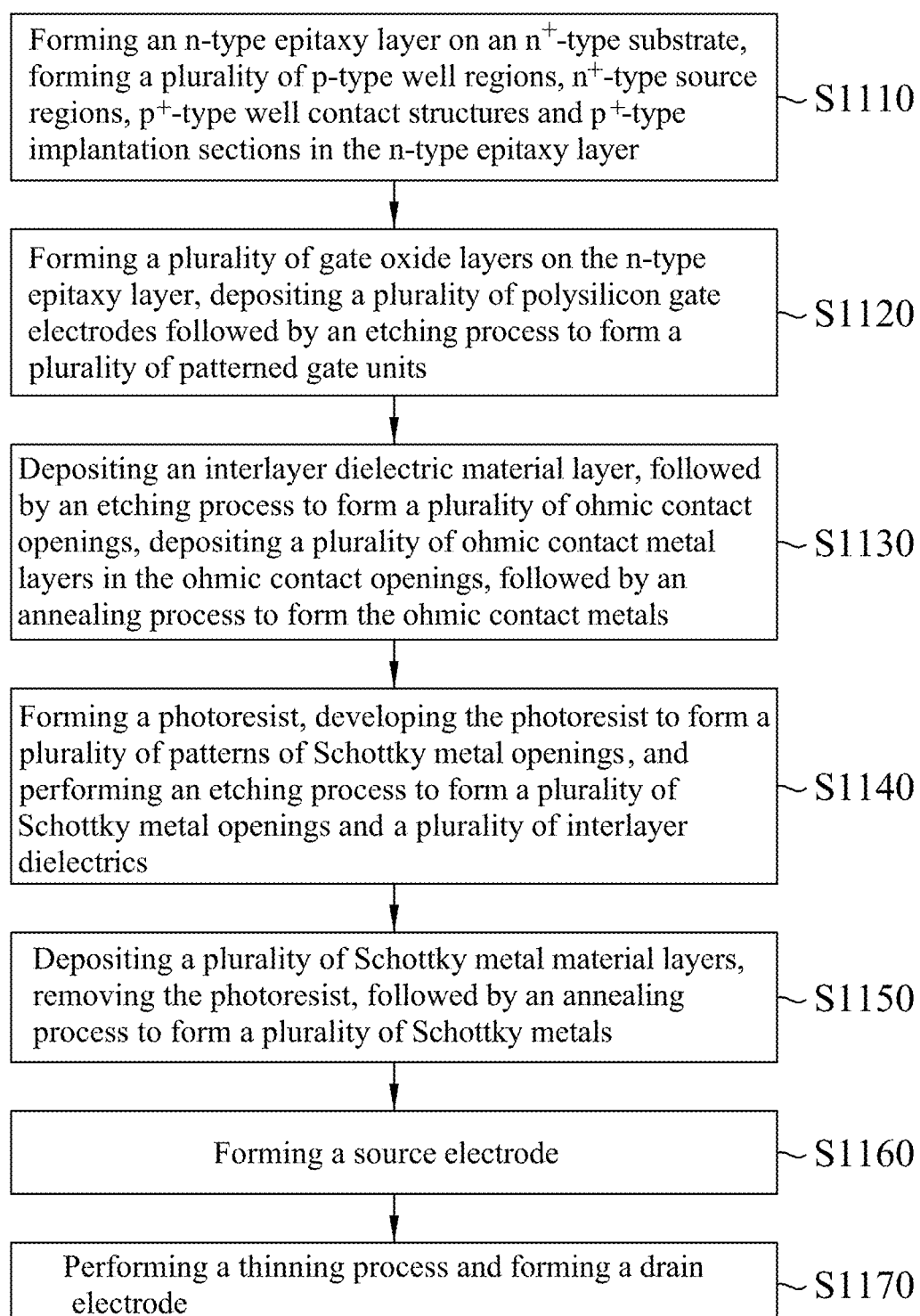

Forming an n-type epitaxy layer on an $n^+$-type substrate, forming a plurality of p-type well regions, $n^+$-type source regions, $p^+$-type well contact structures and $p^+$-type implantation sections in the n-type epitaxy layer ~S1110

Forming a plurality of gate oxide layers on the n-type epitaxy layer, depositing a plurality of polysilicon gate electrodes followed by an etching process to form a plurality of patterned gate units ~S1120

Depositing an interlayer dielectric material layer, followed by an etching process to form a plurality of ohmic contact openings, depositing a plurality of ohmic contact metal layers in the ohmic contact openings, followed by an annealing process to form the ohmic contact metals ~S1130

Forming a photoresist, developing the photoresist to form a plurality of patterns of Schottky metal openings, and performing an etching process to form a plurality of Schottky metal openings and a plurality of interlayer dielectrics ~S1140

Depositing a plurality of Schottky metal material layers, removing the photoresist, followed by an annealing process to form a plurality of Schottky metals ~S1150

Forming a source electrode ~S1160

Performing a thinning process and forming a drain electrode ~S1170

SILICON CARBIDE METAL OXIDE SEMICONDUCTOR FIELD EFFECT TRANSISTOR DEVICE

CROSS-REFERENCE TO RELATED APPLICATION

This application is a continuation-in-part (CIP) of International Application No. PCT/CN2021/119953, entitled "Silicon carbide mosfet device integrated with schottky diode, and preparation method therefor," filed on Sep. 23, 2021, which claims priority to Chinese Invention Patent Application No. 202110215037.6, filed on Feb. 25, 2021. This application also claims priority to Chinese Invention Patent Application No. 202310068076.7, filed on Jan. 16, 2023.

FIELD

The disclosure relates to the field of semiconductor device, and more particularly to a silicon carbide metal-oxide-semiconductor-field-effect transistor device.

BACKGROUND

Silicon carbide metal-oxide-semiconductor-field-effect transistor (SiC MOSFET) devices are unipolar conduction devices which are capable of serving as high frequency control switches under a large voltage, a large current or a large power. However, since SiC material has a large band gap, parasitic PIN diodes of such SiC MOSFET devices usually have a relatively large threshold voltage and conduction loss (known as a product of Von (ON voltage) and Ion (ON current)). Therefore, in application, SiC MOSFET devices are usually connected to SiC Schottky diodes (SBD) in an antiparallel manner. SiC SBDs are known for having relatively low threshold voltage and short reverse recovery time period, and thus are suitable for antiparallel connection with SiC MOSFET devices. There are mainly two types of structures for conventional SiC MOSFET devices that are integrated with Schottky diodes. Both types of structures are symmetrical structures. Referring to FIG. 1, in a first type of the structures, Schottky contact metals 170 are respectively located in central positions of junction field effect regions 121. The conventional SiC MOSFET devices with such arrangement can have a reduced gate electrode capacitance, but may also have a large current leakage and a low breakdown voltage at a reverse blocking state. Referring to FIG. 2, in a second type of the structures, Schottky contact electrodes 1700 are each located between two adjacent ones of ohmic contact metals 1944. With such configuration, a forward current and a reverse current flow through different pathways, which undesirably increases cell size. In addition, each of gate electrodes 1622 covers an entire junction field effect transistor region 1211, resulting in an increased gate electrode capacitance, and a reduced current density of such SiC MOSFET devices. Therefore, it is necessary to provide SIC MOSFET devices with improved performances.

SUMMARY

Therefore, an object of the disclosure is to provide a silicon carbide metal oxide semiconductor field effect transistor device that can alleviate at least one of the drawbacks of the prior art.

According to a first aspect of the present disclosure, the silicon carbide metal oxide semiconductor field effect transistor device includes a substrate having a first type of conductivity, an epitaxy layer disposed on the substrate, and a plurality of cell units, each of which including a first cell and a second cell that are disposed in the epitaxy layer and connected to each other in the epitaxy layer. The first cell unit includes a first Schottky region, a first junction field effect region, a first well region, a first well contact structure, a first source region, a first Schottky metal, a first ohmic contact metal, and a first gate structure. The first Schottky region and the first junction field effect region are disposed in the epitaxy layer and spaced apart from each other, extend along a direction from the epitaxy layer toward the substrate, and have the first type of conductivity. The first well region is disposed in the epitaxy layer, is connected to the first junction field effect region, extends along the direction from the epitaxial layer toward the substrate, and has a second type of conductivity. The first well contact structure is disposed in the epitaxy layer and on a side of the first well region opposite to the first junction field effect region, is connected to the first Schottky region, extends along the direction from the epitaxial layer toward the substrate, and has the second type of conductivity. The first source region is disposed in the first well region in the epitaxy layer, is connected to the first well contact structure, extends along the direction from the epitaxial layer toward the substrate, and has the first type of conductivity. The first Schottky metal is disposed on the first Schottky region. The first ohmic contact metal is disposed on the first well contact structure and a first portion of the first source region. The first gate structure is disposed on the first junction field effect region, and extends to cover a second portion of the first source region. The first gate structure includes a first gate oxide layer, a first gate electrode and a first interlayer dielectric. The first gate oxide layer is disposed on a part of the first junction field effect region, and extends to cover a part of the second portion of the first source region. The first gate electrode is disposed on the first gate oxide layer. The first interlayer dielectric is disposed to cover the first gate oxide layer and the first gate electrode. The second cell includes a second Schottky region, a second junction field effect region, a second well region, a second well contact structure, a second source region, a second Schottky metal, a second ohmic contact metal, and a second gate structure. In the epitaxial layer, the first junction field effect region of the first cell is connected to the second Schottky region of the second cell. The second Schottky region and the second junction field effect region are disposed in the epitaxy layer and spaced apart from each other, extend along the direction from the epitaxial layer toward the substrate, and have the first type of conductivity. The second well region is disposed in the epitaxy layer, is connected to the second junction field effect region, extends along the direction from the epitaxial layer toward the substrate, and has the second type of conductivity. The second well contact structure is disposed in the epitaxy layer and on a side of the second well region opposite to the second junction field effect region, is connected to the second Schottky region, extends along the direction from the epitaxial layer toward the substrate, and has the second type of conductivity. The second source region is disposed in the second well region in the epitaxy layer, is connected to the second well contact structure, extends along the direction from the epitaxial layer toward the substrate, and has the first type of conductivity. The second Schottky metal is disposed on the second Schottky region. The second ohmic contact metal is disposed on the second well contact structure and a first portion of the second source region. The second gate structure is disposed on the second junction field effect region, and extends to cover a second portion of the second source region. The second gate structure includes a second gate oxide layer, a second gate electrode and a second interlayer dielectric. The second gate oxide layer is disposed on a part of the second junction field effect region, and extends to cover a part of the second portion of the second source region. The second gate electrode is disposed on the second gate oxide layer. The second interlayer dielectric is disposed to cover the second gate oxide layer and the second gate electrode. In the epitaxial layer, the first junction field effect region of the first cell is connected to the second Schottky region of the second cell.

According to a second aspect of the present disclosure, the silicon carbide metal oxide semiconductor field effect transistor device includes a substrate having a first type of conductivity, an epitaxy layer disposed on the substrate, a plurality of doped areas, a plurality of junction field effect regions, a plurality of Schottky regions, a plurality of source regions, a plurality of Schottky metals, a plurality of ohmic contact metals, and a plurality of gate structures. The doped areas are disposed in the epitaxy layer, spaced apart from each other, and having a second type of conductivity. Each of the doped areas includes a well region and a well contact structure each of which extends along a direction from the epitaxial layer toward the substrate. Each of the junction field effect regions and a respective one of the Schottky regions are formed between two corresponding adjacent ones of the doped areas and are connected to each other. The junction field effect regions are respectively connected to the well regions of the doped areas. The Schottky regions are respectively connected to the well contact structures of the doped areas. The source regions have the first type of conductivity, are disposed respectively in the doped areas, and are respectively connected to the well contact structures of the doped areas. Each of the source regions extends along the direction from the epitaxial layer toward the substrate. The Schottky metals are respectively disposed on the Schottky regions. Each of the ohmic contact metals is disposed on the well contact structure of a respective one of the doped areas, and extends to cover a first portion of a respective one of the source regions. Each of the gate structures is disposed on a respective one of the junction field effect regions, and extends to cover a second portion of a respective one of the source regions. Each of the gate structures includes a gate oxide layer, a gate electrode and an interlayer dielectric. The gate oxide layer is disposed on a part of the respective one of the junction field effect regions, and extends to cover a part of the second portion of the respective one of the source regions. The gate electrode is disposed on the gate oxide layer. The interlayer dielectric is disposed to cover the gate oxide layer and the gate electrode.

According to a third aspect of the present disclosure, the silicon carbide metal oxide semiconductor field effect transistor device includes a plurality of cell units, each of which includes an epitaxy layer, a substrate, a Schottky region, a junction field effect region, a well region, a well contact structure, a source region, a Schottky metal, an ohmic contact metal and a gate structure. The epitaxy layer has an upper surface and a lower surface opposite to the upper surface. The substrate is disposed on the lower surface of the epitaxy layer, and has a first type of conductivity. The Schottky region and the junction field effect region are spaced apart from each other, extend from the upper surface to an interior of the epitaxy layer and have the first type of conductivity. The well region is connected to the junction field effect region, extends from the upper surface to the interior of the epitaxy layer, and has a second type of conductivity. The well contact structure is disposed on a side of the well region opposite to the junction field effect region, is connected to the Schottky region, extends from the upper surface to the interior of the epitaxy layer, and has the second type of conductivity. The source region is disposed in the well region, is connected to the well contact structure, extends from the upper surface to an interior of the well region, and has the first type of conductivity. The Schottky metal is disposed on the Schottky region. The ohmic contact metal is disposed on the well contact structure and a first portion of the source region. The gate structure is disposed on the junction field effect region, and extends to cover a second portion of the source region. The gate structure includes a gate oxide layer, a gate electrode and an interlayer dielectric. The gate oxide layer is disposed on a part of the junction field effect region and extends to cover a part of the second portion of the source region. The gate electrode is disposed on the gate oxide layer. The interlayer dielectric is disposed to cover the gate oxide layer and the gate electrode.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

FIG. 17 is a flowchart of a method for fabricating the SiC MOSFET device shown in FIG. 9 according to some embodiments of the present disclosure.

FIG. 18 is a flowchart of another method for fabricating the SiC MOSFET device shown in FIG. 9 according to some embodiments of the present disclosure.

FIG. 21A is a flowchart of a method for fabricating the SiC MOSFET device shown in FIGS. 14A to 14C according to some embodiments of the present disclosure.

FIG. 21B is a flowchart of a method for fabricating the SiC MOSFET device shown in FIGS. 16A to 16C according to some embodiments of the present disclosure.

DETAILED DESCRIPTION

Figure 1:
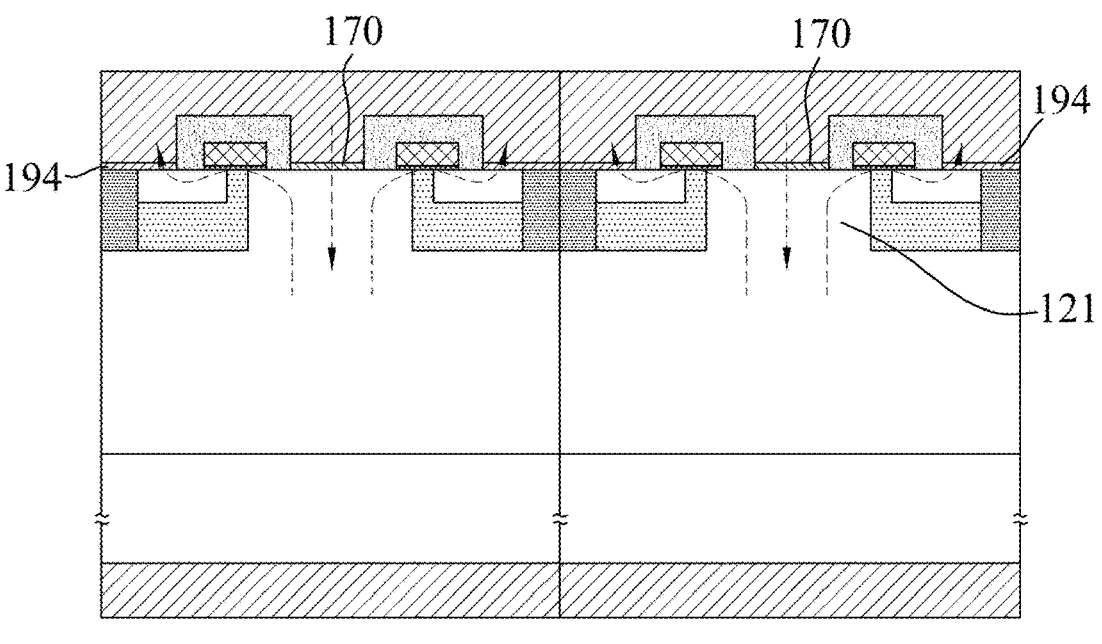
FIG. 1 is a schematic view of a first type of conventional silicon carbide metal-oxide-semiconductor-field-effect transistor (SiC MOSFET) device integrated with a Schottky diode.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Figure 3:
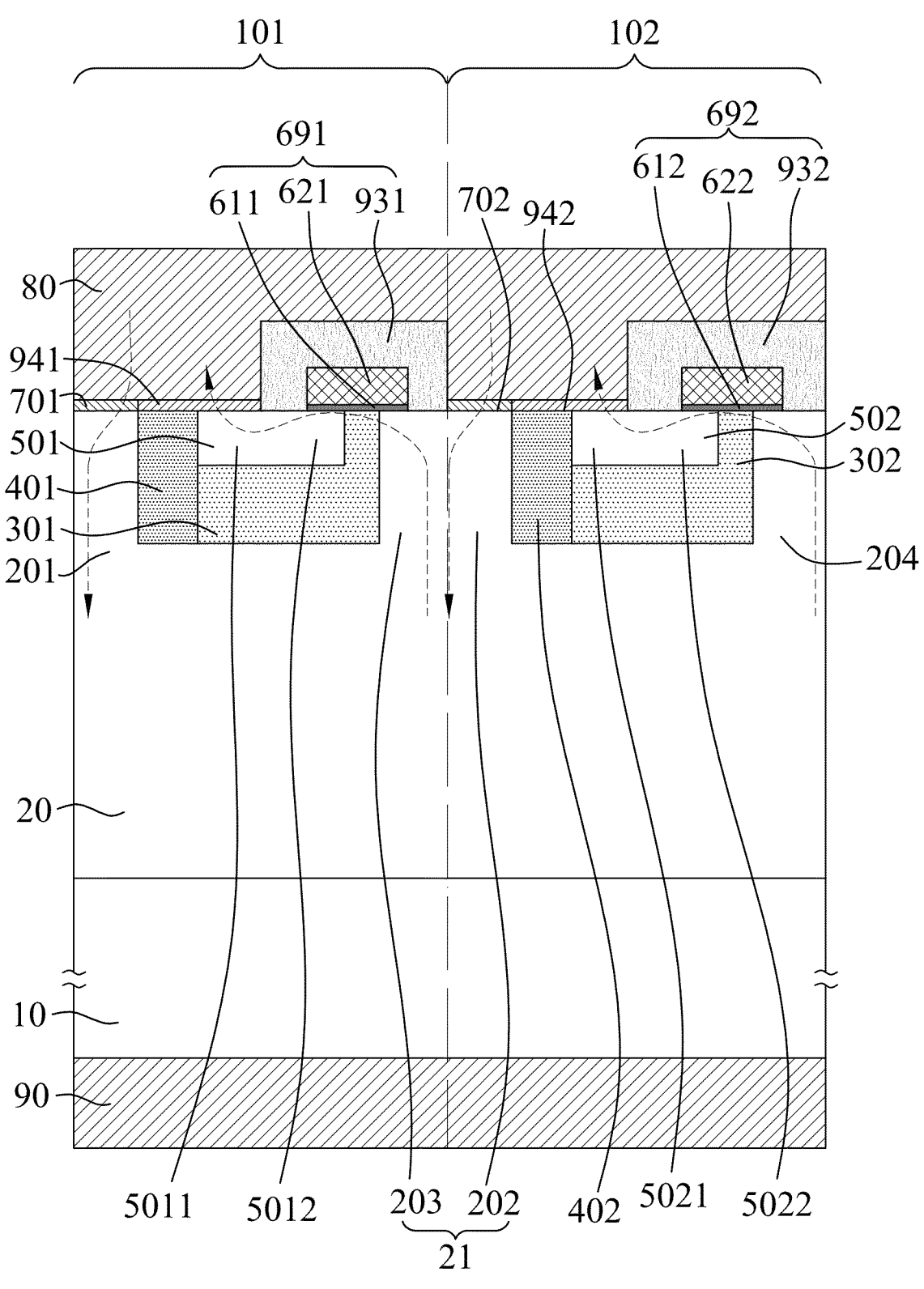
FIG. 3 is a fragmentary schematic view illustrating a SiC MOSFET device in accordance with some embodiments of the present disclosure.

Referring to FIG. 3, a silicon carbide metal-oxide-semiconductor-field-effect transistor (SiC MOSFET) device integrated with a Schottky diode in accordance with some embodiments of the present disclosure is provided to have a reduced forward bias voltage, a reduced gate electrode capacitance, a reduced diode current leakage, a larger breakdown voltage and an improved current density with enhanced cell structures of the SiC MOSFET device. In a first aspect, the SiC MOSFET device of the present disclosure includes a substrate 10 having a first conductivity type, an epitaxy layer 20 disposed over the substrate 10, and a plurality of cell units. In FIG. 3, only one of the cell units is shown.

Each of the cell units includes a first cell 101 and a second cell 102 that are disposed in the epitaxy layer 20 and connected to each other in the epitaxy layer 20.

In each of the cell units, the first cell 101 includes a first Schottky region 201 and a first junction field effect region 203, a first well region 301, a first well contact structure 401, a first source region 501, a first Schottky metal 701, a first ohmic contact metal 941, and a first gate structure 691.

The first Schottky region 201 and the first junction field effect region 203 are disposed in the epitaxy layer 20 and spaced apart from each other, and extend along a direction from the epitaxy layer 20 toward the substrate 10. The first Schottky region 201 and the first junction field effect region 203 may have the first type of conductivity.

The first well region 301 is disposed in the epitaxy layer 20, is connected to the first junction field effect region 203, and extends along the direction from the epitaxial layer 20 toward the substrate 10. The first well region 301 has a second type of conductivity.

The first well contact structure 401 is disposed in the epitaxy layer and on a side of the first well region 301 opposite to the first junction field effect region 203, is connected to the first Schottky region 201, and extends along the direction from the epitaxial layer 20 toward the substrate 10. The first well contact structure 401 has the second type of conductivity.

The first source region 501 is disposed in the first well region 301 in the epitaxy layer 20, is connected to the first well contact structure 401, and extends along the direction from the epitaxial layer 20 toward the substrate 10. The first source region 501 has the first type of conductivity. The first source region 501 has a first portion 5011 connected to the first well contact structure 401, and a second portion 5012 distal from the first well contact structure 401.

The first Schottky metal 701 is disposed on the first Schottky region 201. The first Schottky metal 701 and the first Schottky region 201 together form a Schottky diode in the first cell 101.

The first ohmic contact metal 941 is disposed on the first well contact structure 401 and the first portion 5011 of the first source region 501.

The first gate structure 691 is disposed on the first junction field effect region 203, and extends to cover the second portion 5012 of the first source region 501. The first gate structure 691 includes a first gate oxide layer 611, a first gate electrode 621 and a first interlayer dielectric 931. The first gate oxide layer 611 is disposed on a part of the first junction field effect region 203, and extends to cover a part of the second portion 5012 of the first source region 501. The first gate electrode 621 is disposed on the first gate oxide layer 611. The first interlayer dielectric 931 is disposed to cover the first gate oxide layer 611 and the first gate electrode 621.

In each of the cell units, the second cell 102 includes a second Schottky region 202, a second junction field effect region 204, a second well region 302, a second well contact structure 402, a second source region 502, a second Schottky metal 702, a second ohmic contact metal 942, and a second gate structure 692.

The second Schottky region 202 and the second junction field effect region 204 are disposed in the epitaxy layer 20 and spaced apart from each other, and extend along the direction from the epitaxial layer 20 toward the substrate 10. The second Schottky region 202 and the second junction field effect region 204 have the first type of conductivity.

The second well region 302 is disposed in the epitaxy layer 20, is connected to the second junction field effect region 204, and extends along the direction from the epitaxial layer 20 toward the substrate 10. The second well region 302 has the second type of conductivity.

The second well contact structure 402 is disposed in the epitaxy layer 20 and on a side of the second well region 302 opposite to the second junction field effect region 204, is connected to the second Schottky region 202, and extends along the direction from the epitaxial layer 20 toward the substrate 10. The second well contact structure 402 has the second type of conductivity.

The second source region 502 is disposed in the second well region 302 in the epitaxy layer 20, is connected to the second well contact structure 402, and extends along the direction from the epitaxial layer 20 toward the substrate 10. The second source region 502 has the first type of conductivity. The second source region 502 has a first portion 5021 connected to the second well contact structure 402, and a second portion 5022 distal from the second well contact structure 402.

The second Schottky metal 702 is disposed on the second Schottky region 202. The second Schottky metal 702 and the second Schottky region 202 together form a Schottky diode in the second cell 102.

The second ohmic contact metal 942 is disposed on the second well contact structure 402 and the first portion 5021 of the second source region 502.

The second gate structure 692 is disposed on the second junction field effect region 204, and extends to cover the second portion 5022 of the second source region 502. The second gate structure 692 includes a second gate oxide layer 612, a second gate electrode 622, and a second interlayer dielectric 932. The second gate oxide layer 612 is disposed on a part of the second junction field effect region 204, and extends to cover a part of the second portion 5022 of the second source region 502. The second gate electrode 622 is disposed on the second gate oxide layer 612. The second interlayer dielectric 932 is disposed to cover the second gate oxide layer 612 and the second gate electrode 622.

Please note that in the epitaxy layer 20, the first junction field effect region 203 of the first cell 101 and the second Schottky region 202 of the second cell 102 are connected to each other, and form a connection region 21 for connecting the first and second cells 101, 102.

In some embodiments, the first gate oxide layer 611, the second gate oxide layer 612, the first ohmic contact metal 941, the second ohmic contact metal 942, the first Schottky metal 701, and the second Schottky metal 702 are formed on the epitaxy layer 20. The first ohmic contact metal 941 is located between the first Schottky metal 701 and the first gate oxide layer 611; and the second ohmic contact metal 942 is located between the second Schottky metal 702 and the second gate oxide layer 612. In addition, the first gate oxide layer 611 is located between the first ohmic contact metal 941 and the second Schottky metal 702.

The first interlayer dielectric 931 is electrically non-conductive, and allows electrical insulation between the first gate oxide layer 611 and the first ohmic contact metal 941. Similarly, the second interlayer dielectric 932 is electrically non-conductive, and allows electrical insulation between the second gate oxide layer 612 and the second ohmic contact metal 942. Alternatively, electrical insulation between the first gate oxide layer 611 and the first ohmic contact metal 941 may be achieved by arranging the first gate oxide layer 611 and the first ohmic contact metal 941 in a spaced apart manner; and/or electrical insulation between the second gate oxide layer 612 and the second ohmic contact metal 942 may be achieved by arranging the second gate oxide layer 612 and the second ohmic contact metal 942 in a spaced apart manner, but is not limited thereto.

Exemplarily, referring to FIG. 3, the SiC MOSFET device further includes a source electrode 80 disposed on the first Schottky metal 701, the first ohmic contact metal 941, the first interlayer dielectric 931, the second Schottky metal 702, the second ohmic contact metal 942, and the second interlayer dielectric 932. It is noted that the first interlayer dielectric 931 may be used to isolate the source electrode 80 from the first gate oxide layer 611 and the first gate electrode 621, and to isolate the first ohmic contact metal 941 from the first gate oxide layer 611 and the first gate electrode 621. The second interlayer dielectric 932 may be used to isolate the source electrode 80 from the second gate oxide layer 612 and the second gate electrode 622, and to isolate the second ohmic contact metal 942 from the second gate oxide layer 612 and the second gate electrode 622. As such, both the first gate oxide layer 611 and the first gate electrode 621 are prevented from being in contact with the first ohmic contact metal 941, and do not become short circuited. Similarly, both the second gate oxide layer 612 and the second gate electrode 622 are prevented from being in contact with the second ohmic contact metal 942, and do not become short circuited.

Exemplarily, each of the first gate electrode 621 and the second gate electrode 622 may independently be a polysilicon gate electrode.

In some embodiments, as shown in FIG. 3, the SiC MOSFET device further includes a drain electrode 90 disposed on a side of the substrate 10 away from the epitaxy layer 20.

As shown in FIG. 3, in the SiC MOSFET device of the present disclosure, in each of the cell units, each of the first cell 101 and the second cell 102 is integrated with a Schottky diode. In addition, in each of the cell units, the two adjacent cells, i.e., the first cell 101 and the second cell 102, are electrically connected parallel to each other. The first junction field effect region 203 and the second Schottky region 202 together form a connection region 21 for connecting the first and second cells 101, 102 along an arranging direction from the first cell 101 to the second cell 102 (the arranging direction from the first cell 101 to the second cell 102 for each of the cell units is the same). The arranging direction from the first cell 101 to the second cell 102 (referred as the arranging direction hereafter) is transverse to and/or perpendicular to the direction from the epitaxial layer 20 toward the substrate 10. In addition, for the cell units that are connected and arranged along the arranging direction, the first cell 101 of each of the cell units forms another connection region 21 with the second cell 102 of an adjacent one of the cell units along the arranging direction. That is, each of the first and second cells 101, 102 forms two connection regions at opposite ends thereof along the arranging direction. With such configuration, both a forward current and a reverse diode current pass through the connection region 21 (i.e., the connection region 21 serves as a common pathway for the forward current and the reverse diode current), which is conducive to reduction in size of each of the first and second cells 101, 102, and thus reduction in size of the SiC MOSFET device.

Figure 4:
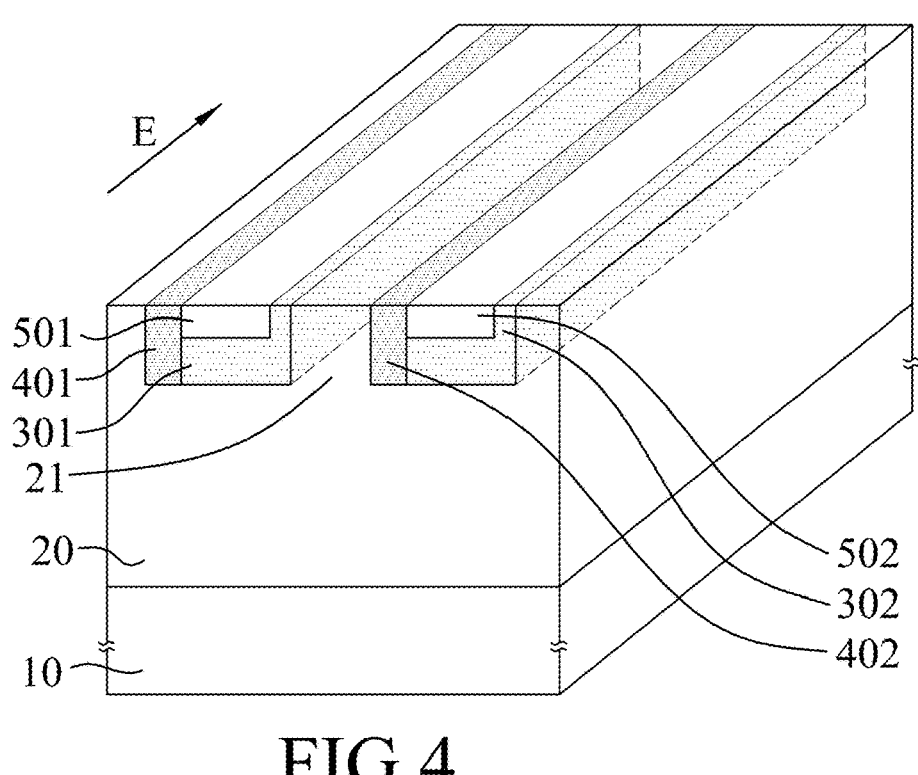
FIG. 4 is a fragmentary perspective view of the SiC MOSFET device shown in FIG. 3.

In certain embodiments, referring to FIG. 4, for each of the cell units, the first well region 301 and the second well region 302 are each in an elongated shape. In some embodiments, an elongating direction of the first well region 301 is parallel to an elongating direction of the second well region 302. That is, each of the first and second well regions 301, 302 elongates along the same elongating direction (referred as the elongating direction (E) hereafter) that is transverse to and/or perpendicular to the direction from the epitaxial layer 20 toward the substrate 10, and that is transverse to and/or perpendicular to the arranging direction.

In certain embodiments, as shown in FIG. 4, for each of the cell units, the first well contact structure 401 and the second well contact structure 402 are each in an elongated shape. The first well contact structure 401 connected to the first well region 301, and the second well contact structure 402 connected to the second well region 302, elongate along the elongating direction. That is, the first well region 301, the second well region 302, the first well contact structure 401, and the second well contact structure 402 are arranged parallel to each other and elongate along the elongating direction (E).

Figure 5:
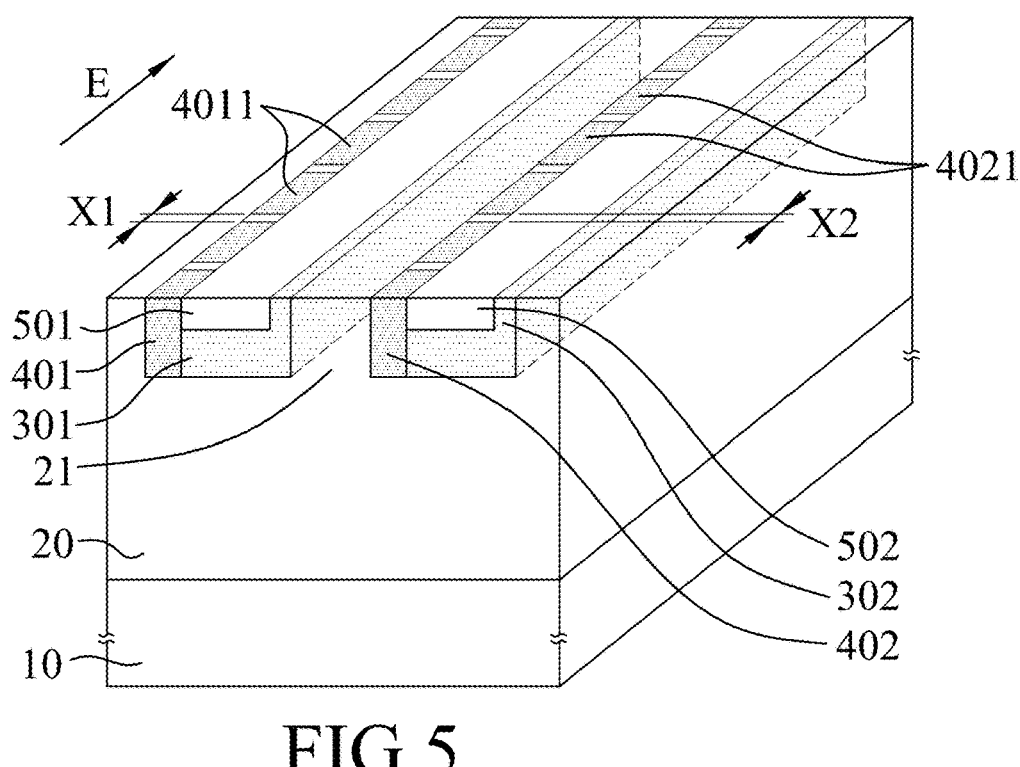
FIGS. 5 to 7 are fragmentary perspective views of different variations of the SiC MOSFET device shown in FIG. 4.

In certain embodiments, referring to FIG. 5, for each of the cell units, the first well contact structure 401 includes a plurality of first well contact regions 4011 that are spaced apart from each other along the elongating direction (E), and the second well contact structure 402 includes a plurality of second well contact regions 4021 that are spaced apart from each other along the elongating direction (E).

Two adjacent ones of the first well contact regions 4011 are spaced apart from each other along the elongating direction (E) by an interval region (X1), and two adjacent ones of the second well contact regions 4021 are spaced apart from each other by an interval region (X2). The interval regions (X1, X2) may be doped with ions having a conductivity type the same as that of the epitaxy layer 20. The interval regions (X1, X2) may have a doping concentration the same as, or different from that of the epitaxy layer 20.

The first well contact regions 4011 may be equally spaced apart from each other. The second well contact regions 4021 may be equally spaced apart from each other (i.e., the interval regions (X1) among the first well contact regions 4011 have the same length in the elongating direction (E), and the interval regions (X2) among the second well contact regions 4021 have the same length in the elongating direction (E)).

In some embodiments, the first type of conductivity is n-type conductivity, and the second type of conductivity is p-type conductivity. In other embodiments, the first type of conductivity is p-type conductivity, and the second type of conductivity is n-type conductivity.

In some embodiments, referring to FIGS. 3 to 5, the epitaxy layer is lightly doped. The first source region 501, the second source region 502, the first well contact structure 401 and the second well contact structure 402 are heavily doped.

Exemplarily, in certain embodiments, the first type of conductivity is n-type conductivity, and the second type of conductivity is p-type conductivity. In the SiC MOSFET device, the n-type epitaxy layer 20 is formed with a p-type well area (i.e., the first well region 301 or the second well region 302), an n$^+$-type area (i.e., the first source region 501 or the second source region 502) located within the p-type well area, and a p$^+$-type area (i.e., the first well contact structure 401 or the second well contact structure 402) located on a side of the p-type well area. The n$^+$-type area and the p$^+$-type area are located at an upper portion of the n-type epitaxy layer 20. An upper surface of each of the n$^+$-type area and the p$^+$-type area is exposed from the n-type epitaxy layer 20. Both the n$^+$-type area and the p-type well area are connected to and are located at the same side of the p$^+$-type area. It is to be understood that, any two adjacent ones of cells, i.e., the first cell 101 and the second cell 102 are asymmetrical to each other. The n$^+$-type area, the p$^+$-type area, and the p-type well area of each of the first and second cells 101, 102 of each of the cell units have the same configuration. That is, for example, for the SiC MOSFET device shown in FIG. 3, for both the first cell 101 and the second cell 102, the n$^+$-type area is located at the right side of the p$^+$-type area, and is located at an upper left position relative to the p-type well area.

Figure 2:
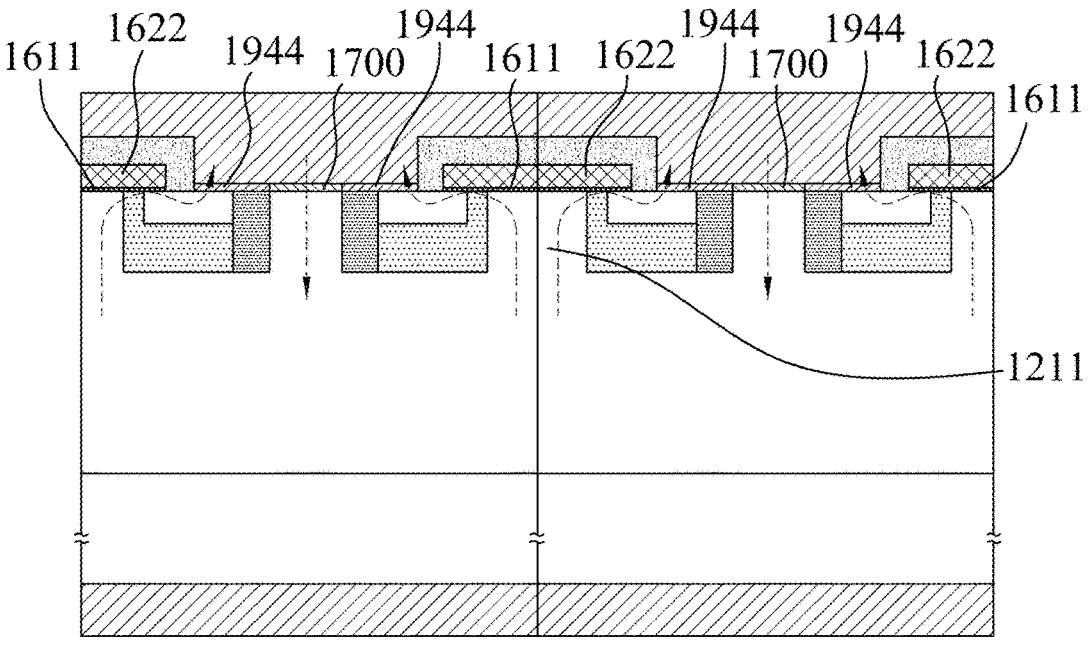
FIG. 2 is a schematic view illustrating a second type of the conventional SiC MOSFET device integrated with another Schottky diode.

Referring again to FIG. 3, a projection of the first gate oxide layer 611 on the epitaxy layer 20 is located on an upper surface of the first well region 301, the part of the second portion 5012 of the first source region 501, and the part of the first junction field effect region 203. The second Schottky metal 702 is located on the epitaxy layer 20 and is connected to the first gate structure 691. Both the forward current and the reverse current pass through the connection region 21. Comparing the two SiC MOSFET devices respectively shown in FIGS. 2 and 3, a first section of one of gate oxide layers 1611 and a second section of a corresponding one of gate electrodes 1622, which are located on a third section of a corresponding one of junction field effect regions 1211 as shown in FIG. 2, are replaced by a corresponding one of the first and second Schottky metals 701, 702 of the first and second cells 101, 102 (see FIG. 3), and the third section of the corresponding junction field effect region 1211 (see FIG. 2) becomes a corresponding one of the first and second Schottky regions 201, 202 of the first and second cells 101, 102 (see FIG. 3). As such, in comparison to the conventional SiC MOSFET device shown in FIG. 2, in each of the first and second cells 101, 102 of the SiC MOSFET device of the present disclosure shown in FIG. 3, a surface area of each of the first and second junction field effect regions 203, 204 covered by a corresponding one of the first and second gate electrodes 621, 622 is relatively smaller, which greatly reduces capacitance of the first and second gate electrodes 621, 622 for the first and second cells 101, 102, and thus the SiC MOSFET device is beneficial for high frequency operation. In addition, in the SiC MOSFET device of the present disclosure, both the forward current and reverse diode current pass through the connection region 21, and thus the connection region 21 may have a reduced width. Moreover, considering that the first Schottky region 201 is connected to the first well contact structure 401, and the second Schottky region 202 is connected to the second well contact structure 402, during a reverse blocking state, an electric field at the Schottky contact between the first Schottky metal 701 and the first Schottky region 201, and an electric field at the Schottky contact between the second Schottky metal 702 and the second Schottky region 202 are greatly reduced. As such, the SiC MOSFET device of the present disclosure may have a reduced current leakage and an increased breakdown voltage during the reverse blocking state.

In other words, in the SiC MOSFET device of the present disclosure, the first cell 101 and the second cell 102 are asymmetrical and are connected to each other through the connection region 21 (the first junction field effect region 203 of the first cell 101 is connected to the second Schottky region 202 of the second cell 102), which serves as a common pathway for both a forward current and a reverse diode current which is conducive to reduction in size of the first and second cells 101, 102, and thus, reduction in size of the SiC MOSFET device. In addition, since the gate electrode 621 covers only a portion of the connection region 21 (i.e., only the first junction field effect region 203 but not the second Schottky region 202), capacitance of the first gate electrode 621 is greatly reduced, and thus the SiC MOSFET device is beneficial for high frequency operation. Moreover, both the first junction field effect region 203 and the second junction field effect region 204 have a reduced width compared with a width of the junction field effect region 1211 of the conventional SiC MOSFET device shown in FIG. 2. Furthermore, since the first Schottky metal 701 is close to the first contact structure 401, and the second Schottky metal 702 is close to the second well contact structure 402, at the reverse blocking state, the electric field at the Schottky contact between the first Schottky metal 701 and the first Schottky region 201, and the electric field at the Schottky contact between the second Schottky metal 702 and the second Schottky region 202 are greatly reduced, and thus, current leakage is reduced and breakdown voltage is increased.

Figure 6:
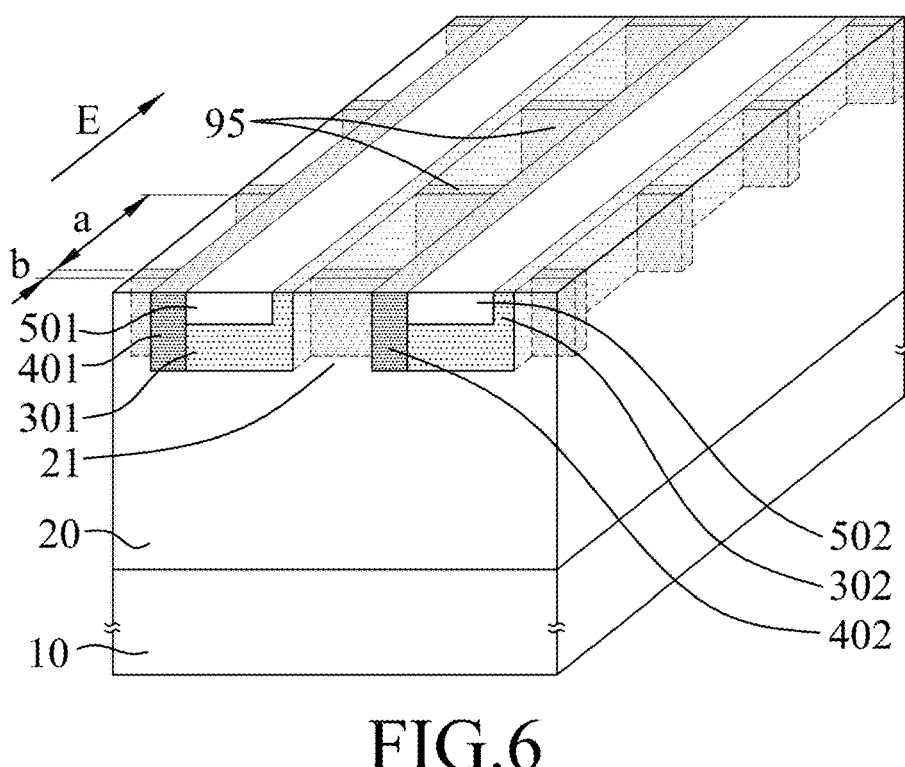
Figure 7:
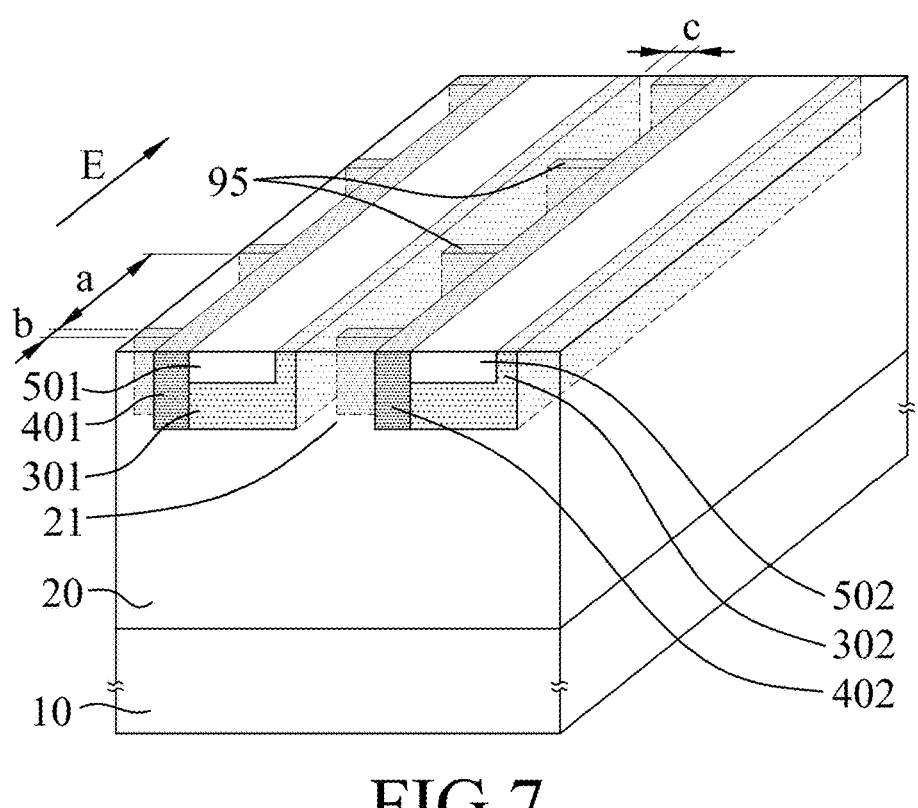

Referring to FIGS. 3, 6 and 7, in order to further reduce the current leakage resulting from Schottky contact between the Schottky metal 701 and the first Schottky region 201, and that between the second Schottky metal 702 and the second Schottky region 202 at the reverse blocking state, in some embodiments, each of the cell units further includes a plurality of implanting regions 95 that are disposed in the connection region 21, that are spaced apart from each other along the elongating direction (E), and that have the second type of conductivity. By including the implanting regions 95, when the SiC MOSFET device is at the reverse blocking state, a width of depletion region of the first junction field effect region 203 (and the second junction field effect region 204) along the arranging direction becomes wide, and the electric field at the Schottky contact between the first Schottky metal 701 and the first Schottky region 201, and the electric field at the Schottky contact between the second Schottky metal 702 and the second Schottky region 202 may have a reduced peak value, thereby achieving further reduction in current leakage of the SiC MOSFET device.

Exemplarily, the first type of conductivity is n-type conductivity, and the second type of conductivity is p-type conductivity, and the implanting regions may be formed by doping of p-type ions, or p$^+$-type ions. When the implanting regions 95 are doped with p-type ions or p$^+$-type ions, the implanting regions 95 may be independently formed, or may be formed simultaneously with the p-type well area or the p$^+$-type area, i.e., the first and second well regions 301, 302, or the first and second well contact structures 401, 402.

In other embodiments, the implanting regions 95 are equally spaced apart from each other along the elongating direction (E) by a distance (a) (see FIG. 6). The distance (a) may range from 1.0 µm to 100.0 µm, such as 1.0 µm, 5 µm, µm, 30 µm, 50 µm, 80 µm, 100 µm, etc.

In some embodiments, a width (b) (see FIG. 6) of each of the implanting regions 95 along the elongating direction (E) is smaller than a width of each of the second well regions 302 along the elongating direction (E). Exemplarily, the width (b) of each of the implanting regions 95 along the elongating direction (E) may range from 0.2 µm to 20 µm, such as, 0.2 µm, 0.5 µm, 2 µm, 3 µm, 5 µm, 10 µm, 16 µm, 20 µm, etc.

In some embodiments, referring to FIG. 6, for each of the cell units, each of the implanting regions 95 extends along the direction from the epitaxial layer 20 toward the substrate 10. Each of the implanting regions 95 has one end connected to the second well contact structure 402, and an opposite end which is opposite to the second well contact structure 402 and which is connected to the first well region 301.

In other embodiments, referring to FIGS. 3 and 7, each of the implanting regions 95 has one end connected to the second well contact structure 402, and an opposite end which is opposite to the second well contact structure 402 and which is spaced apart from the first well region 301 by a predetermined distance (c).

In some embodiments, the predetermined distance (c) is less than a width of the first junction field effect region 203 along the arranging direction.

In some embodiments, each of the first Schottky metal 701 and the second Schottky metal 702 described above includes at least one of Ti, Mo, Ni, Pt, and TiW.

Figure 8A:
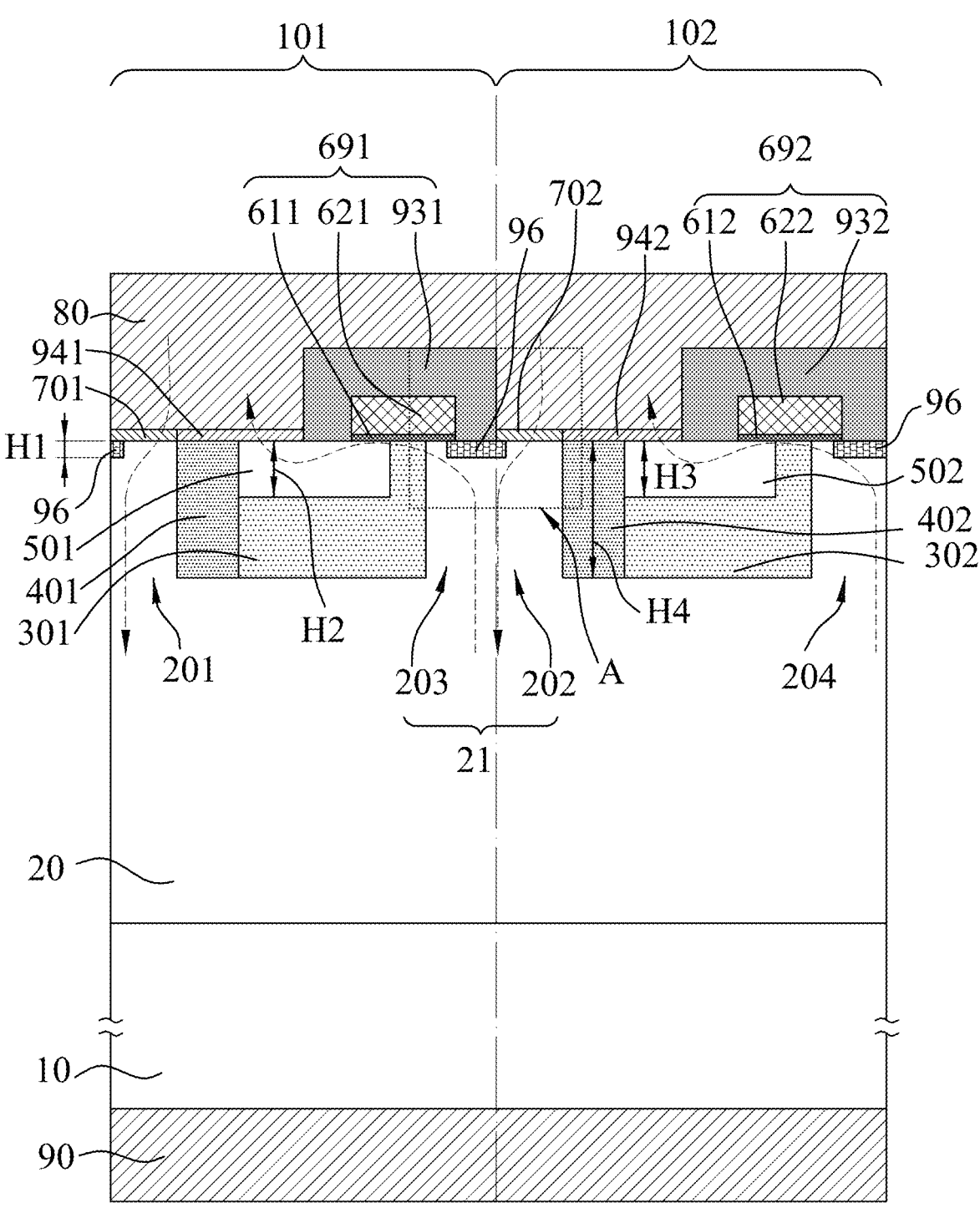
FIG. 8A is a fragmentary schematic view illustrating a SiC MOSFET device in accordance with some embodiments of the present disclosure.
Figure 8B:
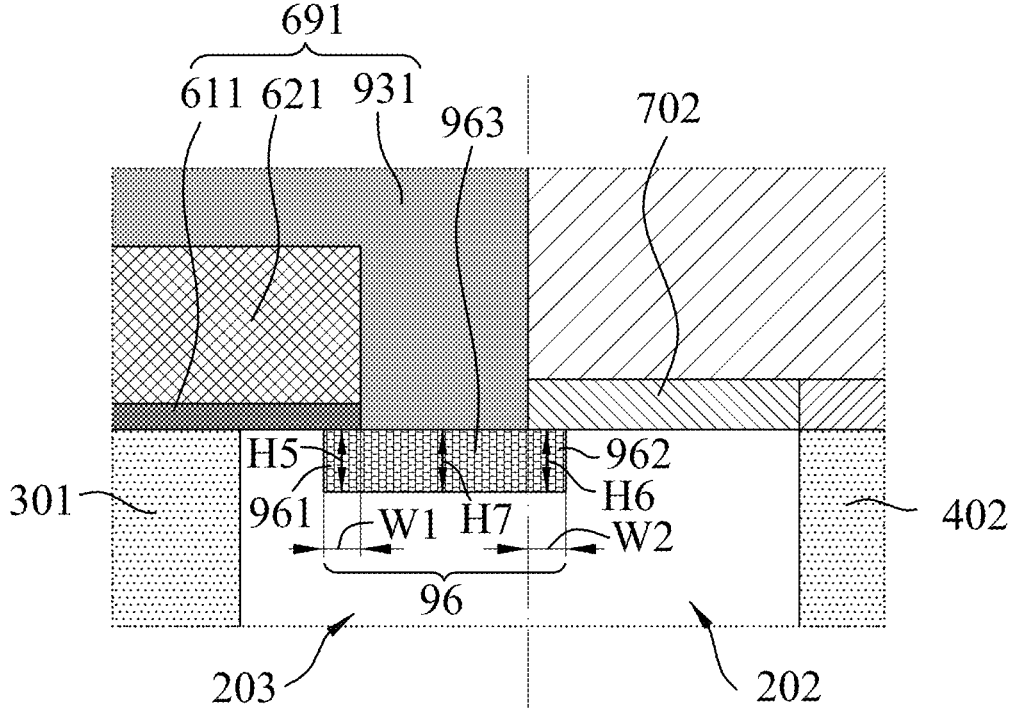
FIG. 8B is an enlarged view of region A labeled in FIG. 8A.
Figure 8C:
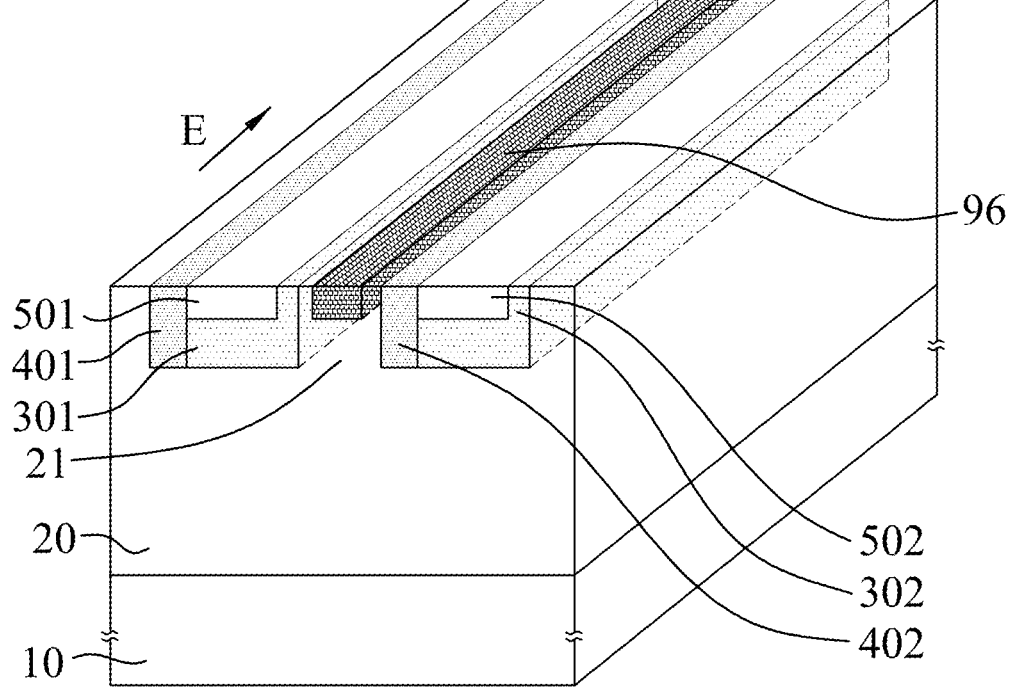
FIG. 8C is a fragmentary perspective view of the SiC MOSFET device shown in FIG. 8A.

FIGS. 8A to 8C illustrate a SiC MOSFET device integrated with a Schottky diode in accordance with some embodiments of the present disclosure. The SiC MOSFET device is similar to that shown in FIGS. 3 and 4 except that in FIGS. 8A to 8C, each of the cell units further includes one implantation section 96 that extends along the elongating direction (E).

When the SiC MOSFET device is applied with a reverse voltage, in order to avoid concentration of electric fields around a contact edge between the second Schottky regions 202 and the first junction field effect region 203, i.e., to avoid concentration of electric fields at an end of the second Schottky metal 702 distal from the second ohmic contact metal 942 (which might result in an increased current leakage of the drain electrode 90, or a reduced breakdown voltage of the SiC MOSFET device), and to avoid concentration of electric fields at an end of the first gate electrode 621 proximal to the second Schottky metal 702 (which might result in a reduced reliability of the first gate electrode 621, or more specifically, the first gate oxide layer 611) causing early breakdown and malfunction of the SiC MOSFET device, each of the cell units includes the implantation section 96 having the second type of conductivity and disposed in the epitaxy layer 20.

The implantation section 96 extends along the direction from the epitaxy layer 20 toward the substrate 10. Along the arranging direction from the first junction field effect region 203 to the second Schottky region 202, the implantation section 96 has two opposite ends (i.e., a first end and a second end). The first end of the implantation section 96 is connected to an end of the first gate electrode 621 of the first gate structure 691 proximal to the second Schottky region 202 through the first gate oxide layer 611. The second end of the implantation section 96 is connected to an end of the second Schottky metal 702 proximal to the first junction field effect region 203.

The first end of the implantation section 96 is not in contact with the first well region 301, and is spaced apart from the first well region 301 by a first interval. The second end of the implantation section 96 is not in contact with the second well contact structure 402, and is spaced apart from the second well contact structure 402 by a second interval.

Specifically, the implantation section 96 is disposed in the connection region 21, and has a conductivity type different from that of the epitaxy layer 20. As such, when the SiC MOSFET device is in operation, a charge depletion zone is generated between the implantation section 96 and the epitaxy layer 20. Such charge depletion zone provides screening of electric field and protection to the contact edge between the second Schottky regions 202 and the first junction field effect region 203. When the SiC MOSFET device is applied with the reverse voltage, the concentration of electric fields at an edge of the second Schottky metal 702 is improved, and a peak electric field strength at the edge of the second Schottky metal 702 is significantly reduced, to alleviate or eliminate the problem of increased current leakage due to the high electric field and a reduced Schottky barrier, and thus the breakdown voltage of the SiC MOSFET device is increased. Hence, reliability of the first gate structure 691 (or more specifically the first gate oxide layer 611) is improved, to avoid early malfunction of the SiC MOSFET device.

In some embodiments, the implantation section 96 extends along the direction from the epitaxial layer 20 toward the substrate 10. The implantation section 96 may be a shallow implantation section, with a thickness (H1) smaller than a thickness (H2) of the first source region 501 or a thickness (H3) of the second source region 502.

Specifically, if the thickness (H1) of the implantation section 96 is too large, such as same as the thickness (H2, H3) of the first or second source regions 501, 502, or a thickness (H4) of the second well contact structure 402, an electrical conducting pathway in the first junction field effect region 203 is reduced, resulting in an increased forward electrical resistance of the first junction field effect region 203 and an increased reverse electrical resistance of the second Schottky region 202.

Therefore, with the configuration that the thickness (H1) of the implantation section 96 is smaller than the thickness (H2) of the first source region 501 or the thickness (H3) of the second source region 502, the problem of concentration of electric fields around an edge of the first gate electrode 621 and an edge of the second Schottky metal 702 is eased, without causing the problem of the increased forward electrical resistance of the first junction field effect region 203 and the increased reverse electrical resistance of the second Schottky region 202.

Specifically, each of the first and second source regions 501, 502 may have the thickness (H2, H3) of approximately 0.4 μm, and the implantation section 96 may have the thickness (H1) ranging from 0.05 μm to less than 0.4 μm. In some embodiments, the thickness (H1) of the implantation section 96 may be 0.05 μm, 0.1 μm, 0.2 μm, but are not limited thereto, as long as being smaller than the thicknesses (H2, H3) of the first and second source regions 501, 502.

In some embodiments, the implantation section 96 includes a first overlap region 961, a second overlap region 962, and a third overlap region 963. A projection of the first overlap region 961 on the substrate 10 overlaps with a projection of the first gate electrode 621 on the substrate 10. A projection of the second overlap region 962 on the substrate 10 overlaps with a projection of the second Schottky metal 702 on the substrate 10. The third overlap region 963 is located between the first and second overlap regions 961, 962. A width (W1) of the first overlap region 961 measured along the arranging direction is smaller than a width (W2) of the second overlap region 962 measured along the arranging direction.

Specifically, the first overlap region 961 is a portion of the implantation section 96 that is connected to the edge of the first gate electrode 621 through the first gate oxide layer 611. The second overlap region 962 is another portion of the implantation section 96 that is connected to the second Schottky metal 702. When the SiC MOSFET device is in operation, concentration of electric fields at the edge of the second Schottky metal 702 is more apparent. Therefore, a configuration in which the width (W2) of the second overlap region 962 is greater than the width (W1) of the first overlap region 961 favours reduction in peak electric field strength at the edge of the second Schottky metal 702, thereby alleviating the problem of current leakage and enhancing the breakdown voltage of the SiC MOSFET device.

In order to alleviate the concentration of electric fields around the edge of the first gate electrode 621 when the reverse voltage is applied to the SiC MOSFET device, so as to increase reliability of the first gate electrode 621, exemplarily, the width (W1) of the first overlap region 961 may be configured as 0 μm to 0.5 μm. In some embodiments, the width (W1) of the first overlap region 961 may be 0 μm, or 0.3 μm, or 0.5 μm, but is not limited thereto.

Exemplarily, in order to reduce peak electric field strength at the edge of the second Schottky metal 702, to alleviate the problem of increased current leakage and to increase the breakdown voltage of the SiC MOSFET device, the width (W2) of the second overlap region 962 may be configured as 0.05 μm to μm. In some embodiments, the width (W2) of the second overlap region 962 may be 0.05 μm, or 0.2 μm, or 0.35 μm, or 0.5 μm, but is not limited thereto.

Both the edge of the first gate electrode 621 and the edge of the second Schottky metal 702 are configured to locate above the implantation section 96. Such configuration ensures that when the SiC MOSFET device is applied with the reverse voltage, the charge depletion zone generated between the implantation section 96 and the epitaxy layer 20 provides screening of electric field and protection to the edge of the first gate electrode 621 and the edge of the second Schottky metal 702, reduces the concentration of electric fields at the edge of the first gate electrode 621 and the edge of the second Schottky metal 702, alleviates reverse current leakage of the SiC MOSFET device, increases the reverse breakdown voltage, as well as improving the reliability of the first gate electrode 621.

In some embodiments, along the direction from the epitaxy layer 20 toward the substrate 10, a thickness (H5) of the first overlap region 961, a thickness (H6) of the second overlap region 962, and a thickness (H7) of the third overlap region 963 are the same, and range from 0.05 μm to less than 0.4 μm.

The third overlap region 963 is located below the first interlayer dielectric 931. When the SIC MOSFET device is applied with the reverse voltage, the third overlap region 963 has a concentration of electric fields comparatively less than that of the first overlap region 961 and the second overlap region 962. In such case, in some embodiments, the thickness (H5) of the first overlap region 961 and the thickness (H6) of the second overlap region 962 may be the same and may be greater than the thickness (H7) of the third overlap region 963. Please note that the thicknesses (H5, H6, H7) of the first, second and third overlap regions 961, 962, 963 range from 0.05 μm to less than 0.4 μm.

In other embodiments, when the SiC MOSFET device is applied with the reverse voltage, the second overlap region 962 endures the greatest concentration of electric fields, the first overlap region 961 endures less of the concentration of electric fields, and the third overlap region 963 endures the least of the concentration of electric fields. In such case, the thickness (H6) of the second overlap region 962 may be greater than the thickness (H5) of the first overlap region 961, and the thickness (H5) of the first overlap region 961 may be greater than the thickness (H7) of the third overlap region 963. Please note that the thicknesses (H5, H6, H7) of the first, second and third overlap regions 961, 962, 963 range from 0.05 μm to less than 0.4 μm.

In some embodiments, the first and second well regions 301, 302 may be lightly doped well regions (p-type well areas), and the implantation section 96 may be a heavily doped implantation section. The p$^+$-type area (i.e., the first well contact structure 401 or the second well contact structure 402) is located on the left side of the p-type well area. The n$^+$-type area (i.e., the first source region 501 or the second source region 502) is located at an upper left position relative to the p-type well area.

Figure 9:
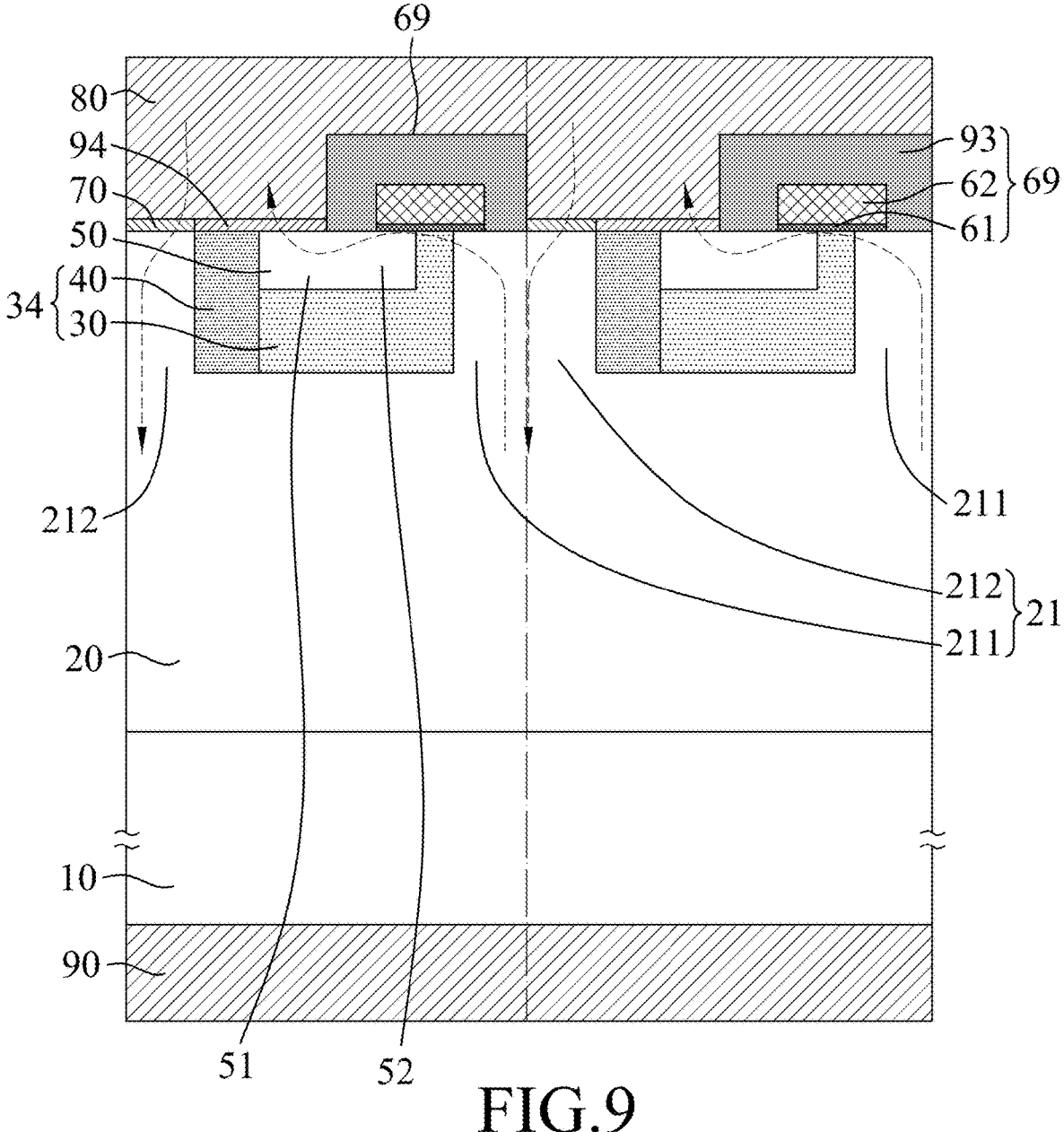
FIG. 9 is a fragmentary schematic view illustrating another SiC MOSFET device in accordance with some embodiments of the present disclosure.

In a second aspect of the present disclosure, referring to FIG. 9, a SIC MOSFET device of the present disclosure includes a substrate 10 having a first type of conductivity, an epitaxy layer 20 disposed on the substrate 10, a plurality of doped areas 34, a plurality of junction field effect regions 211, a plurality of Schottky regions 212, a plurality of source regions 50, a plurality of Schottky metals 70, a plurality of ohmic contact metals 94, and a plurality of gate structures 69.

The doped areas 34 are disposed in the epitaxy layer 20, are spaced apart from each other, and have a second type of conductivity. Each of the doped areas 34 includes a well region 30 and a well contact structure 40, each of which extends along a direction from the epitaxial layer 20 toward the substrate 10.

Each of the junction field effect regions 211 and a respective one of the Schottky regions 212 are formed between two corresponding adjacent ones of the doped areas 34, and are connected to each other. The junction field effect regions 211 are respectively connected to the well regions 30 of the doped areas 34. The Schottky regions 212 are respectively connected to the well contact structures 40 of the doped areas 34.

The source regions 50 have the first type of conductivity, are disposed respectively in the doped areas 34, and are respectively connected to the well contact structures 40 of the doped areas 34. Each of the source regions 50 extends along the direction from the epitaxial layer 20 toward the substrate 10. The source regions 50 each has a first portion 51 connected to a respective one of the well contact structures 40, and a second portion 52 distal from the respective one of the well contact structures 40.

The Schottky metals 70 are respectively disposed on the Schottky regions 212.

Each of the ohmic contact metals 94 is disposed on the well contact structure 40 of a respective one of the doped areas 34, and extends to cover the first portion 51 of a respective one of the source regions 50.

Each of the gate structures 69 is disposed on a respective one of the junction field effect regions 211, and extends to cover the second portion 52 of a respective one of the source regions 50. Each of the gate structures 69 includes a gate oxide layer 61, a gate electrode 62, and an interlayer dielectric 93. The gate oxide layer 61 is disposed on a part of the respective one of the junction field effect regions 211, and extends to cover a part of the second portion 52 of the respective one of the source regions 50. The gate electrode 62 is disposed on the gate oxide layer 61. The interlayer dielectric 93 is disposed to cover the gate oxide layer 61 and the gate electrode 62.

In some embodiments, the gate oxide layer 61 of each of the gate structures 69, the ohmic contact metals 94, and the Schottky metals 70 are formed on the epitaxy layer 20. Each of the ohmic contact metals 94 is located between one of the Schottky metals 70 and the gate oxide layer 61 of a respective one of the gate structures 69.

The interlayer dielectric 93 of each of the gate structures 69 is electrically non-conductive, and allows an electrical insulation between the gate oxide layer 61 of one of the gate structures 69 and a respective one of ohmic contact metals 94. Alternatively, the aforementioned electrical insulation may be achieved by arranging the gate oxide layer 61 of the one of gate structures 69 and the respective ohmic contact metal 94 in a spaced apart manner, but is not limited thereto.

Exemplarily, referring to FIG. 9, the SiC MOSFET device further includes a source electrode 80 disposed on the Schottky metals 70, the ohmic contact metals 94, and the interlayer dielectric 93 of each of the gate structures 69. It is noted that for each of the gate structures 69, the interlayer dielectric 93 may be used to isolate the source electrode 80 from the gate oxide layer 61 and the gate electrode 62, and to isolate a respective one of ohmic contact metals 94 from the gate oxide layer 61 and the gate electrode 62. As such, both the gate oxide layer 61 and the gate electrode 62 are prevented from being in contact with the respective ohmic contact metal 94, and do not become short circuited. The gate electrode 62 of each of the gate structures 69 may independently be a polysilicon gate electrode.

In some embodiments, as shown in FIG. 9, the SiC MOSFET device further includes a drain electrode 90 disposed on a side of the substrate 10 away from the epitaxy layer 20.

As shown in FIG. 9, the SiC MOSFET device of the present disclosure is integrated with a plurality of Schottky diodes. In addition, in the SiC MOSFET device, any two adjacent doped areas 34 are connected to each other through a connection region 21. That is, the SiC MOSFET device includes a plurality of the connection regions 21. Each of the connection regions 21 is formed by one of the junction field effect regions 211 and a respective one of the Schottky regions 212. In each of the connection regions 21, the junction field effect region 211 is connected to the well region 30 of a respective one of the doped areas 34, and the Schottky region 212 is connected to the well contact structures 40 of a respective one of the doped areas 34. With such configuration, both a forward current and a reverse diode current pass through the connection regions 21, i.e., the connection regions 21 serve as common pathways for the forward current and the reverse diode current, and which is conducive to reduction in size of the SiC MOSFET device.

Figure 10:
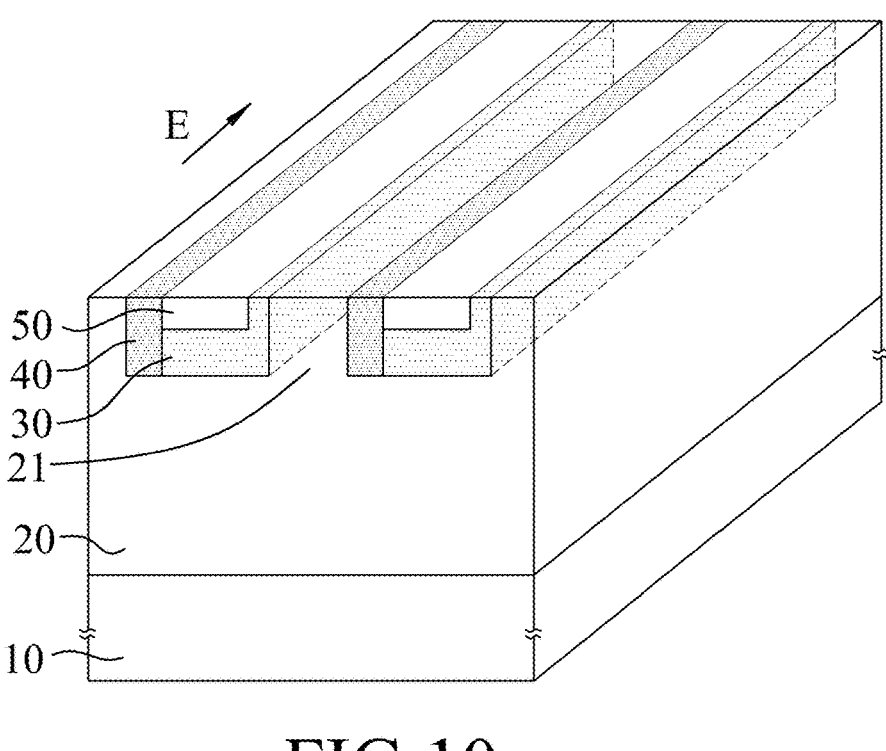
FIG. 10 is a fragmentary perspective view of the SiC MOSFET device shown in FIG. 9.

Referring to FIG. 10, in certain embodiments, for each of the doped areas 34, the well region 30 is in an elongated shape, and elongates along an elongating direction (E). The elongating direction (E) is transverse to and/or perpendicular to the direction from the epitaxial layer 20 toward the substrate 10, and is transverse to and/or perpendicular to an arranging direction of any two adjacent ones of the doped areas 34.

In other embodiments, for each of the doped areas 34, the well contact structure 40 is also in an elongated shape. The well contact structure 40, which is connected to the well region 30, elongates along the elongating direction (E).

Figure 11:
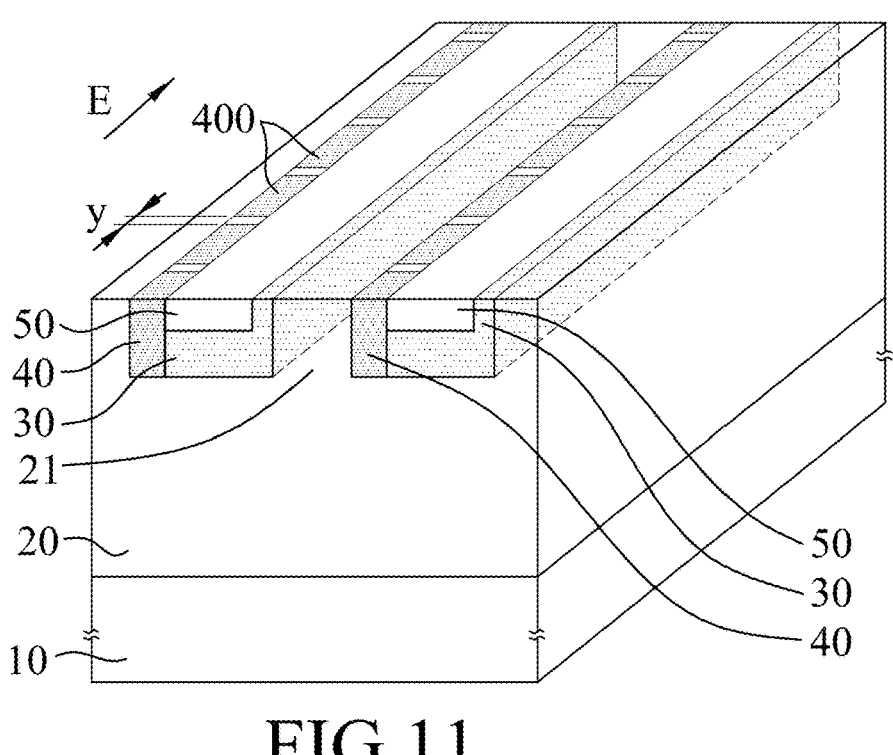
FIGS. 11 to 13 are fragmentary perspective views of different variations of the SiC MOSFET device shown in FIG. 10.

Referring to FIG. 11, in certain embodiments, for each of the doped areas 34, the well contact structure 40 includes a plurality of well contact regions 400 that are spaced apart from each other along the elongating direction (E). Two adjacent ones of the well contact regions 400 are spaced apart from each other by an interval region (y). The interval region (y) may be doped with ions having a conductivity type the same as that of the epitaxy layer 20. The interval region (y) may have a doping concentration the same as, or different from that of the epitaxy layer 20.

In some embodiments, the well contact regions 400 are equally spaced apart from each other (i.e., the interval regions (y) among the well contact regions 400 have the same length in the elongating direction (E)).

In some embodiments, the first type of conductivity is n-type conductivity, and the second type of conductivity is p-type conductivity. In other embodiments, the first type of conductivity is p-type conductivity, and the second type of conductivity is n-type conductivity.

In some embodiments, referring to FIGS. 9 to 11, the epitaxy layer 20 is lightly doped. The source regions 50 and the well contact structures 40 are heavily doped.

Exemplarily, in certain embodiment, the first type of conductivity is n-type conductivity, and the second type of conductivity is p-type conductivity. In the SiC MOSFET device, the n-type epitaxy layer 20 is formed with the p-type well regions 30, the $n^+$-type source regions 50 respectively located within the p-type well regions 30, and the p⁺-type well contact structures 40 each of which is located on a side of a respective one of the p-type well regions 30. The n⁺-type source regions 50 and the p⁺-type well contact structures 40 are located at an upper portion of the n-type epitaxy layer 20. An upper surface of each of the n⁺-type source regions 50 and the p⁺-type well contact structures 40 is exposed from the n-type epitaxy layer 20. Each of the n⁺-type source regions 50 and a respective one of the p-type well regions 30 are connected to and are located at the same side of a respective one of the p⁺-type well contact structures 40 (e.g., the right side of the respective p⁺-type well contact structure 40 as shown in FIG. 9). Each of the doped areas 34, and a respective one of the n⁺-type source regions 50 form a cell unit. That is, the SiC MOSFET device includes a plurality of cell units. Any two adjacent ones of the cell units are asymmetrical to each other. The n⁺-type source region 50, the p⁺-type well contact structure 40, and the p-type well region of each of the cell units have the same configuration. That is, for example, for each of the two cell units shown in FIG. 9, the n⁺-type source region 50 is located at the right side of the p⁺-type well contact structure 40, and is located at an upper left position relative to the p-type well region 30.

Referring to FIG. 9, a projection of the gate oxide layer 61 of each of the gate structures 69 on the epitaxy layer 20 is located on an upper surface of a respective one of the well regions 30, an upper surface of the part of the second portion 52 of the respective one of the source regions 50, and an upper surface of the part of the respective one of the junction field effect regions 211. The Schottky metals 70 are located on the epitaxy layer 20 and are each connected to an adjacent one of the gate structures 69. Both the forward current and the reverse current pass through the connection regions 21. Comparing the two SiC MOSFET devices shown in FIGS. 2 and 9, a first section of one of gate oxide layers 1611 and a second section of a corresponding one of gate electrodes 1622, which are located on a third section of a corresponding one of junction field effect regions 1211 as shown in FIG. 2, are replaced by a corresponding one of the Schottky metals 70 (see FIG. 9), and the third section of the corresponding junction field effect region 1211 (see FIG. 2) becomes a corresponding one of the Schottky regions 212 (see FIG. 9). As such, in comparison to the conventional SiC MOSFET device shown in FIG. 2, in the SiC MOSFET device of the present disclosure shown in FIG. 9, a surface area of each of the junction field effect regions 211 covered by the gate electrode 62 of a corresponding one of gate structures 69 is relatively smaller, which greatly reduces capacitance of the gate electrodes 62, and the SiC MOSFET device is thus beneficial for high frequency operation. In addition, considering that each of the connection regions 21 has a reduced width, and the Schottky regions 212 are each close to a respective one of the well contact structures 40, during a reverse blocking state, an electric field at the Schottky contact between each of the Schottky metals 70 and a respective one of the Schottky regions 212 is greatly reduced. As such, the SiC MOSFET device of the present disclosure may have a reduced current leakage and an increased breakdown voltage during the reverse blocking state.

In other words, the SiC MOSFET device of the present disclosure has an asymmetrical structure, and the connection regions 21 are respectively formed by connecting one of the junction field effect regions 211 and a respective one of the Schottky regions 212 between two corresponding adjacent ones of the doped areas 34. Each of the connection regions 21 serves as a common pathway for both a forward current and a reverse diode current which is conducive to reduction in size of the SiC MOSFET device. In addition, since the gate electrode 62 of each of the gate structures 69 covers only a portion of the connection region 21 (i.e., only the junction field effect region 211), capacitance of the gate electrode 62 is greatly reduced, and thus the SiC MOSFET device is beneficial for high frequency operation. Moreover, each of the junction field effect regions 211 has a reduced width compared with a width of the junction field effect region 1211 of the conventional SiC MOSFET device shown in FIG. 2. Furthermore, at the reverse blocking state, the electric field at the Schottky contact between each of the Schottky metals 70 and a respective one of the Schottky regions 212 is greatly reduced, and thus current leakage is reduced and breakdown voltage is increased.

Figure 12:
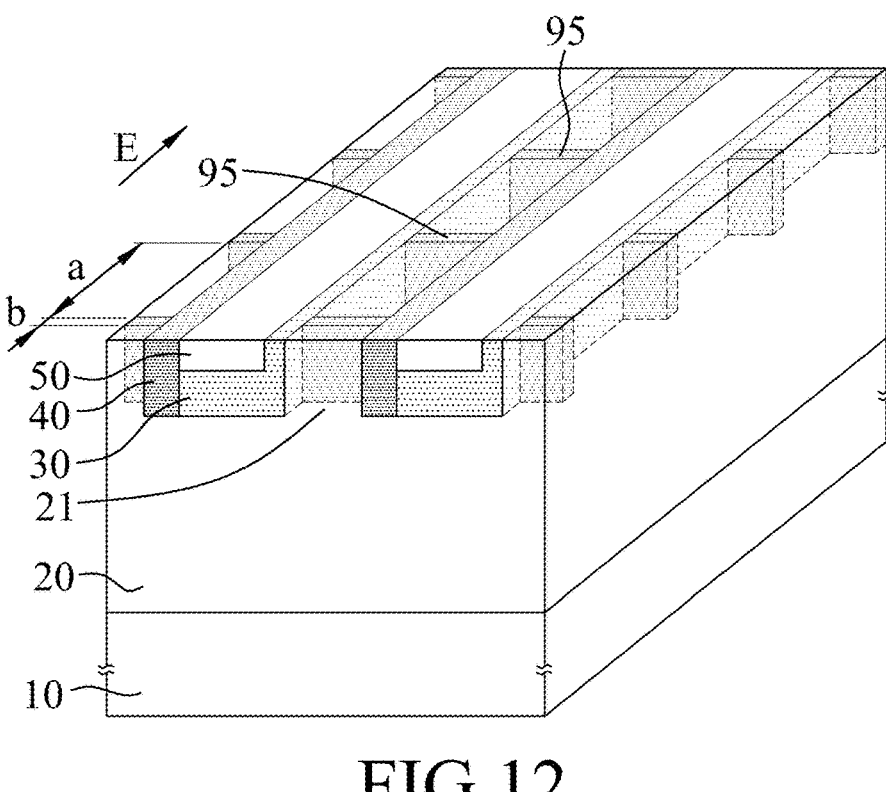
Figure 13:
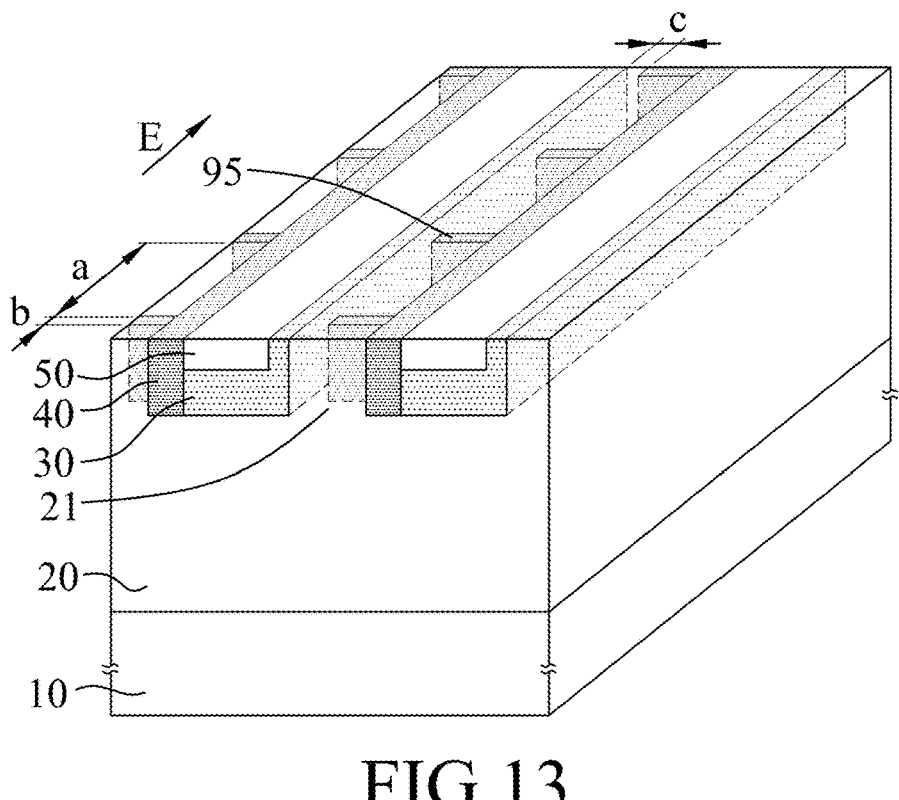

Referring to FIGS. 9, 12 and 13, in order to further reduce the current leakage resulting from Schottky contact between each of the Schottky metals 70 and the respective one of the Schottky regions 212 at the reverse blocking state, in some embodiments, the SiC MOSFET device further includes a plurality of implanting structures that have the second conductivity and that are respectively disposed in the connection regions 21. That is, each of the connection regions 21 corresponds to one of the implanting structures. Each of the implanting structures includes a plurality of implanting regions 95 that are spaced apart from each other along the elongating direction (E). Each of the implanting regions 95 has the second type of conductivity.

By including the implanting regions 95, when the SiC MOSFET device is at the reverse blocking state, the junction field effect regions 211 are depleted along the arranging direction of any two adjacent ones of the doped areas 34, and the electric field at the Schottky contact between the Schottky metal 70 and the Schottky region 212 may have a reduced peak value, thereby achieving further reduction in current leakage of the SiC MOSFET device.

Exemplarily, the first type of conductivity is n-type conductivity, and the second type of conductivity is p-type conductivity, and the implanting regions may be formed by doping of p-type ions, or p⁺-type ions. When the implanting regions 95 are doped with p-type ions or p⁺-type ions, the implanting regions 95 may be independently formed, or may be formed simultaneously with the p-type well regions 30 or the p⁺-type well contact structures 40.

Referring to FIGS. 12 and 13, in some embodiments, in each of the implanting structures, the implanting regions 95 are equally spaced apart from each other along the elongating direction (E) of the well regions 30 by a distance (a). The distance (a) may range from 1.0 μm to 100.0 μm, such as 1.0 μm, 5 μm, 10 μm, 30 μm, 50 μm, 80 μm, 100 μm, etc.

In some embodiments, a width (b) of each of the implanting regions 95 along the elongating direction (E) is smaller than a width of each of the well regions 30 along the elongating direction (E). Exemplarily, the width (b) of each of the implanting regions 95 along the elongating direction (E) may range from 0.2 μm to 20 μm, such as, 0.2 μm, 0.5 μm, 2 μm, 3 μm, 5 μm, 10 μm, 16 μm, 20 μm, etc.

In some embodiments, the implanting regions 95 extend along the direction from the epitaxial layer 20 toward the substrate 10. Each of the implanting regions 95 has a width which is measured along the arranging direction of the doped areas 34, and which is identical to a width of a corresponding one of the connection regions 21 measured along the arranging direction of the doped areas 34. In other embodiments, each of the implanting regions 95 has the width which is measured along the arranging direction of the doped areas 34, and which is smaller than the width of a corresponding one of the connection regions 21 measured along the arranging direction of the doped areas 34.

In some embodiments, each of the implanting regions 95 has one end connected to the well contact structure 40 of a corresponding one of the doped areas 34, and an opposite end which is opposite to the well contact structure 40 of the corresponding one of the doped areas 34. As shown in FIGS. 9 and 13, the opposite end is spaced apart from the well region 30 of a corresponding one of the doped areas 34 by a distance (c) that is smaller than a width of a corresponding one of the junction field effect regions 211 measured along the arranging direction of the doped areas 34.

In some embodiments, each of the Schottky metals 70 described above independently includes at least one of Ti, Mo, Ni, Pt, and TiW.

Figure 14A:
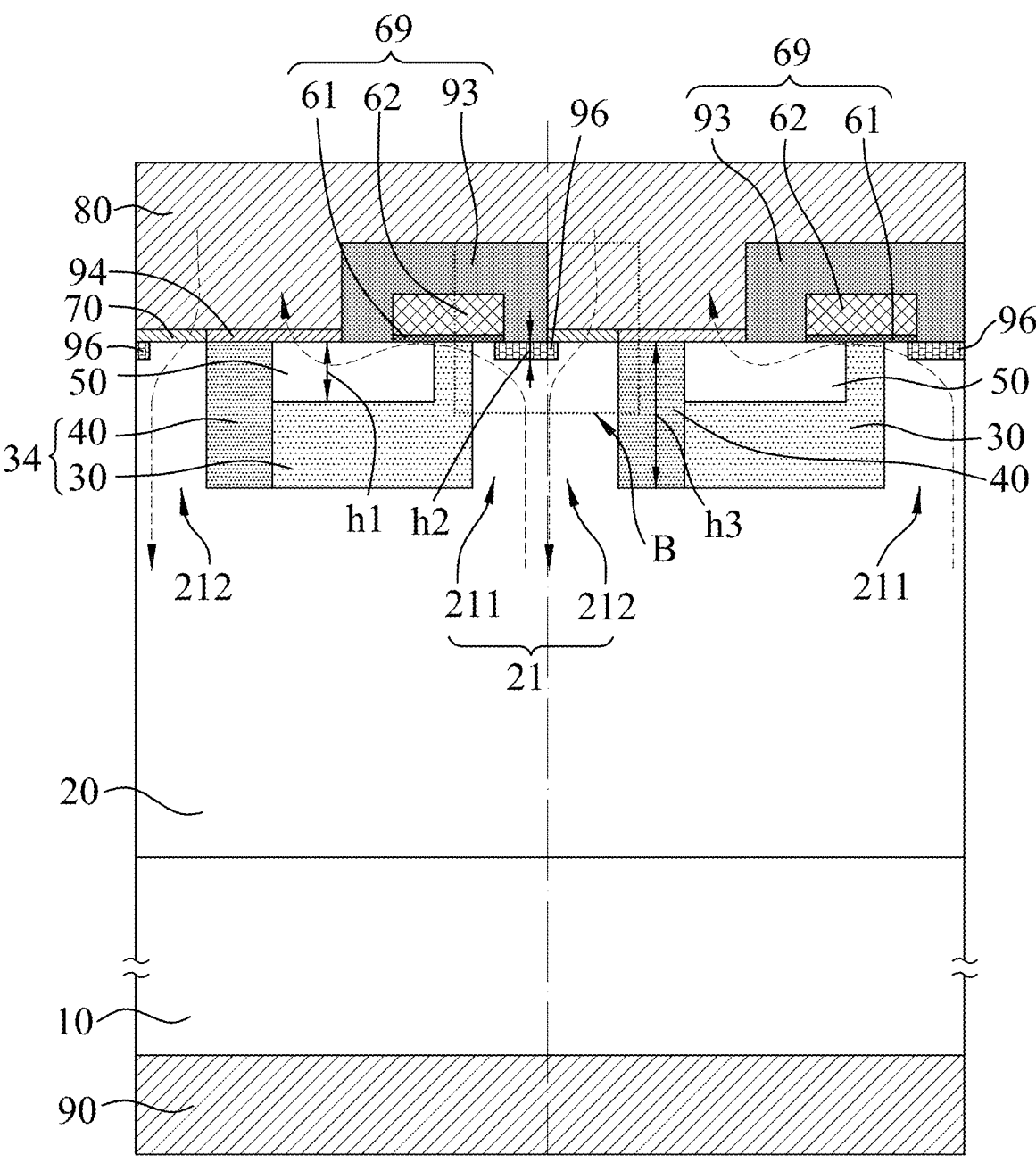
FIG. 14A is a fragmentary schematic view illustrating a SiC MOSFET device in accordance with some embodiments of the present disclosure.
Figure 14B:
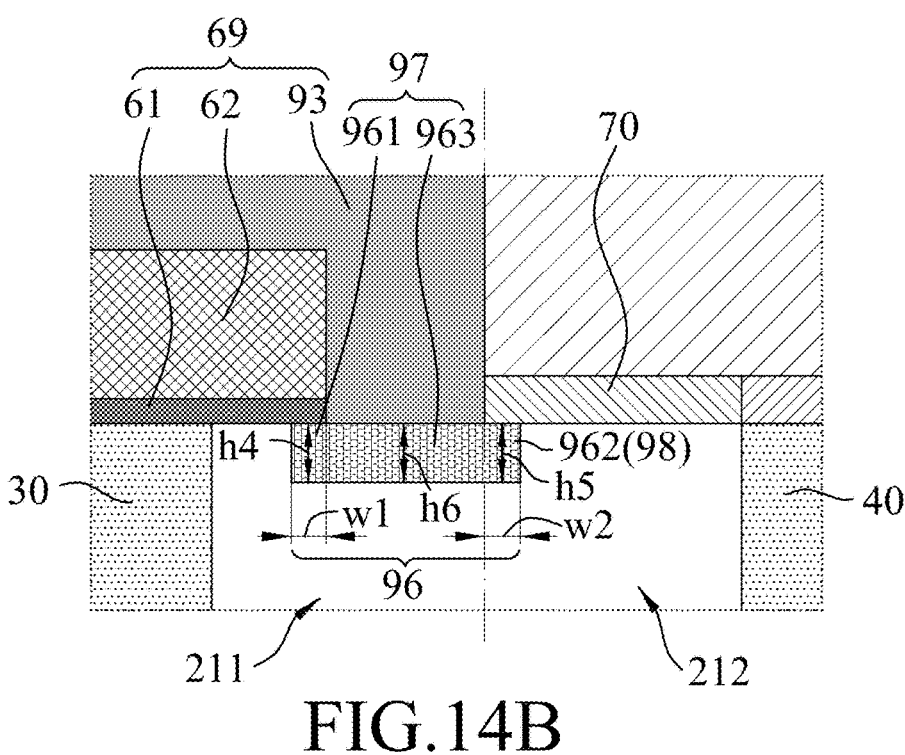
FIG. 14B is an enlarged view of region B labeled in FIG. 14A.
Figure 14C:
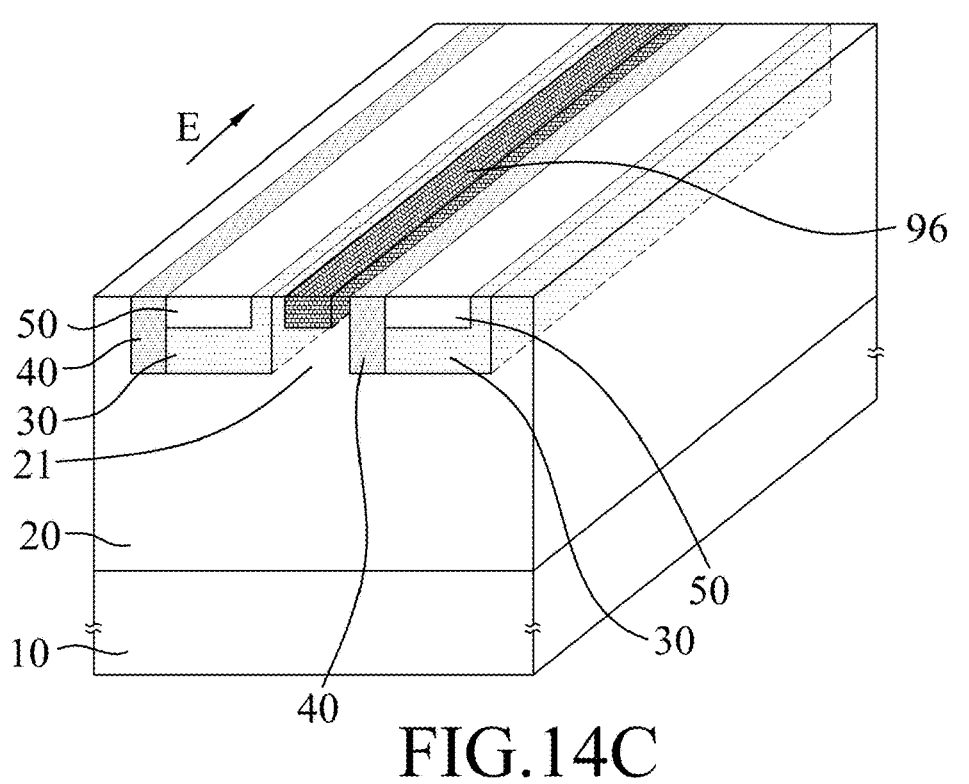
FIG. 14C is a fragmentary perspective view of the SiC MOSFET device shown in FIG. 14A.

FIGS. 14A to 14C illustrate a SiC MOSFET device integrated with a Schottky diode in accordance with some embodiments of the present disclosure. The SiC MOSFET device is similar to that shown in FIGS. 9 and 10 except that in FIGS. 14A to 14C, the SiC MOSFET device further includes a plurality of implantation sections 96 that extend along the elongating direction (E), and that are respectively spaced apart from the well region 30 and/or the well contact structure 40 of adjacent ones of the doped areas 34. Each of the implantation section 96 has the second type of conductivity, and has a first implantation portion 97 and a second implantation portion 98. The first implantation portion 97 is disposed in the epitaxy layer 20 and located beneath an edge of the gate electrode 62 of a left adjacent gate structure 69 distal from a left adjacent well region 30, and extends away from the left adjacent well region 30. The second implantation portion 98 is disposed in the epitaxy layer 20, and is connected to an edge of a right adjacent Schottky metal 70 distal from a right adjacent well contact structure 40.

The implantation sections 96 each has a type of conductivity different from that of the epitaxy layer 20, each has the first implantation portion 97 connected to the edge of the left adjacent gate electrode 62 through the left adjacent gate oxide layer 61, and each has the second implantation portion 98 connected to the edge of the right adjacent Schottky metal 70. As such, when the SiC MOSFET device is in operation, charge depletion zones are generated between each of the implantation sections 96 and the epitaxy layer 20. Such charge depletion zones provide screening of electric field and protection to edges of the junction field effect regions 211 and edges of the Schottky regions 212, and alleviate concentration of electric fields at edges of the Schottky metals 70 when the SiC MOSFET device is applied with the reverse voltage. In addition, a peak electric field strength at the edge of the Schottky metals 70 is significantly reduced, the problem of increased current leakage due to the high electric field and a reduced Schottky barrier is eased, the breakdown voltage of the SiC MOSFET device is increased, and the reliability of the gate electrodes 62 (or more specifically the gate oxide layer 61) is improved, to avoid early malfunction of the SiC MOSFET device.

In some embodiments, the source regions 50 may each have a thickness (h1) of approximately 0.4 µm. The implantation sections 96 each extends along the direction from the epitaxial layer 20 toward the substrate 10. The implantation sections 96 may be shallow implantation sections, with a thickness (h2) ranging from 0.05 µm to less than 0.4 µm. In some embodiments, the thickness (h2) of the implantation section 96 may be 0.05 µm, 0.1 µm, 0.2 µm, but are not limited thereto, as long as being smaller than the thickness (h1) of the source regions 50.

If the thickness (h2) of the implantation sections 96 is too large, such as same as the thickness (h1) of the source regions 50, or a thickness (h3) of the well contact structures 40, though the problem of the concentration of electric fields is eased, at the same time the charge depletion zones at the junction field effect regions 211 not covered by the gate electrodes 62 (that is the first implantation portions 97 of the implantation sections 96 not covered by the gate electrodes 62) are enlarged. Such enlargement results in a reduced electrical conducting pathways in the junction field effect regions 211, thus an increased forward electrical resistance of the junction field effect regions 211 and an increased reverse electrical resistance of the Schottky regions 212.

With the configuration that the thickness (h2) of the implantation sections 96 being smaller than the thickness (h1) of the source regions 50, the problem of concentration of electric fields around edges of the gate electrodes 62 and edges of the Schottky metals 70 is eased, without causing the problem of the increased forward electrical resistance of the junction field effect regions 211 and the increased reverse electrical resistance of the Schottky regions 212.

The first implantation portion 97 of each of the implantation sections 96 includes a first overlap region 961 and a third overlap region 963 that is disposed outward of the first overlap region 961. A projection of the first overlap region 961 on the substrate 10 overlaps with a projection of a corresponding one of the gate electrodes 62 on the substrate 10. The second implantation portion 98 of each of the implantation sections 96 includes a second overlap region 962. A projection of the second overlap region 962 on the substrate 10 overlaps with a projection of a corresponding one of the Schottky metals 70 on the substrate 10. A width (w1) of the first overlap region 961 measured along the arranging direction is smaller than a width (w2) of the second overlap region 962 measured along the arranging direction.

Specifically, for each of the implantation sections 96, an edge of the first implantation portion 97 is located below an edge of a corresponding gate electrode 62, and is connected thereto through a corresponding gate oxide layer 61. The second implantation portion 98 is located below an edge of a corresponding Schottky metal 70, and is connected thereto. The first overlap region 961 is a part of the first implantation portion 97 that is connected to the edge of the corresponding gate electrode 62 through the corresponding gate oxide layer 61. The second overlap region 962 is a part of the second implantation portion 98 that is connected to the corresponding Schottky metal 70. When the SiC MOSFET device is in operation, concentration of electric fields at the edges of the Schottky metals 70 is more apparent. Therefore, a configuration in which the width (w2) of the second overlap regions 962 of the implantation sections 96 is greater than the width (w1) of the first overlap regions 961 of the implantation sections 96 favours reduction in peak electric field strength at the edges of the Schottky metals 70, thereby alleviating the problem of current leakage and enhancing the breakdown voltage of the SiC MOSFET device.

In order to alleviate the concentration of electric fields around the edge of the gate electrodes 62 when the reverse voltage is applied to the SiC MOSFET device, the width (w1) of the first overlap region 961 may be configured as 0 µm to 0.5 µm. In some embodiments, the width (w1) of the first overlap region 961 may be 0 µm, 0.3 µm, or 0.5 µm, but is not limited thereto.

In order to reduce peak electric field strength at the edge of the Schottky metals 70, to alleviate the problem of increased current leakage and to increase the breakdown voltage of the SiC MOSFET device, the width (w2) of the second overlap region 962 may be configured as 0.05 μm to 0.5 μm. In some embodiments, the width (w2) of the second overlap region 962 may be 0.05 μm, μm, 0.35 μm, or 0.5 μm, but is not limited thereto.

Both the edge of each of the gate electrodes 62 and the edge of the corresponding Schottky metal 70 are configured to locate above the corresponding implantation section 96. Such configuration ensures that when the SiC MOSFET device is applied with the reverse voltage, the charge depletion zones each generated between the respective implantation section 96 and the epitaxy layer 20 provides screening of electric field and protection to the edge of the corresponding gate electrode 62 and the edge of the corresponding Schottky metal 70, reduce the concentration of electric fields at the edge of the corresponding gate electrode 62 and the edge of the corresponding Schottky metal 70, alleviate reverse current leakage of the SiC MOSFET device, increase the reverse breakdown voltage, as well as improve the reliability of the corresponding gate electrode 62.

In some embodiments, for each of the implantation sections 96, along the direction from the epitaxy layer 20 toward the substrate 10, a thickness (h4) of the first overlap region 961, a thickness (h5) of the second overlap region 962, and a thickness (h6) of the third overlap region 963 are the same, and range from 0.05 μm to less than 0.4 μm.

In some embodiments, for each of the implantation sections 96, the third overlap region 963 is located below a corresponding interlayer dielectric 93. When the SIC MOSFET device is applied with the reverse voltage, the third overlap region 963 has a concentration of electric fields comparatively less than that of the first overlap region 961 and the second overlap region 962. In such case, in some embodiments, the thickness (h4) of the first overlap region 961 and the thickness (h5) of the second overlap region 962 may be the same and may be greater than the thickness (h6) of the third overlap region 963. Please note that the thicknesses (h4, h5, h6) of the first, second and third overlap regions 961, 962, 963 range from μm to less than 0.4 μm.

In other embodiments, for each of the implantation sections 96, when the SiC MOSFET device is applied with the reverse voltage, the second overlap region 962 endures the greatest concentration of electric fields, the first overlap region 961 endures less of the concentration of electric fields, and the third overlap region 963 endures the least of the concentration of electric fields. In such case, the thickness (h5) of the second overlap region 962 may be greater than the thickness (h4) of the first overlap region 961, and the thickness (h4) of the first overlap region 961 may be greater than the thickness (h6) of the third overlap region 963. Please note that the thicknesses (h4, h5, h6) of the first, second and third overlap regions 961, 962, 963 range from 0.05 μm to less than 0.4 μm.

In some embodiments, the well regions 30 of the doped areas 34 are lightly doped well regions (p-type well areas). The implantation sections 96 are heavily doped implantation sections. The implantation sections 96 are each in an elongated shape. Specifically, considering that the well regions 30 and the well contact structures 40 of the doped areas 34 are each in an elongated shape and are each disposed in the epitaxial layer 20 parallel to each other, the implantation sections 96 in the connection regions 21 are also elongated to extend along the elongating direction (E).

In the SiC MOSFET device of the present disclosure, the shallow heavily doped p-type implantation sections 96 are each configured below the edge of the corresponding gate electrode and the edge of the corresponding Schottky metal 70, so as to generate charge depletion zones, each of which is disposed between the respective implantation section 96 and the lightly doped n-type epitaxy layer 20. When the SiC MOSFET device is applied with the reverse voltage, electric field lines directed from the drain electrode 90 terminate at the implantation sections 96. Amount of the electric field lines terminated at the edges of the gate electrodes 62 and at the edges of the Schottky metals 70 are significantly reduced, resulting in a significantly reduced electric field strength at the edges of the gate electrodes 62 and at the edges of the Schottky metals 70, a reduced reverse current leakage of the SiC MOSFET device, and also an increased breakdown voltage.

Figure 15:
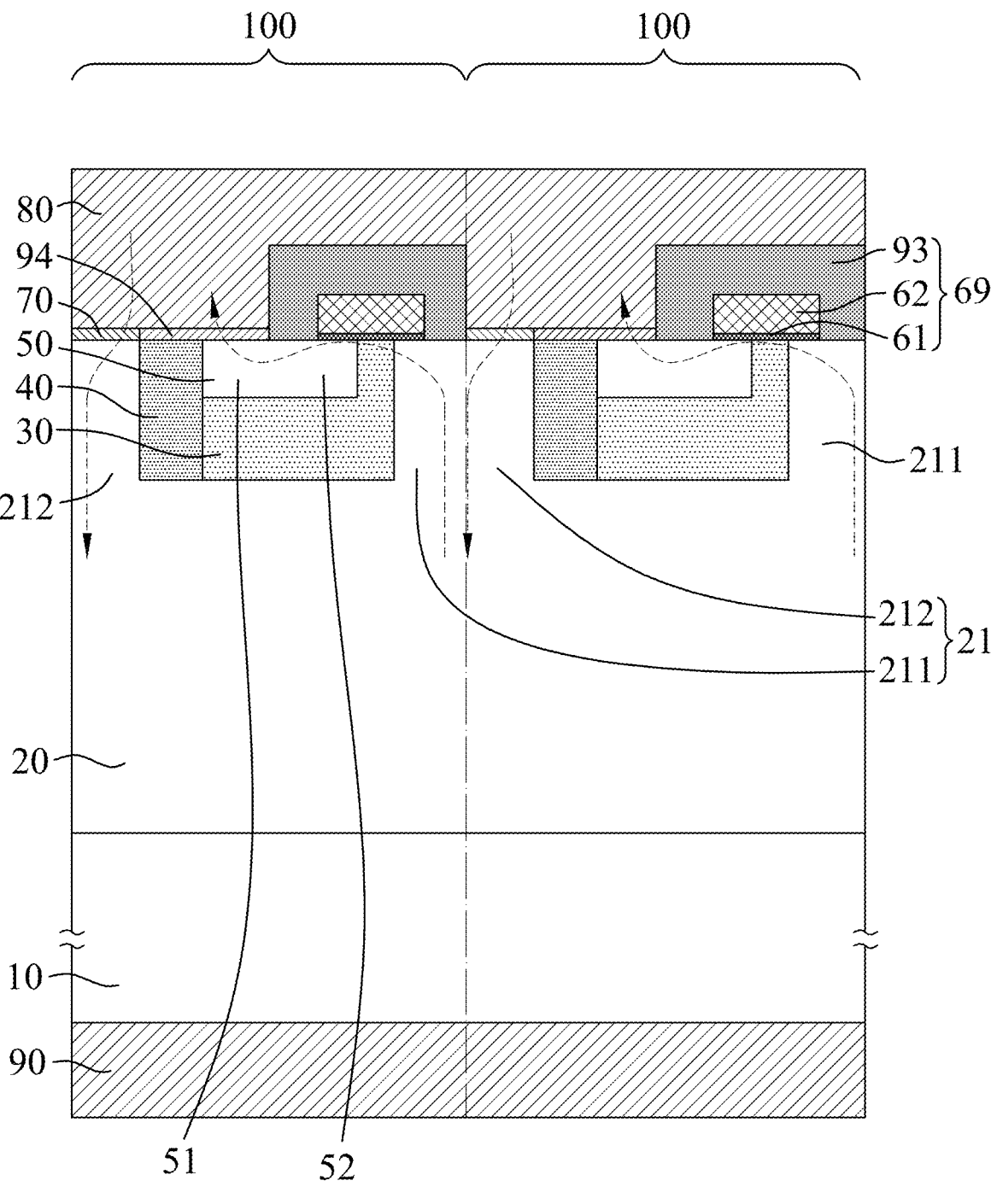
FIG. 15 is a fragmentary schematic view illustrating yet another SiC MOSFET device in accordance with some embodiments of the present disclosure.

In a third aspect of the present disclosure, referring to FIG. 15, the SIC MOSFET device includes a plurality of cell units 100. Each of the cell units 100 includes an epitaxy layer 20, a substrate 10, a Schottky region 212, a junction field effect region 211, a well region 30, a well contact structure 40, a source region 50, a Schottky metal 70, an ohmic contact metal 94, and a gate structure 69.

The epitaxy layer 20 has an upper surface and a lower surface opposite to the upper surface.

The substrate 10 is disposed on the lower surface of the epitaxy layer 20, and has a first type of conductivity.

The Schottky region 212 and the junction field effect region 211 are spaced apart from each other, extend from the upper surface to an interior of the epitaxy layer 20, and have the first type of conductivity.

The well region 30 is connected to the junction field effect region 211, extends from the upper surface to the interior of the epitaxy layer 20, and has a second type of conductivity.

The well contact structure 40 is disposed on a side of the well region 30 opposite to the junction field effect region 211, is connected to the Schottky region 212, and extends from the upper surface to the interior of the epitaxy layer 20. The well contact structure 40 has the second type of conductivity.

The source region 50 is disposed in the well region 30, is connected to the well contact structure 40, and extends from the upper surface to an interior of the well region 30. The source region 50 has the first type of conductivity. The source region 50 has a first portion 51 connected to the well contact structure 40, and a second portion 52 distal from the well contact structure 40.

The Schottky metal 70 is disposed on the Schottky region 212. The Schottky metal 70 and the Schottky region 212 together form a Schottky diode in each of the cell units 100.

The ohmic contact metal 94 is disposed on the well contact structure 40 and the first portion 51 of the source region 50.

The gate structure 69 is disposed on the junction field effect region 211, and extends to cover the second portion 52 of the source region 50. The gate structure 69 includes a gate oxide layer 61, a gate electrode 62, and an interlayer dielectric 93. The gate oxide layer 61 is disposed on a part of the junction field effect region 211 and extends to cover a part of the second portion 52 of the source region 50. The gate electrode 62 is disposed on the gate oxide layer 61. The interlayer dielectric 93 is disposed to cover the gate oxide layer 61 and the gate electrode 62.

The SiC MOSFET device of the present disclosure has a plurality of connection regions 21 each of which is formed to connect two corresponding adjacent ones of the cell units 100. Each of the connection regions 21 is formed by connecting the junction field effect region 211 of one of the cell units 100 to the Schottky region 212 of an adjacent one of the cell units 100 (i.e., each of the connection regions 21 includes the junction field effect region 211 of one of the cell units 100 and the Schottky region 212 of the adjacent one of the cell units 100). For each of the connection regions 21, the junction field effect region 211 is connected to the respective well region 30, and the Schottky region 212 is connected to the respective well contact structure 40. With such configuration, both a forward current and a reverse diode current pass through the connection regions 21, i.e., the connection regions 21 serve as common pathways for the forward current and the reverse diode current, which is conducive to reduction in size of each of the cell units 100, and thus, reduces the size of the SiC MOSFET device.

In certain embodiments, for each of the cell units 100, the well region 30 is in an elongated shape. In other embodiments, for each of the cell units 100, the well contact structure 40 is also in an elongated shape. The well region and the well contact structure 40 may be arranged parallel to each other, and may both elongate along an elongating direction (E).

Referring to FIG. 15, in combination with FIG. 11, the well contact structure 40 includes a plurality of well contact regions 400 that are spaced apart from each other along the elongating direction (E). Two adjacent ones of the well contact regions 400 are spaced apart from each other by an interval region (y). The interval region (y) may be doped with ions having a conductivity type the same as that of the epitaxy layer 20. The interval region (y) may have a doping concentration the same as, or different from that of the epitaxy layer 20.

In some embodiments, the first type of conductivity is n-type conductivity, and the second type of conductivity is p-type conductivity. In other embodiments, the first type of conductivity is p-type conductivity, and the second type of conductivity is n-type conductivity.

In some embodiments, referring to FIG. 15, the epitaxy layer 20 is lightly doped. The source region 50 and the well contact structure 40 are heavily doped.

Exemplarily, in certain embodiments, the first type of conductivity is n-type conductivity, and the second type of conductivity is p-type conductivity. In the SiC MOSFET device, in each of the cell units 100, the n-type epitaxy layer 20 is formed with the p-type well region 30, the n$^+$-type source region 50 located within the p-type well region 30, and the p$^+$-type well contact structure 40 located on a side of the p-type well region 30. The n$^+$-type source region 50 and the p$^+$-type well contact structure 40 are located at an upper portion of the n-type epitaxy layer 20. An upper surface of each of the n$^+$-type source region 50 and the p$^+$-type well contact structure 40 is exposed from the n-type epitaxy layer 20. Both the n$^+$-type source region 50 and the p-type well region 30 are connected to and are located at the same side of the p$^+$-type well contact structure 40. It is to be understood that, any two adjacent ones of the cell units 100 are asymmetrical to each other. The n-type source region 50, the p$^+$-type well contact structure 40, and the p-type well region 30 of each of the cell units 100 have the same configuration. As exemplified by the SiC MOSFET device shown in FIG. 15, for each of the cell units 100, the n-type source region 50 is located at the right side of the p$^+$-type well contact structure 40, and is located at an upper left position relative to the p-type well region 30.

Referring to FIG. 15, for each of the cell units 100, a projection of the gate oxide layer 61 on the epitaxy layer 20 is located on an upper surface of the well region 30, the part of the second portion 52 of the source region 50, and the part of the junction field effect region 211. The Schottky metal 70 is located on the epitaxy layer 20 and is connected to the gate structure 69 of an adjacent one of the cell units 100. Both the forward current and the reverse current pass through the connection region 21. Comparing the two SiC MOSFET devices shown in FIGS. 2 and 15, a first section of one of gate oxide layers 1611 and a second section of a corresponding one of gate electrodes 1622, which are located on a third section of a corresponding one of junction field effect regions 1211 as shown in FIG. 2, are replaced by the Schottky metal 70 of a corresponding one of the cell units 100 (see FIG. 15), and the third section of the corresponding junction field effect region 1211 (see FIG. 2) becomes the Schottky region 212 of the corresponding cell unit 100 (see FIG. 15). As such, in comparison with the conventional SiC MOSFET device shown in FIG. 2, in each of the cell units 100 of the SiC MOSFET device of the present disclosure shown in FIG. 15, a surface area of the junction field effect region 211 covered by the gate electrode 62 of the gate structure 69 is relatively smaller, which greatly reduces capacitance of the gate electrode 62 for each of the cell units 100, and the SiC MOSFET device is thus beneficial for high frequency operation. In addition, considering that the connection region 21 has a reduced width, and the Schottky region 212 is close to the well contact structure 40, during a reverse blocking state, an electric field at the Schottky contact between the Schottky metal 70 and the Schottky region 212 is greatly reduced. As such, the SiC MOSFET device of the present disclosure may have a reduced current leakage and an increased breakdown voltage during the reverse blocking state.

In other words, the SiC MOSFET device of the present disclosure has an asymmetrical structure, and two adjacent ones of the cell units 100 are connected to each other through the connection region 21, which serves as a common pathway for both a forward current and a reverse diode current, which is conducive to reduction in size of the cell units 100, and thus reduction in size of the SiC MOSFET device. In addition, since the gate electrode 62 covers only a portion of the connection region 21 (i.e., only the junction field effect region 211), capacitance of the gate electrode 62 is greatly reduced, and thus, the SiC MOSFET device is beneficial for high frequency operation. Moreover, the junction field effect region 211 has a reduced width comparing with a width of the junction field effect region 1211 of the conventional SiC MOSFET device shown in FIG. 2. Furthermore, at the reverse blocking state, the electric field at the Schottky contact between the Schottky metal 70 and the Schottky region 212 is greatly reduced, and thus, current leakage is reduced and breakdown voltage is increased.

In some embodiments, as shown in FIG. 15, the SiC MOSFET device further includes a drain electrode 90 disposed on a side of the substrate 10 away from the epitaxy layer 20.

A skilled artisan can appreciate that the SiC MOSFET device having the cell units 100 as shown in FIG. 15 and the technical effects attributed thereto have been described above with reference to FIGS. 3 to 14C, and thus the details thereof are omitted.

Figure 16A:
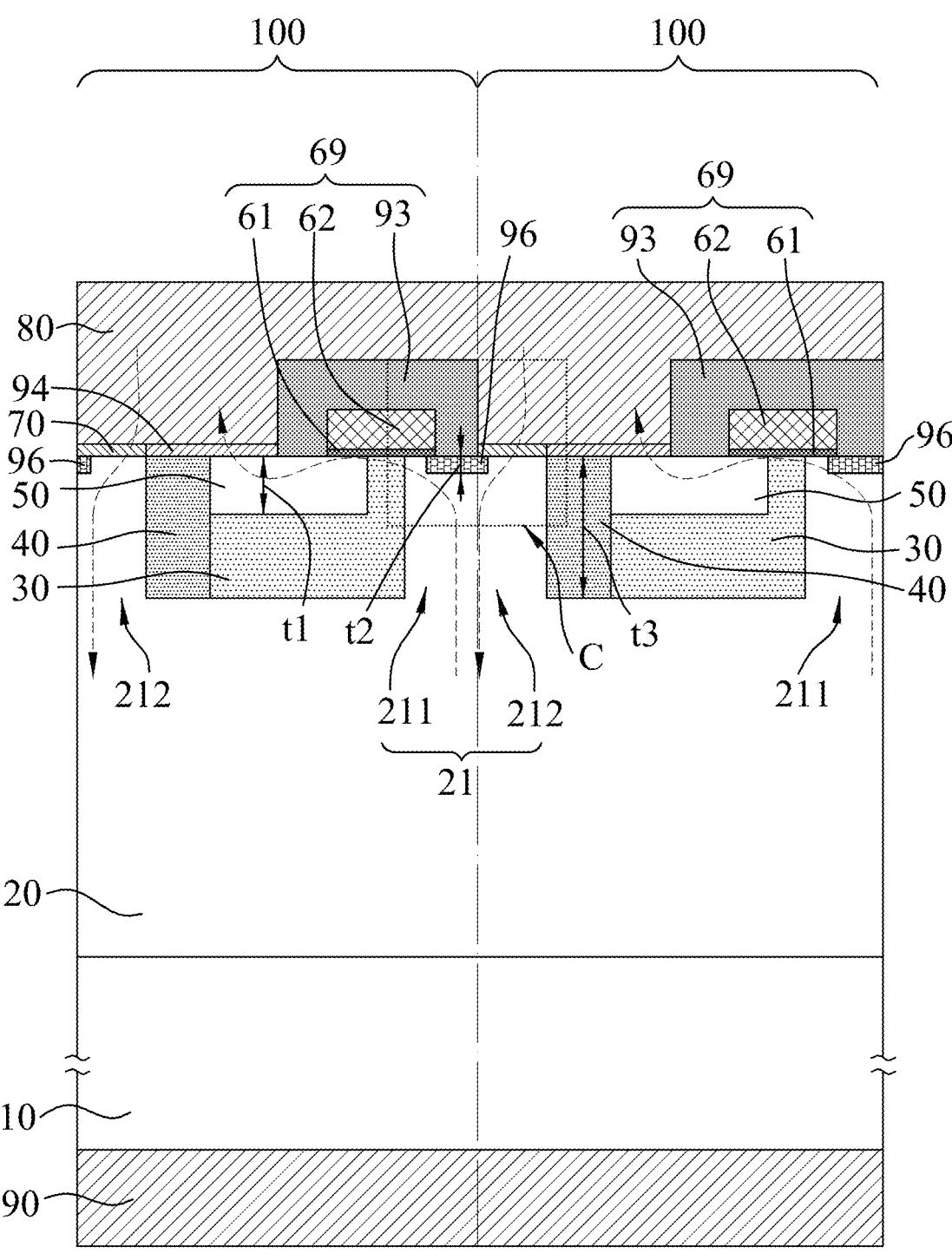
FIG. 16A is a fragmentary schematic view illustrating a SiC MOSFET device in accordance with some embodiments of the present disclosure.
Figure 16B:
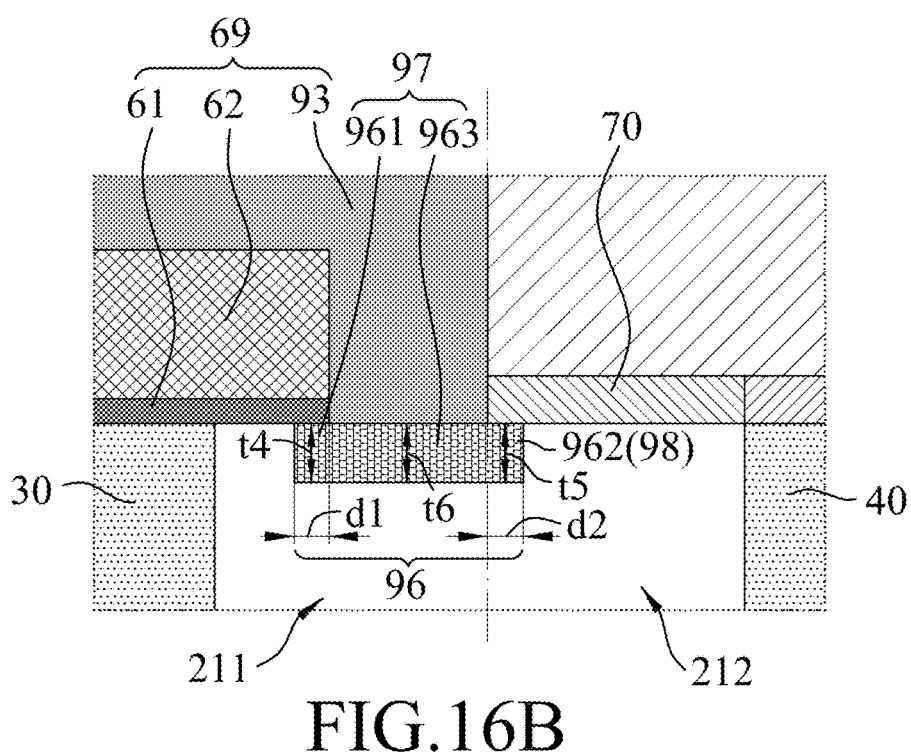
FIG. 16B is an enlarged view of region C labeled in FIG. 16A.
Figure 16C:
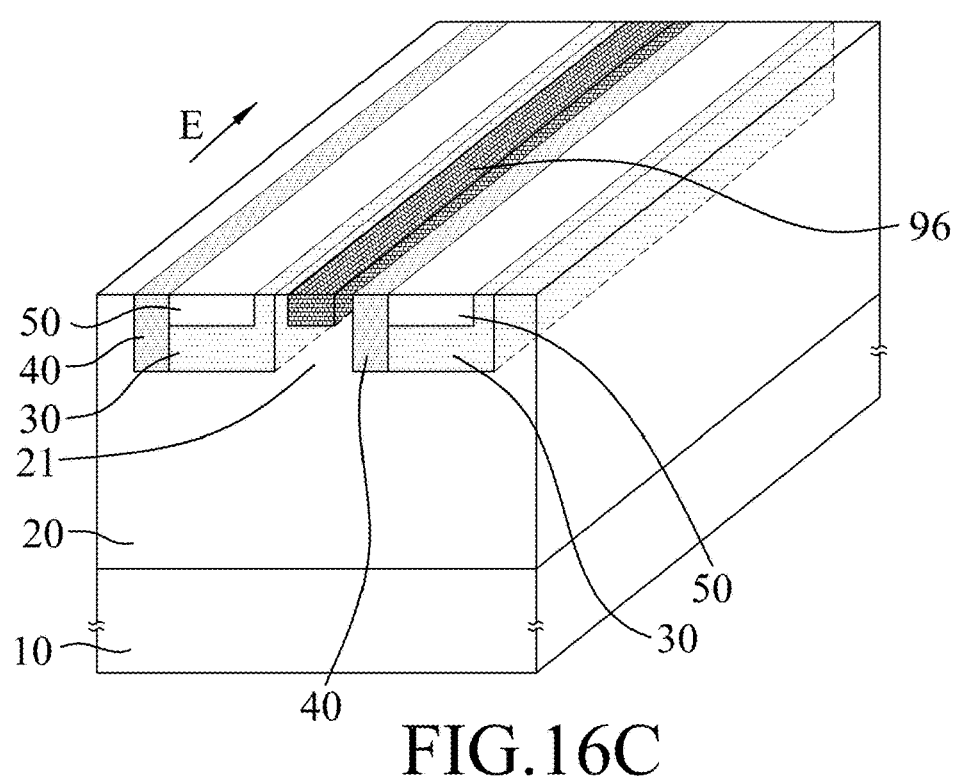
FIG. 16C is a fragmentary perspective view of the SiC MOSFET device shown in FIG. 16A.

FIGS. 16A to 16C illustrate a SiC MOSFET device integrated with a Schottky diode in accordance with some embodiments of the present disclosure. The SiC MOSFET device is similar to that shown in FIG. 15 except that in FIGS. 16A to 16C, each of the cell units 100 further includes one implantation section 96 that extends along the elongating direction (E). The implantation section 96 is disposed between the well region 30 of each cell unit 100 and the well contact structure 40 of an adjacent cell unit 100. The implantation section 96 has the second type of conductivity, and includes a first implantation portion 97 and a second implantation portion 98. The first implantation portion 97 is disposed in the epitaxy layer 20 and located beneath an edge of the gate electrode 62 distal from the well region 30, and extends away from the well region 30. The second implantation portion 98 is disposed in the epitaxy layer 20, and is connected to an edge of the Schottky metal 70 of the adjacent cell unit 100 distal from the well contact structure 40 of the adjacent cell unit 100.

The implantation section 96 is disposed in the connection region 21 and has a type of conductivity different from that of the epitaxy layer 20. The first implantation portion 97 is connected to the edge of the gate electrode 62 through the gate oxide layer 61. The second implantation portion 98 is connected to the edge of the Schottky metal 70 of the adjacent cell unit 100. As such, when the SiC MOSFET device is in operation, charge depletion zone is generated between the implantation section 96 and the epitaxy layer 20. Such charge depletion zone provides screening of electric field and protection to an edge of the junction field effect region 211 and an edge of the Schottky region 212, and alleviates concentration of electric fields at the edge of the Schottky metal 70 of the adjacent cell unit 100 when the SiC MOSFET device is applied with the reverse voltage. In addition, a peak electric field strength at the edge of the Schottky metal 70 of the adjacent cell unit 100 is significantly reduced, the problem of increased current leakage due to the high electric field and a reduced Schottky barrier is eased, the breakdown voltage of the SiC MOSFET device is increased, and the reliability of the gate electrode 62 (or more specifically the gate oxide layer 61) is improved, to avoid early malfunction of the SiC MOSFET device.

In some embodiments, the source region 50 may have a thickness (t1) of approximately 0.4 μm. The implantation section 96 extends along the direction from the epitaxial layer 20 toward the substrate 10. The implantation section 96 may be a shallow implantation section, with a thickness (t2) ranging from 0.05 μm to less than 0.4 μm. In some embodiments, the thickness (t2) of the implantation section 96 may be 0.05 μm, 0.1 μm, 0.2 μm, but are not limited thereto, as long as being smaller than the thickness (t1) of the source region 50.

If the thickness (t2) of the implantation section 96 is too large, such as same as the thickness (t1) of the source region 50, or a thickness (t3) of the well contact structures 40, though the problem of the concentration of electric fields is eased, at the same time the charge depletion zone at the junction field effect region 211 not covered by the gate electrode 62 (that is the first implantation portion 97 not covered by the gate electrode 62) are enlarged. Such enlargement results in a reduced electrical conducting pathways in the junction field effect region 211, thus an increased forward electrical resistance of the junction field effect region 211 of each cell unit 100 and an increased reverse electrical resistance of the Schottky region 212 of the adjacent cell unit 100.

With the configuration that the thickness (t2) of the implantation section 96 being smaller than the thickness (t1) of the source region 50, the problem of concentration of electric fields around the edge of the gate electrode 62 of each cell unit 100 and the edge of the Schottky metal 70 of the adjacent cell unit 100 is eased, without causing the problem of the increased forward electrical resistance of the junction field effect region 211 of each cell unit 100 and the increased reverse electrical resistance of the Schottky region 212 of the adjacent cell unit 100.

The first implantation portion 97 includes a first overlap region 961 and a third overlap region 963 that is disposed outward of the first overlap region 961. A projection of the first overlap region 961 on the substrate 10 overlaps with a projection of the gate electrode 62 on the substrate 10. The second implantation portion 98 includes a second overlap region 962. A projection of the second overlap region 962 on the substrate 10 overlaps with a projection of the Schottky metal 70 of the adjacent cell unit 100 on the substrate 10. A width (d1) of the first overlap region 961 measured along the arranging direction is smaller than a width (d2) of the second overlap region 962 measured along the arranging direction.

Specifically, an edge of the first implantation portion 97 is located below the edge of the gate electrode 62, and is connected thereto through the gate oxide layer 61. The second implantation portion 98 is located below the edge of the Schottky metal 70 of the adjacent cell unit 100, and is connected thereto. The first overlap region 961 is a part of the first implantation portion 97 that is connected to the edge of the gate electrode 62 through the gate oxide layer 61. The second overlap region 962 is a part of the second implantation portion 98 that is connected to the Schottky metal 70 of the adjacent cell unit 100. When the SiC MOSFET device is in operation, concentration of electric fields at the edge of the Schottky metal 70 is more apparent. Therefore, a configuration in which the width (d2) of the second overlap region 962 is greater than the width (d1) of the first overlap region 961 favours reduction in peak electric field strength at the edge of the Schottky metal 70, thereby alleviating the problem of current leakage and enhancing the breakdown voltage of the SiC MOSFET device.

In order to alleviate the concentration of electric fields around the edge of the gate electrode 62 when the reverse voltage is applied to the SiC MOSFET device, the width (d1) of the first overlap region 961 may be configured as 0 μm to 0.5 μm. In some embodiments, the width (d1) of the first overlap region 961 may be 0 μm, 0.3 μm, or 0.5 μm, but is not limited thereto.

Exemplarily, in order to reduce peak electric field strength at the edge of the Schottky metal 70, to alleviate the problem of increased current leakage and to increase the breakdown voltage of the SiC MOSFET device, the width (d2) of the second overlap region 962 may be configured as 0.05 μm to 0.5 μm. In some embodiments, the width (d2) of the second overlap region 962 may be 0.05 μm, μm, 0.35 μm, or 0.5 μm, but is not limited thereto.

Both the edge of the gate electrode 62 of each cell unit 100 and the edge of the Schottky metal 70 of the adjacent cell unit 100 are configured to locate above the implantation section 96. Such configuration ensures that when the SiC MOSFET device is applied with the reverse voltage, the charge depletion zone generated between the implantation section 96 and the epitaxy layer 20 provides screening of electric field and protection to the edge of the gate electrode 62 of each cell unit 100 and the edge of the Schottky metal 70 of the adjacent cell unit 100, reduces the concentration of electric fields at the edge of the gate electrode 62 of each cell unit 100 and the edge of the Schottky metal 70 of the adjacent cell unit 100, alleviates reverse current leakage of the SiC MOSFET device, increases the reverse breakdown voltage, as well as improves the reliability of the gate electrode 62.

In some embodiments, along the direction from the epitaxy layer 20 toward the substrate 10, a thickness (t4) of the first overlap region 961, a thickness (t5) of the second overlap region 962, and a thickness (t6) of the third overlap region 963 are the same, and range from 0.05 µm to less than 0.4 µm.

In some embodiments, the third overlap region 963 is located below the interlayer dielectric 93. When the SiC MOSFET device is applied with the reverse voltage, the third overlap region 963 has a concentration of electric fields comparatively less than that of the first overlap region 961 and the second overlap region 962. In such case, in some embodiments, the thickness (t4) of the first overlap region 961 and the thickness (t5) of the second overlap region 962 may be the same and may be greater than the thickness (t6) of the third overlap region 963. Please note that the thicknesses (t4, t5, t6) of the first, second and third overlap regions 961, 962, 963 range from 0.05 µm to less than 0.4 µm.

In other embodiments, when the SiC MOSFET device is applied with the reverse voltage, the second overlap region 962 endures the greatest concentration of electric fields, the first overlap region 961 endures less of the concentration of electric fields, and the third overlap region 963 endures the least of the concentration of electric fields. In such case, the thickness (t5) of the second overlap region 962 may be greater than the thickness (t4) of the first overlap region 961, and the thickness (t4) of the first overlap region 961 may be greater than the thickness (t6) of the third overlap region 963. Please note that the thicknesses (t4, t5, t6) of the first, second and third overlap regions 961, 962, 963 range from 0.05 µm to less than 0.4 µm.

Considering that the well region 30 and the and the well contact structure 40 are each in an elongated shape and are each disposed in the epitaxial layer 20 parallel to each other, the implantation section 96 in the connection region 21 is also elongated to extend along the elongating direction (E).

It is noted that, for the plurality of cell units 100, the well regions 30 of the cell units 100 are elongated to extend along the elongating direction (E), and are parallel to each other. The well contact structures 40 of the cell units 100 are elongated to extend along the elongating direction (E), and are parallel to each other. Amount of the implantation sections 96 is the same as the amount of the cell units 100, and the implantation sections 96 each elongates along the elongating direction (E), and are parallel to each other.

In some embodiments, the well regions 30 are lightly doped well regions (p-type well areas). The implantation sections 96 are heavily doped implantation sections. The shallow heavily doped p-type implantation section 96 is configured below the edge of the gate electrode 62 of each cell unit 100 and the edge of the Schottky metal 70 of the adjacent cell unit 100, so as to generate the charge depletion zone which is disposed between the implantation section 96 and the lightly doped n-type epitaxy layer 20. When the SiC MOSFET device is applied with the reverse voltage, electric field lines directed from the drain electrode 90 terminate at the implantation section 96. Amount of the electric field lines terminated at the edge of the gate electrode 62 of each cell unit 100 and at the edge of the Schottky metal 70 of the adjacent cell unit 100 are significantly reduced, resulting in a significantly reduced electric field strength at the edge of the gate electrode 62 of each cell unit 100 and at the edge of the Schottky metal 70 of the adjacent cell unit 100, a reduced reverse current leakage of the SiC MOSFET device, and also an increased breakdown voltage.

Referring to FIGS. 17 and 9, the present embodiment further provides a method of preparing the SiC MOSFET device described with reference to FIG. 9, the method includes the following steps S10 to S18.

In step S10, the substrate 10 having the first type of conductivity is provided.

In step S11, the epitaxy layer 20 having the first type of conductivity is formed on a surface of the substrate 10.

In step S12, a plurality of the doped areas 34 having the second type of conductivity are formed in the epitaxy layer 20. The doped areas 34 are spaced apart from each other. Each of the doped areas 34 includes the well region and the well contact structure 40 that extend along a direction from the epitaxy layer 20 toward the substrate 10.

In step S13, a plurality of the junction field effect regions 211 and a plurality of the Schottky regions 212 are formed. Each of the junction field effect regions 211 and a respective one of the Schottky regions 212 are formed between two corresponding adjacent ones of the doped areas 34 and are connected to each other. The junction field effect regions 211 are respectively connected to the well regions 30 of the doped areas 34. The Schottky regions 212 are respectively connected to the well contact structures 40 of the doped areas 34.

In step S14, a plurality of the source regions 50 having the first type of conductivity are respectively formed in the doped areas 34. The source regions are respectively connected to the well contact structures 40. The source regions 50 extend along the direction from the epitaxy layer 20 toward the substrate 10.

In step S15, a plurality of the Schottky metals 70 are respectively formed on the Schottky regions 212.

In step S16, a plurality of the ohmic contact metals 94 are formed, each of which is formed on the well contact structure 40 of a respective one of the doped areas 34, and extends to cover a first portion 51 of a respective one of the source regions 50.

In step S17, a plurality of the gate structures 69 are formed, each of which is formed on a respective one of the junction field effect regions 211, and extends to cover a second portion 52 of a respective one of the source regions 50. Each of the gate structures 69 includes the gate oxide layer 61, the gate electrode 62 disposed on the gate oxide layer 61, and the interlayer dielectric 93 covering the gate oxide layer 61 and the gate electrode 62. The gate oxide layer 61 is formed on a part of the respective one of the junction field effect regions 211, and extends to cover a part of the second portion 52 of the respective one of the source regions 50.

A skilled artisan can appreciate that the SiC MOSFET device made by the aforesaid method and the technical effects attributed thereto have been described above with reference to FIGS. 9 to 13, and thus the details thereof are omitted.

Further referring to FIGS. 9, 12, 13 and 17, in some embodiments, the method further includes step S18, in which a plurality of implanting regions 95 having the second type of conductivity are formed in each of the Schottky regions 212. A width (b) of each of the implanting regions 95 along the elongating direction (E) is smaller than a width of each of the well regions 30 along the elongating direction (E). Such implanting regions 95 may further reduce current leakage due to Schottky contact between each of the Schottky regions 212 and a respective one of the Schottky metals 70 during reverse blocking state.

Referring to FIGS. 18 and 9, the present embodiment further provides another method for preparing the SiC MOSFET device shown in FIG. 9, and such method includes the following steps S110 to S200. Exemplarily, the first type of conductivity is n-type conductivity, the second type of conductivity is p-type conductivity, the epitaxy layer 20 is lightly doped, and the source regions 50 and the well contact structures 40 of the doped areas 34 are heavily doped.

In step S110, the n-type epitaxy layer 20 is formed on the substrate 10.

In step S120, an upper portion of the n-type epitaxy layer 20 is subjected to an ion implantation process, thereby forming a plurality of the p-type well regions 30. As such, the p-type well regions 30 are located in, and at the upper portion of the n-type epitaxy layer 20. That is, upper surfaces of the p-type well regions 30 are exposed from the n-type epitaxy layer 20.

In step S130, the n-type epitaxy layer 20 is subjected to different ion implantation processes so as to form, respectively, a plurality of the p⁺-type well contact structures 40 and a plurality of the n⁺-type source regions 50.

The p⁺-type well contact structures 40 and the n⁺-type source regions 50 are located on and exposed from the p-type well regions 30. Each of the p⁺-type well contact structures 40 and a respective one of the n⁺-type source regions 50 are connected to each other, and are located on a same side of a respective one of the p-type well regions 30. As shown in FIG. 10, each of the n-type source regions 50 and the respective one of the p⁺-type well contact structures 40 are located on the left side of a respective one of the p-type well regions 30. Each of the p⁺-type well contact structures 40 is located on a left side of a respective one of the n⁺-type source regions 50. Each of the n⁺-type source regions 50 is located on a right side of a respective one of the p⁺-type well contact structures 40.

In step S140, a plurality of the gate oxide layers 61 are respectively formed on the p-type well regions 30. Each of the gate oxide layers 61 covers an upper surface of a respective one of the well regions 30, an upper surface of the part of the second portion 52 of the respective one of the source regions 50 (that are respectively located in the well regions 30), and an upper surface of the part of the respective one of the junction field effect regions 211.

That is, the projection of each of the gate oxide layers 61 on the n-type epitaxy layer 20 is located on the upper surface of the respective one of the well regions 30, the upper surface of the part of the second portion 52 of the respective one of the source regions 50, and the upper surface of the part of the respective one of the junction field effect regions 211. An upper surface of a remaining part of the second portion 52 of the respective one of the source regions 50, and an upper surface of a remaining part of the respective one of the junction field effect regions 211 are exposed from the gate oxide layer 61. Each of the junction field effect regions 211 is located on a side of a respective one of the p-type well regions 30 distal from the p⁺-type well contact structure 40, and is partially covered by the projection of the gate oxide layer 61 on the n-type epitaxy layer 20.

In step S150, a plurality of the gate electrodes 62 are respectively formed on and cover merely the gate oxide layers 61. The gate electrodes 62 may be polysilicon gate electrodes formed by deposition of a polysilicon material over the n-type epitaxy layer 20 and the gate oxide layers 61, followed by an etching process to remove an excess amount of the polysilicon material, thereby forming the polysilicon gate electrodes.

Figure 19:
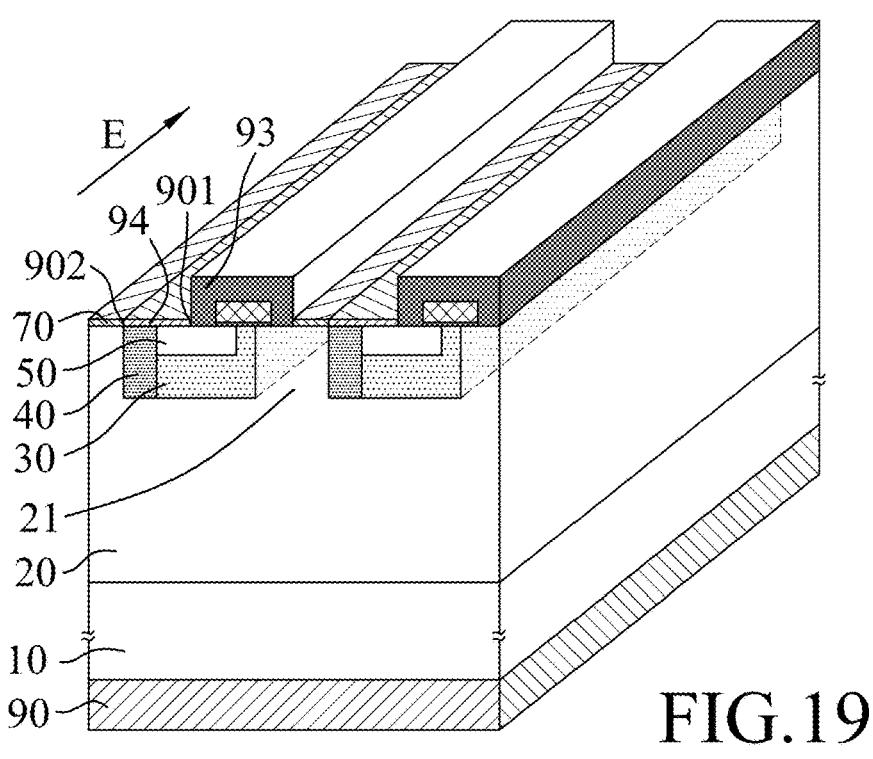
FIGS. 19 and 20 respectively illustrate intermediate stages in the another method for fabricating the SiC MOSFET device described in FIG. 18.

In step S160, referring to FIG. 19, a dielectric material (not shown, for forming a plurality of the interlayer dielectrics 93 respectively deposited on the gate electrodes 62) is deposited over the gate electrodes 62 and the n-type epitaxy layer 20. In addition, portions of the dielectric material are subjected to an etching process to form a plurality of ohmic contact openings 901. The ohmic contact openings 901 expose the p⁺-type well contact structures 40 and the first portion 51 of each of the n⁺-type source regions 50.

In step S170, a metallic material is deposited in the ohmic contact openings 901 and on a surface of the substrate 10 distal from the n-type epitaxy layer 20. The metallic material is then subjected to an annealing process, thereby obtaining the ohmic contact metals 94 in the ohmic contact openings 901, and an ohmic contact layer (not shown) on the substrate 10 distal from the n-type epitaxy layer 20. The ohmic contact layer facilitates formation of the source electrode 90 in subsequent steps.

In step S180, another portions of the dielectric material (formed in step S160) that are located on the n-type epitaxy layer 20 adjacent to the p⁺-type well contact structures 40 and distal from the n⁺-type source regions 50 are subjected to another etching process so as to form a plurality of Schottky openings 902.

In step S190, another metallic material is deposited in the Schottky openings 902, followed by another annealing process, to thereby obtaining the Schottky metals 70 that form Schottky contact. In addition, a plurality of the interlayer dielectrics 93, each of which covers a respective one of the gate oxide layers 61 and a respective one of the gate electrodes 62, are formed.

As shown in FIG. 19, the interlayer dielectrics 93 may insulate the gate electrodes 62 from the ohmic contact metals 94. In addition, the interlayer dielectrics 93 may also insulate the source electrode 80 (to be formed in subsequent steps) from the gate electrodes 62.

In step S200, a front-side metal is deposited on the Schottky metals 70 and the ohmic contact metals 94 to form the source electrode 80, and also on the ohmic contact layer (formed in step S170) opposite to the n-type epitaxy layer 20 so as to form the drain electrode 90.

Figure 20:
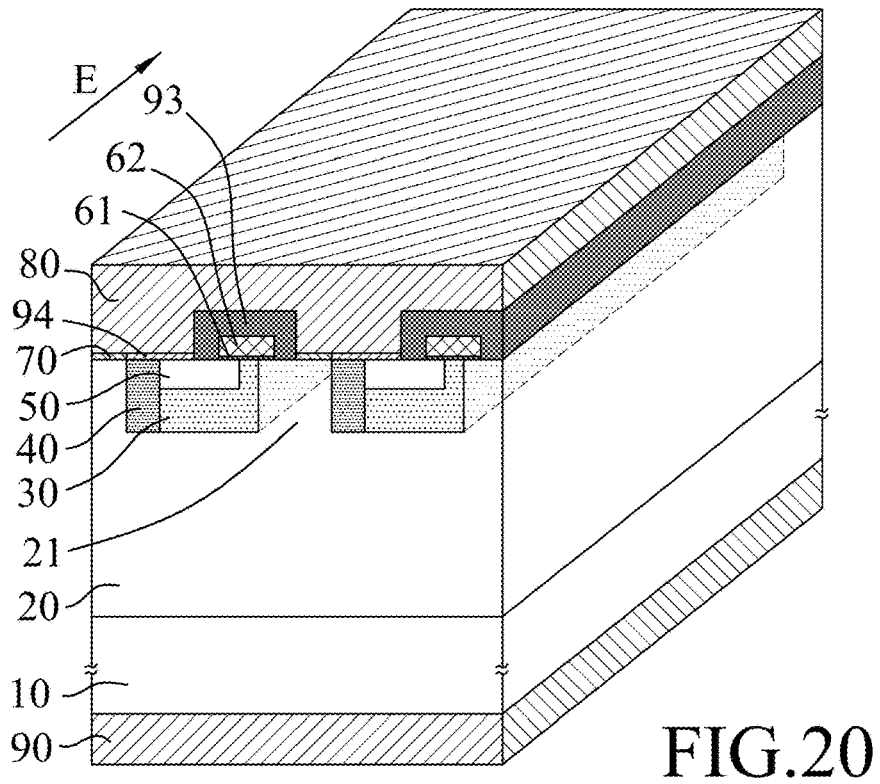

Referring to FIG. 20, the source electrode 80 is located at an upper section of the SiC MOSFET device covering the interlayer dielectrics 93, and the drain electrode 90 is located at a bottom section of the SiC MOSFET device. In some embodiments, the source electrode 80 is deposited merely on the Schottky metals 70 and the ohmic contact metals 94 (i.e., not covering the interlayer dielectrics 93).

FIG. 21A illustrates a method of preparing the SiC MOSFET device described with reference to FIGS. 14A to 14C, in which the method includes steps S1001 to S1012. Please note that steps S1001 to S1004 of the method described in FIG. 21A are similar to steps S10 to S13 of the method described with reference to FIG. 17, and details thereof are omitted for the sake of brevity.

In step S1005 of the method described in FIG. 21A, a plurality of the implantation sections 96 are each formed in one of the junction field effect regions 211 and a respective one of the Schottky regions 212 that are connected to each other. The implantation sections 96 have the second type of conductivity.

The implantation sections 96 having the second type of conductivity are formed by implanting p⁺-type ions through a first surface of the epitaxy layer 20 distal from the substrate 10. The implantation sections 96 are each located in one of the junction field effect regions 211 and the respective one of the Schottky regions 212 that are connected to each other. The implantation sections 96 are located at an upper portion of the epitaxy layer 20, and have upper surfaces of the implantation sections 96 exposed from the epitaxy layer 20.

The implantation sections 96 extend along a direction from the epitaxy layer 20 toward the substrate 10, and are formed with a thickness smaller than that of the source regions 50 (to be formed in step S1006), so as to form the shallow heavily doped p⁺-type implantation sections.

The implantation sections 96 elongate along the elongating direction (E), are configured parallel to each other.

In step S1006, a plurality of the source regions 50 having the first type of conductivity are respectively formed in the well regions 30 of the doped areas 34. The source regions 50 are respectively connected to the well contact structures 40 of the doped areas 34. The source regions 50 extend along the direction from the epitaxy layer 20 toward the substrate 10.

Specifically, the source regions 50 having the first type of conductivity are formed by implanting ions into each of the well regions 30. Each of the source regions 50 is located at the left upper corner of a respective one of the p-type well regions 30, and is connected to a respective one of the well contact structures 40. Each of the source regions 50 has an upper surface exposed from the epitaxy layer 20.

In step S1007, a plurality of gate structure elements are formed on the epitaxy layer 20 to cover the second portions 52 of the source regions 50, portions of the well regions 30 that are exposed from the first surface, the junction field effect regions 211, the Schottky regions 212 and the implantation sections 96. Each of the gate structure elements includes a gate unit and an interlayer dielectric material layer.

Specifically, the gate units of the gate structure elements are formed on the first surface of the epitaxy layer 20 distal from the substrate 10. The gate units cover parts of the second portions 52 of the source regions 50, portions of the well regions 30 that are exposed from the first surface, portions of the junction field effect regions 211 and portions of the implantation sections 96. The gate units may be formed by first depositing a material layer over the first surface of the epitaxy layer 20, followed by an etching process to form the gate units, and then the interlayer dielectric material layer is formed on each of the gate units, thereby forming the gate structure elements.

In some embodiments, each of the gate units includes the gate oxide layer 61 and the gate electrode 62, the gate oxide layer 61 covers the part of the second portion 52 of a respective source region 50, the portion of a respective well region 30 that is exposed from the first surface, the portion of a respective junction field effect region 211, and the portion of a respective implantation section 96. In each of the gate structure elements, the electrode 62 is stacked on the gate oxide layer 61, and the interlayer dielectric material layer covers the gate oxide layer 61 and the electrode 62.

In step S1008, a plurality of the ohmic contact metals 94 are each formed between two adjacent ones of the gate structure elements.

Specifically, ohmic contact openings are each formed between two adjacent ones of the gate structure elements. Ohmic contact metal layers are respectively formed in the ohmic contact openings, and are then subjected to an annealing process to form the ohmic contact metals 94.

In step S1009, the gate structure elements disposed on the epitaxy layer 20 are subjected to a patterning process to form the gate structures 69, each of which includes the gate unit (including the gate oxide layer 61 and the gate electrode 62) and the interlayer dielectric 93 covering the gate unit.

Specifically, a photoresist layer is formed on surfaces of the interlayer dielectric material layers of the gate structure elements distal from the first surface to cover places among the gate structure elements. The photoresist layer has a plurality of first openings. A projection of one of the first openings on the first surface of the epitaxy layer 20 overlaps a portion of the corresponding implantation section 96, and a portion of the epitaxy layer 20 between the corresponding implantation sections 96 and the adjacent well contact structures 40. A photolithography process is performed to etch the interlayer dielectric material layers of the gate structure elements exposed from the first openings, thereby forming the gate structures 69, each of which includes the gate unit and the interlayer dielectric 93 covering the gate unit.

Schottky metal openings are each formed between one of the gate structures 69 and an adjacent one of the ohmic contact metals 94.

In step S1010, a plurality of Schottky metals 70 are each formed between one of the gate structures 69 and an adjacent one of the ohmic contact metals 94.

Specifically, Schottky metal material layers are first deposited in the Schottky metal openings each of which is formed between one of the gate structures 69 and an adjacent one of the ohmic contact metals 94, followed by performing an annealing process, thereby forming the Schottky metals 70.

In some embodiments, the photoresist layer is removed after formation of the Schottky metals 70. In other embodiments, the photoresist layer is removed after deposition of the Schottky metal material layers.

Each of the implantation sections 96 has a first end portion connected to an edge of a respective gate electrode 62 proximal to an adjacent one of the Schottky regions 212 through a respective gate oxide layer 61. In addition, each of the implantation sections 96 has a second end portion connected to an edge of an adjacent Schottky metal 70 proximal to a respective junction field effect region 211.

In step S1011, the source electrode 80 is formed on surfaces of the gate structures 69, the ohmic contact metals 94 and the Schottky metals 70 distal from the epitaxy layer 20.

Specifically, the source electrode 80 is disposed on surfaces of the interlayer dielectrics 93 of the gate structures 69 distal from the epitaxy layer 20, surfaces of the ohmic contact metals 94 distal from the epitaxy layer 20, and surfaces of the Schottky metals 70 distal from the epitaxy layer 20.

In step S1012, the drain electrode 90 is deposited on a surface of the substrate 10 distal from the epitaxy layer 20.

Figure 21C:
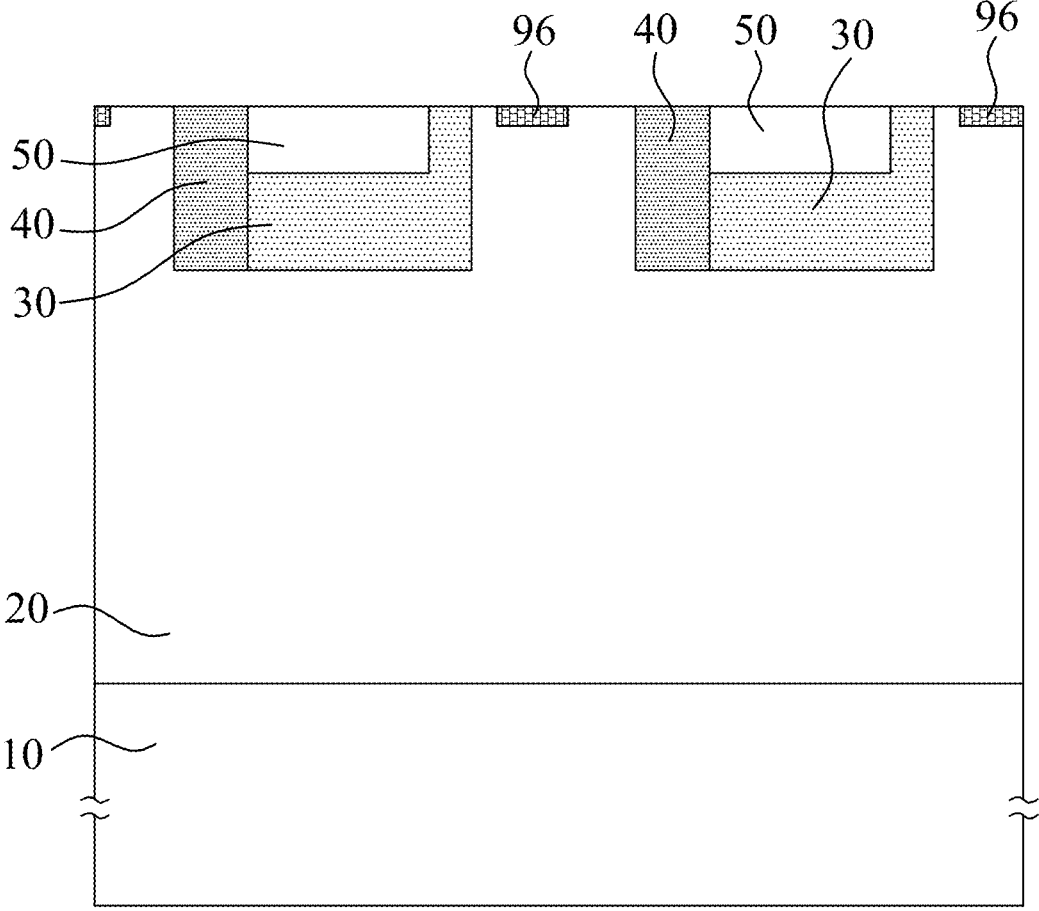
FIGS. 21C to 21I respectively illustrate intermediate stages in the method for fabricating the SiC MOSFET device described in FIG. 21B.

FIG. 21B is a flow chart illustrating a method of preparing the SiC MOSFET device described with reference to FIGS. 16A to 16C. FIGS. 21C to 21I are schematic views respectively illustrate intermediate stages of steps S1110 to S1170 of the method shown in FIG. 21B.

Hereinafter, the first type of conductivity is n-type conductivity, the second type of conductivity is p-type conductivity, the epitaxy layer 20 is a lightly doped epitaxy layer, the source region 50 is a heavily doped source region, the well region 30 is a lightly doped well region, the well contact structure 40 is a heavily doped well contact structure, the implantation section 96 is a shallow heavily doped implantation section. The method illustrated in FIG. 21B includes the following steps.

Referring to FIGS. 21B and 21O, in step S1110, the n-type epitaxy layer 20 is formed on the n⁺-type substrate 10, and a plurality of the p-type well regions 30, the n⁺-type source regions 50, the p⁺-type well contact structures 40 and the p⁺-type shallow implantation sections 96 are formed in the n-type epitaxy layer 20.

In each of the cell units 100 (see FIGS. 16A and 21O), the n⁺-type source region 50 and the p⁺-type well contact structure 40 are located at an upper portion of the n-type epitaxy layer 20, or in other words, upper surfaces of the n-type source region 50 and upper surfaces of the p⁺-type well contact structure 40 are exposed from the n-type epitaxy layer 20. In addition, the n⁺-type source region 50 and the p-type well region 30 are adjacent to and connected to the p⁺-type well contact structure 40. Moreover, the n⁺-type source region 50 and the p-type well region 30 are both located on the same side of the p⁺-type well contact structure 40.

Figure 21D:
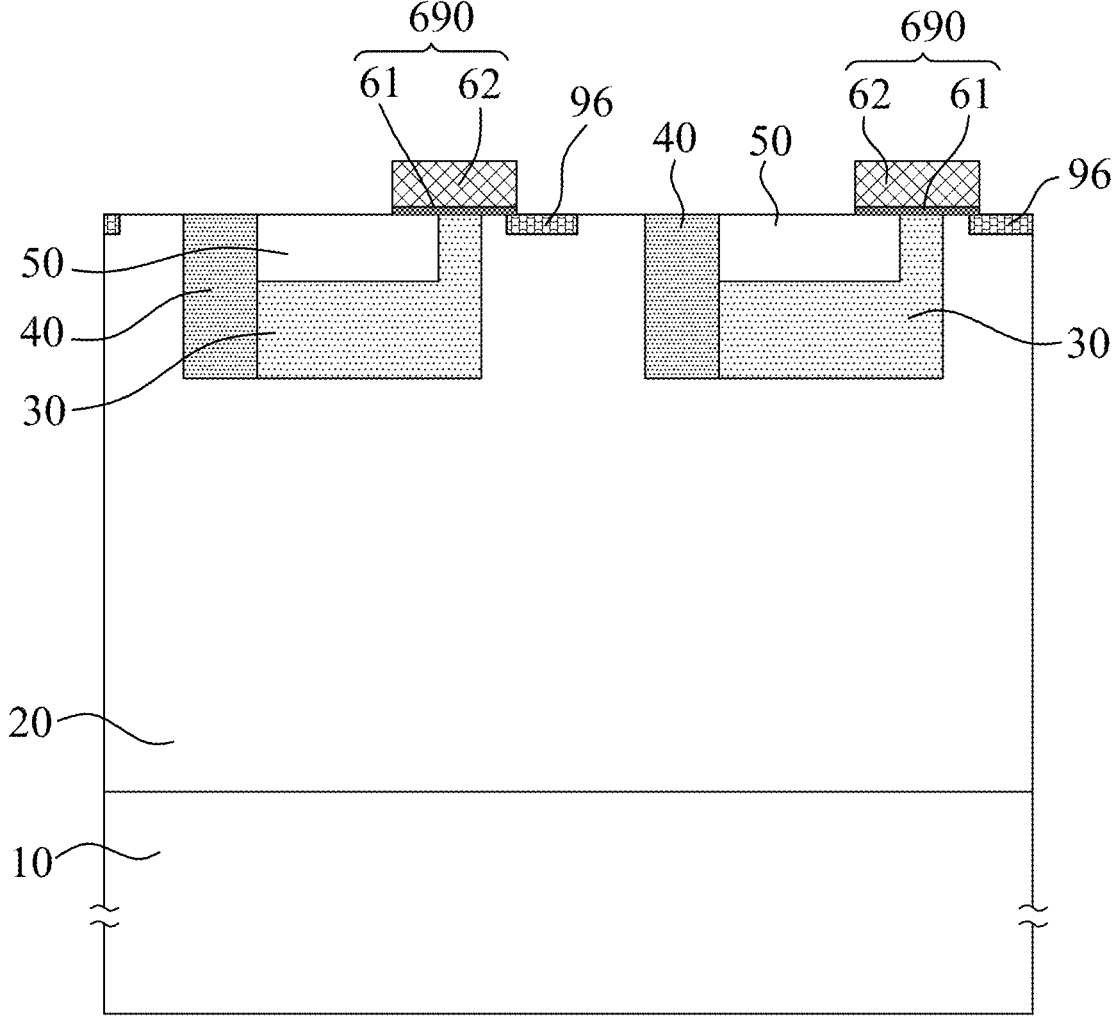

Referring to FIGS. 21B and 21D, in step S1120, a plurality of the gate oxide layers 61 are formed on the n-type epitaxy layer 20 by thermal oxidation, a plurality of poly-silicon material layers are deposited on the gate oxide layers 61, followed by an etching process to form a plurality of the gate electrodes 62, thereby obtaining a plurality of patterned gate units 690.

Please note that the polysilicon gate electrodes 62 merely cover the gate oxide layers 61. There is no limitation in methods to achieve the patterned gate units 690. Exemplarily, a continuous gate oxide material layer (for forming the gate oxide layers 61) and a continuous polysilicon gate electrode material layer (for forming the polysilicon gate electrodes 62) are first deposited, followed by an etching process, thereby forming the patterned gate units 690.

Figure 21E:
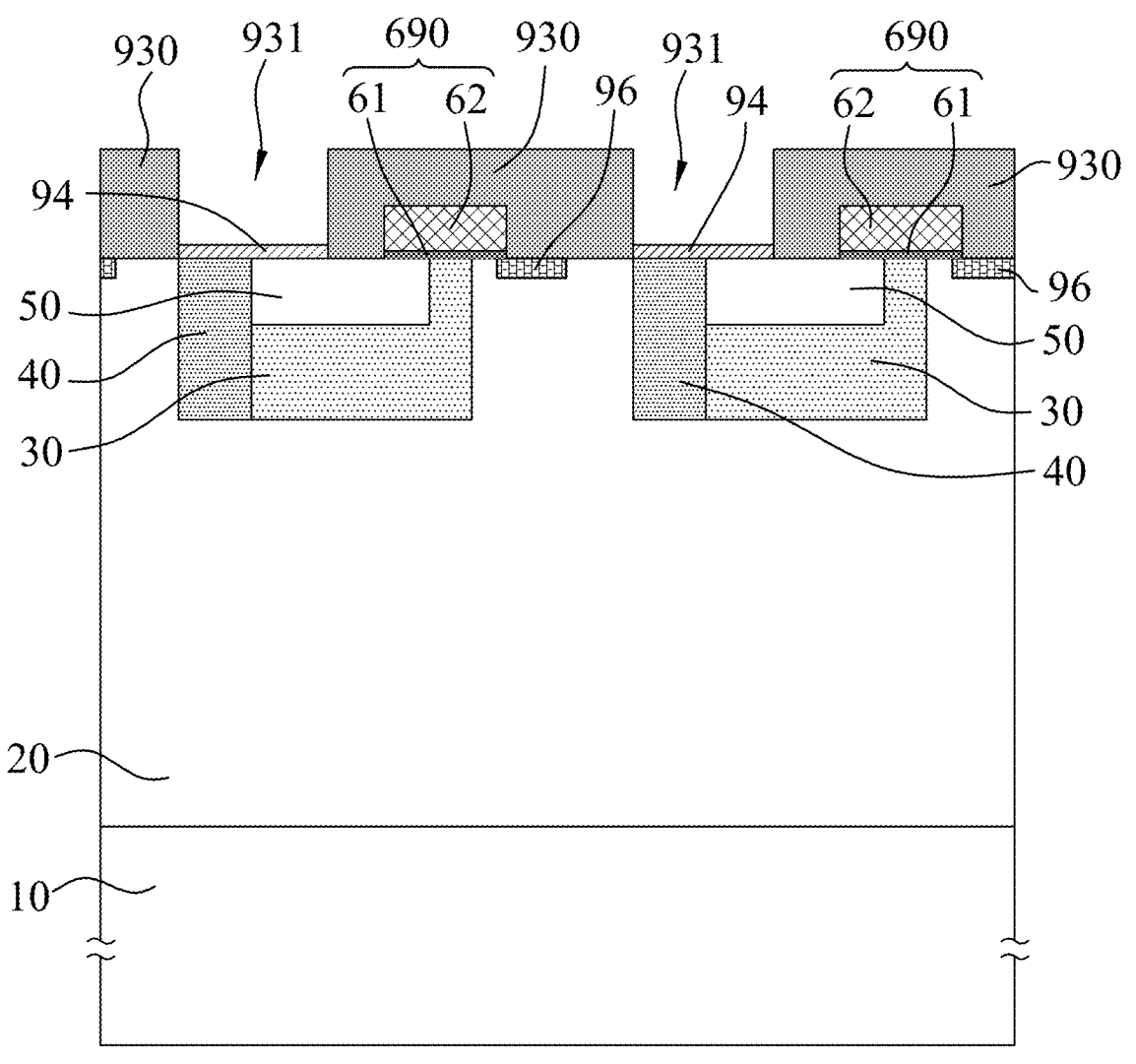

Referring to FIGS. 21B and 21E, in step S1130, an interlayer dielectric material layer (for forming the interlayer dielectrics 93) is deposited and is etched to form a plurality of ohmic contact openings 931 and a plurality of patterned interlayer dielectric material layers 930. Ohmic contact metal layers are respectively deposited in the ohmic contact openings 931 and are annealed to form the ohmic contact metals 94.

The ohmic contact metal layers deposited in the ohmic contact openings 931 cover the upper surfaces of the p⁺-type well contact structures 40 and the upper surfaces of the first portions 51 of the n⁺-type source regions 50.

Figure 21F:
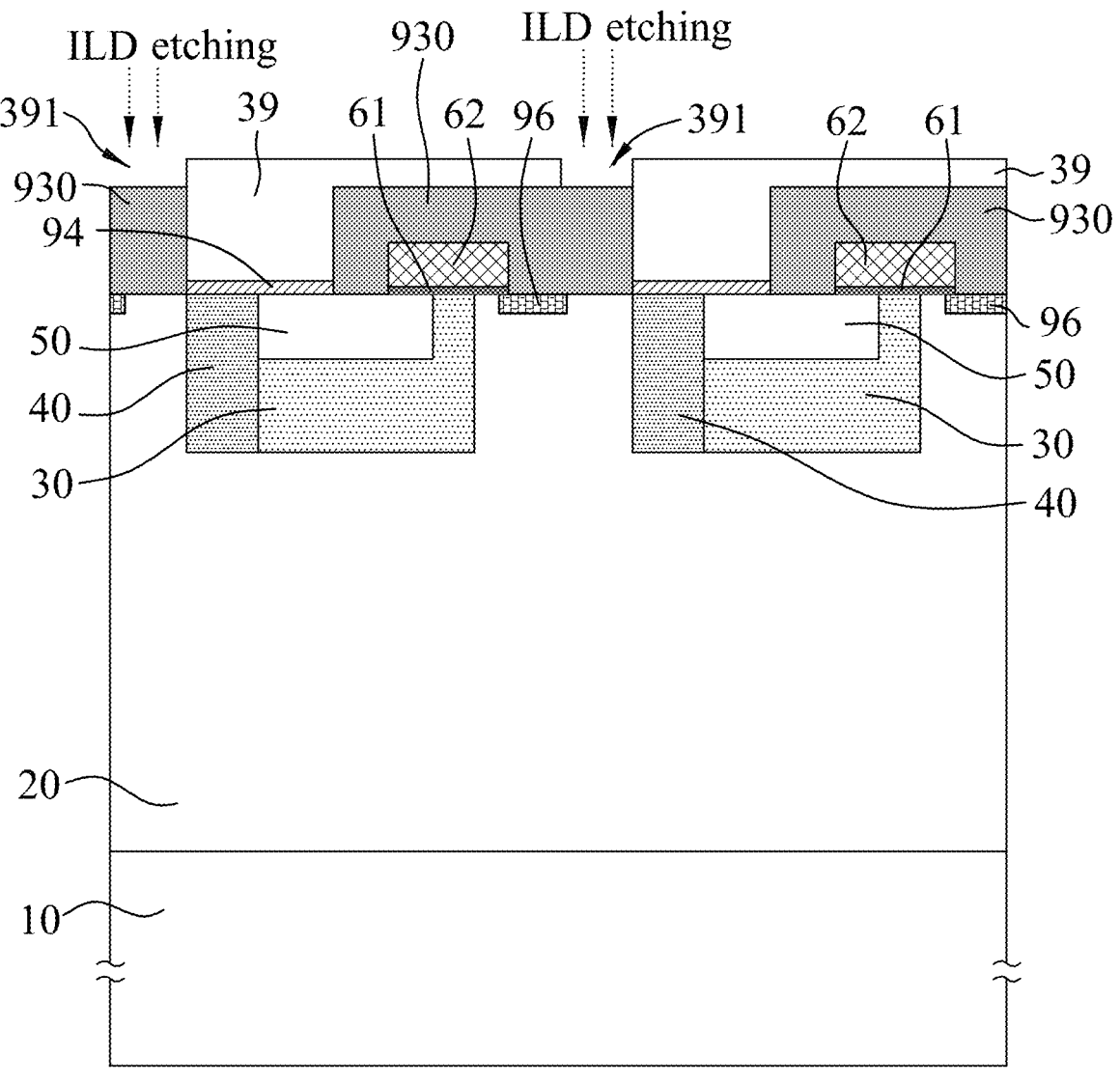

Referring to FIGS. 21B and 21F, in step S1140, a photoresist 39 is formed and is developed to form patterns of Schottky metal openings 391. The patterned interlayer dielectric material layers 930 are etched through the patterns of Schottky metal openings 391 to form a plurality of Schottky metal openings (not shown) and a plurality of interlayer dielectrics (ILD) 93 (see FIG. 21G).

The interlayer dielectrics 93 permit the gate electrodes 62 to be isolated from the ohmic contact metals 94, the Schottky metals 70 (formed later, see FIG. 21G) and the source electrode 80 (formed later, see FIG. 21H).

Figure 21G:
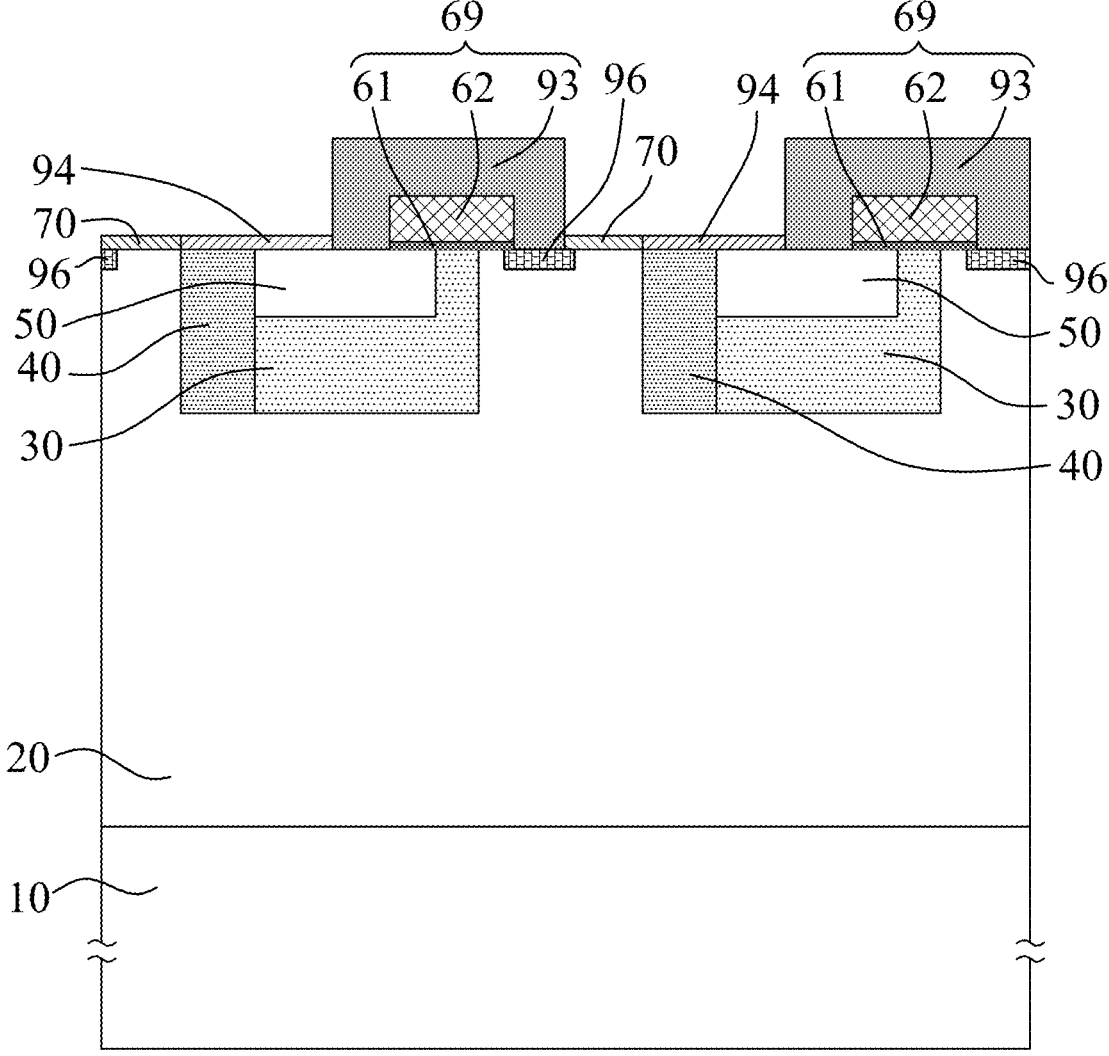

Referring to FIGS. 21B and 21G, in step S1150, a plurality of Schottky metal material layers (not shown) are deposited and the photoresist 39 is removed. The Schottky metal material layers are annealed to from a plurality of the Schottky metals 70.

Figure 21H:
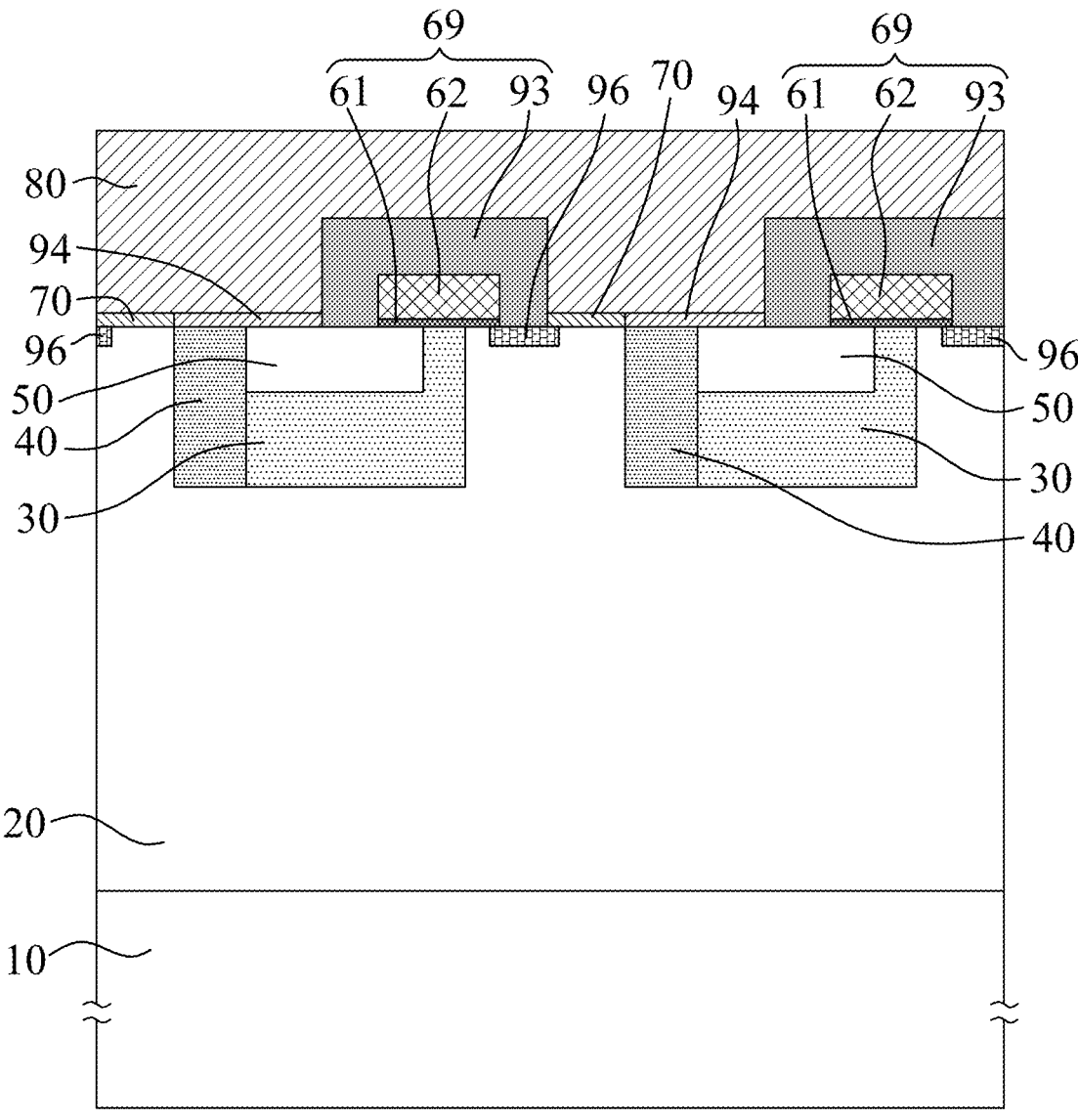

Referring to FIGS. 21B and 21H, in step S1160, a thick metal layer is deposited at a front side (e.g., on an upper surface of the structure shown in FIG. 21G) to form the source electrode 80.

In some embodiments, the source electrode 80 is located at the top of the SiC MOSFET device (covering the inter-layer dielectrics 93, the Schottky metals 70 and the ohmic contact metals 94). In other embodiments, the source electrode 80 is merely deposited on the Schottky metals 70 and the ohmic contact metals 94.

Figure 21I:
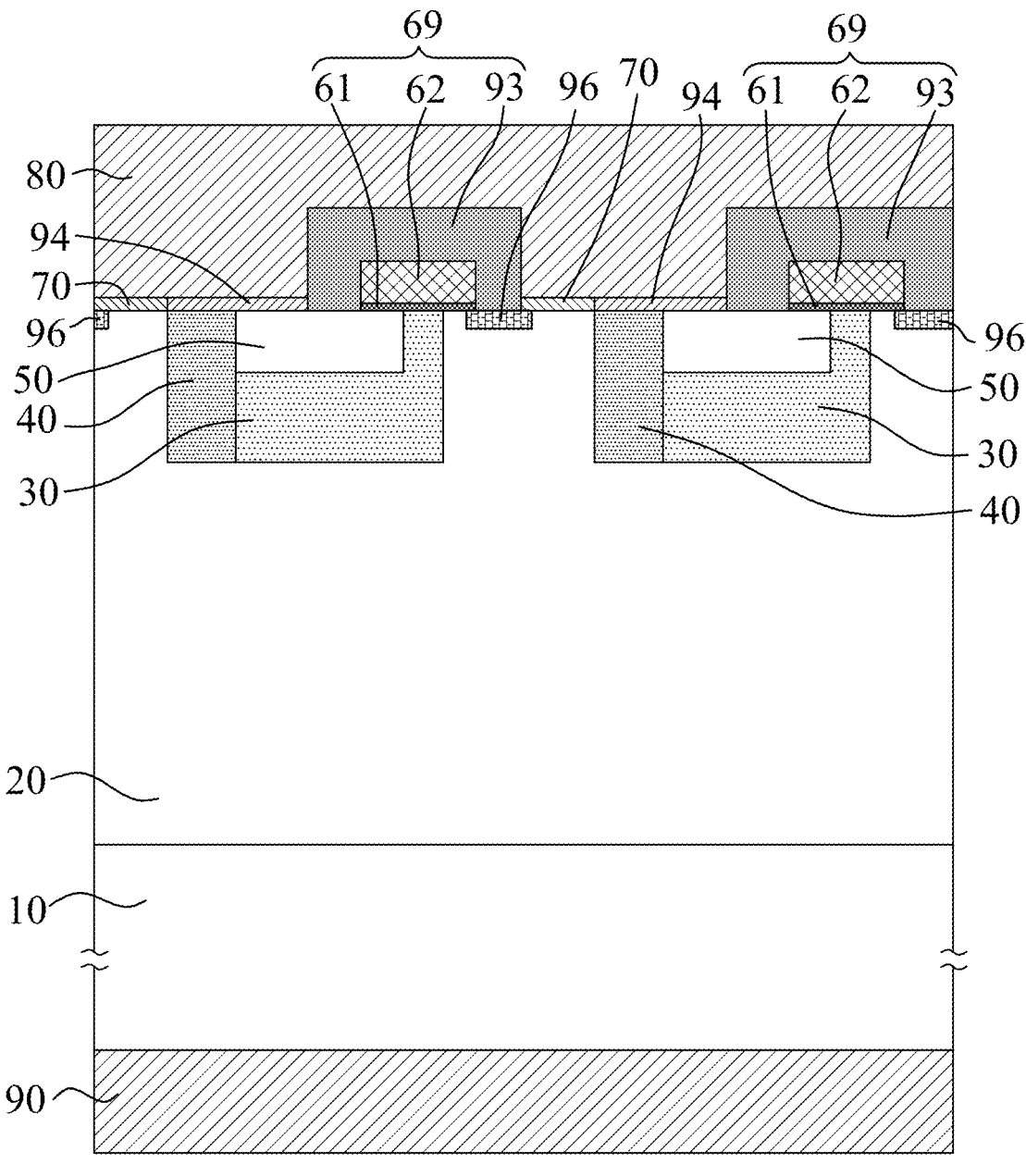

Referring to FIGS. 21B and 21I, in step S1170, a thinning process is performed on the back side (e.g., on a lower surface of the structure shown in FIG. 21H), and another thick metal layer is deposited on the back side to form the drain electrode 90.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when imple-mentation of one or more features or specific details does not affect implementation of another one or more features or specific details, said one or more features may be singled out and practiced alone without said another one or more features or specific details. It should be further noted that one or more features or specific details from one embodi-ment may be practiced together with one or more features or specific details from another embodiment, where appropri-ate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifi-cations and equivalent arrangements.

What is claimed is:

1. A silicon carbide metal oxide semiconductor field effect transistor (SiC MOSFET) device, comprising:

a substrate having a first type of conductivity;

an epitaxy layer disposed on said substrate; and a plurality of cell units, each of which including a first cell and a second cell that are disposed in said epitaxy layer and connected to each other in said epitaxy layer, said first cell including:

a first Schottky region and a first junction field effect region that are disposed in said epitaxy layer and spaced apart from each other, that extend along a direction from said epitaxy layer toward said substrate, and that have the first type of conductivity;

a first well region that is disposed in said epitaxy layer, that is connected to said first junction field effect region, that extends along the direction from said epitaxial layer toward said substrate, and that has a second type of conductivity;

a first well contact structure that is disposed in said epitaxy layer and on a side of said first well region opposite to said first junction field effect region, that is connected to said first Schottky region, that extends along the direction from said epitaxial layer toward said substrate, and that has the second type of conductivity;

a first source region that is disposed in said first well region in said epitaxy layer, that is connected to said first well contact structure, that extends along the direction from said epitaxial layer toward said sub-strate, and that has the first type of conductivity;

a first Schottky metal disposed on said first Schottky region;

a first ohmic contact metal disposed on said first well contact structure and a first portion of said first source region; and a first gate structure disposed on said first junction field effect region, and extending to cover a second portion of said first source region, said first gate structure including
  a first gate oxide layer disposed on a part of said first junction field effect region, and extending to cover a part of said second portion of said first source region;
  a first gate electrode disposed on said first gate oxide layer; and
  a first interlayer dielectric disposed to cover said first gate oxide layer and said first gate electrode;

said second cell including:

a second Schottky region and a second junction field effect region that are disposed in said epitaxy layer and spaced apart from each other, that extend along the direction from said epitaxial layer toward said substrate, and that have the first type of conductivity;

a second well region that is disposed in said epitaxy layer, that is connected to said second junction field effect region, that extends along the direction from said epitaxial layer toward said substrate, and that has the second type of conductivity;

a second well contact structure that is disposed in said epitaxy layer and on a side of said second well region opposite to said second junction field effect region, that is connected to said second Schottky region, that extends along the direction from said epitaxial layer toward said substrate, and that has the second type of conductivity;

a second source region that is disposed in said second well region in said epitaxy layer, that is connected to said second well contact structure, that extends along the direction from said epitaxial layer toward said substrate, and that has the first type of conductivity;

a second Schottky metal disposed on said second Schottky region;

a second ohmic contact metal disposed on said second well contact structure and a first portion of said second source region; and a second gate structure disposed on said second junction field effect region, and extending to cover a second portion of said second source region, said second gate structure including
  a second gate oxide layer disposed on a part of said second junction field effect region, and extending to cover a part of said second portion of said second source region;
  a second gate electrode disposed on said second gate oxide layer; and
  a second interlayer dielectric disposed to cover said second gate oxide layer and said second gate electrode;

wherein, in said epitaxial layer, said first junction field effect region of said first cell is connected to said second Schottky region of said second cell, wherein for each of said cell units, said first cell and said second cell are asymmetrical, and wherein for each of said cell units, said first junction field effect region and said second Schottky region together form a connection region for connecting said first cell and said second cell.

2. The SiC MOSFET device as claimed in claim 1, wherein for each of said cell units, said first well region and said second well region are each in an elongated shape.

3. The SiC MOSFET device as claimed in claim 2, wherein for each of said cell units, said first well contact structure and said second well contact structure are each in an elongated shape.

4. The SiC MOSFET device as claimed in claim 2, wherein for each of said cell units, said first well contact structure includes a plurality of first well contact regions that are spaced apart from each other along an elongating direction of said first well region, and said second well contact structure includes a plurality of second well contact regions that are spaced apart from each other along an elongating direction of said second well region.

5. The SiC MOSFET device as claimed in claim 2, wherein each of said cell units further includes a plurality of implanting regions that are disposed in said connection region and spaced apart from each other along an elongating direction of said second well region, and that have the second type of conductivity.

6. The SiC MOSFET device as claimed in claim 5, wherein for each of said cell units, each of said implanting regions extends along the direction from said epitaxial layer toward said substrate, and has one end connected to said second well contact structure, and an opposite end which is opposite to said second well contact structure and connected to said first well region.

7. The SiC MOSFET device as claimed in claim 5, wherein for each of said cell units, each of said implanting regions extends along the direction from said epitaxial layer toward said substrate, and has one end connected to said second well contact structure, and an opposite end which is opposite to said second well contact structure and spaced apart from said first well region by a predetermined distance.

8. The SiC MOSFET device as claimed in claim 7, wherein said predetermined distance is less than a width of said first junction field effect region along an arranging direction from said first cell to said second cell.

9. The SiC MOSFET device as claimed in claim 1, wherein said first type of conductivity is n-type conductivity, and said second type of conductivity is p-type conductivity.

10. The SiC MOSFET device as claimed in claim 9, wherein said epitaxy layer is lightly doped; and said first source region, said second source region, said first well contact structure and said second well contact structure are heavily doped.

11. A silicon carbide metal oxide semiconductor field effect transistor (SiC MOSFET) device, comprising:
  a substrate having a first type of conductivity;
  an epitaxy layer disposed on said substrate;
  a plurality of doped areas disposed in said epitaxy layer, spaced apart from each other, and having a second type of conductivity, each of said doped areas including a well region and a well contact structure each of which extends along a direction from said epitaxial layer toward said substrate;
  a plurality of junction field effect regions and a plurality of Schottky regions, each of said junction field effect regions and a respective one of said Schottky regions being formed between two corresponding adjacent ones of said doped areas and being connected to each other, said junction field effect regions being respectively connected to said well regions of said doped areas, said Schottky regions being respectively connected to said well contact structures of said doped areas;
  a plurality of source regions having said first type of conductivity, disposed respectively in said doped areas, and respectively connected to said well contact structures of said doped areas, each of said source regions extending along the direction from said epitaxial layer toward said substrate;

a plurality of Schottky metals respectively disposed on said Schottky regions;

a plurality of ohmic contact metals, each of which is disposed on said well contact structure of a respective one of said doped areas, and extends to cover a first portion of a respective one of said source regions;

a plurality of gate structures, each of which is disposed on a respective one of said junction field effect regions, and extends to cover a second portion of a respective one of said source regions, each of said gate structures including:

a gate oxide layer disposed on a part of said respective one of said junction field effect regions, and extending to cover a part of said second portion of said respective one of said source regions;

a gate electrode disposed on said gate oxide layer; and an interlayer dielectric disposed to cover said gate oxide layer and said gate electrode.

12. The SiC MOSFET device as claimed in claim 11, wherein for each of said doped areas, said well region is in an elongated shape.

13. The SiC MOSFET device as claimed in claim 12, wherein for each of said doped areas, said well contact structure is in an elongated shape.

14. The SiC MOSFET device as claimed in claim 12, wherein for each of said doped areas, said well contact structure includes a plurality of well contact regions that are spaced apart from each other along an elongating direction of said well region.

15. The SiC MOSFET device as claimed in claim 11, further comprising:

a plurality of connection regions each of which is formed by one of said junction field effect regions and said respective one of said Schottky regions; and a plurality of implanting structures that have the second conductivity, and that are respectively disposed in said connection regions, each of said implanting structures including a plurality of implanting regions spaced apart from each other along an elongating direction of said well region.

16. The SiC MOSFET device as claimed in claim 15, wherein in each of said implanting structures, said implanting regions are equally spaced apart from each other in the elongating direction of said well region.

17. The SiC MOSFET device as claimed in claim 15, wherein said implanting regions extend along the direction said from said epitaxial layer toward said substrate, and each of said implanting regions has a width which is measured along an arranging direction of said doped areas, and which is identical to a width of a corresponding one of said connection regions measured along the arranging direction of said doped areas.

18. The SiC MOSFET device as claimed in claim 15, wherein said implanting regions extend along the direction from said epitaxial layer toward said substrate, and each of said implanting regions has a width which is measured along an arranging direction of said doped areas, and which is smaller than a width of a corresponding one of said connection regions measured along the arranging direction of said doped areas.

19. The SiC MOSFET device as claimed in claim 18, wherein each of said implanting regions has one end connected to said well contact structure of a corresponding one of said doped areas, and an opposite end which is opposite to said well contact structure of said corresponding one of said doped areas, and which is spaced apart from said well region of a corresponding one of said doped areas by a distance that is smaller than a width of a corresponding one of said junction field effect regions measured along the arranging direction of said doped areas.

* * * * *